(12) United States Patent
Yamazaki et al.

(10) Patent No.: US 9,130,367 B2
(45) Date of Patent: Sep. 8, 2015

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hajime Kimura, Atsugi (JP); Hiroyuki Miyake, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/079,986

(22) Filed: Nov. 14, 2013

(65) Prior Publication Data

US 2014/0145181 A1    May 29, 2014

(30) Foreign Application Priority Data

Nov. 28, 2012 (JP) ................. 2012-260210
Jul. 30, 2013 (JP) ................. 2013-157232

(51) Int. Cl.
  *H01L 27/02* (2006.01)
  *H02H 9/04* (2006.01)
  (Continued)

(52) U.S. Cl.
  CPC ........... *H02H 9/045* (2013.01); *H01L 27/0296* (2013.01); *H01L 27/124* (2013.01);
  (Continued)

(58) Field of Classification Search
  CPC ............ H01L 27/1214; H01L 27/1225; H01L 29/7869; H01L 27/1248; H01L 27/3248; H01L 27/3263; H01L 27/3276; H01L 27/0296; H02H 9/044; H02H 9/045
  USPC ........................ 257/43, 59, 66, 773
  See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP     1737044 A    12/2006
EP     2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Nikolay Yushin
(74) *Attorney, Agent, or Firm* — Eric J. Robinson; Robinson Intellectual Property Law Office, P.C.

(57) ABSTRACT

To provide a novel display device with improved reliability. The display device includes an insulating layer between a first wiring and a second wiring. The insulating layer includes a first insulating layer and a second insulating layer overlapping with the first insulating layer and a region where a part of the second insulating layer is removed, and the region serves as a protection circuit. In addition, the first insulating layer and the second insulating layer are included in a region where the insulating layer overlaps with a semiconductor layer of a transistor, and a region where the first insulating layer and the second insulating layer are removed is included in a region where the first wiring and the second wiring are directly connected to each other.

14 Claims, 52 Drawing Sheets

(51) Int. Cl.
*H01L 27/12* (2006.01)
*H01L 27/32* (2006.01)

(52) U.S. Cl.
CPC ........ *H01L27/1225* (2013.01); *H01L 27/1248* (2013.01); *H01L 27/3276* (2013.01); *H02H 9/044* (2013.01); *H01L 27/3248* (2013.01); *H01L 27/3262* (2013.01); *H01L 2227/323* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,911,688 | B2 * | 6/2005 | Yamazaki et al. ............ 257/296 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,164,700 | B2 * | 4/2012 | Hatta et al. ....................... 349/42 |
| 8,384,078 | B2 | 2/2013 | Kang et al. |
| 8,389,988 | B2 * | 3/2013 | Yamazaki et al. .............. 257/43 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0239189 | A1 * | 10/2008 | Hatta et al. ....................... 349/46 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072470 | A1 | 3/2010 | Yamazaki et al. |
| 2010/0072471 | A1 | 3/2010 | Yamazaki et al. |
| 2010/0084654 | A1 * | 4/2010 | Yamazaki et al. .............. 257/43 |
| 2010/0092800 | A1 | 4/2010 | Itagaki et al. |
| 2010/0109002 | A1 | 5/2010 | Itagaki et al. |
| 2012/0300150 | A1 | 11/2012 | Yamazaki et al. |
| 2013/0092934 | A1 | 4/2013 | Yamazaki et al. |
| 2013/0134417 | A1 | 5/2013 | Yamazaki et al. |
| 2013/0175525 | A1 | 7/2013 | Yamazaki et al. |
| 2014/0145182 | A1 | 5/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-092036 | 4/2010 |
| JP | 2010-092037 | 4/2010 |
| JP | 2010-097203 | 4/2010 |
| JP | 2010-097204 | 4/2010 |
| JP | 2010-107976 | 5/2010 |
| JP | 2010-107977 | 5/2010 |

(56) References Cited

FOREIGN PATENT DOCUMENTS

JP     2010-113346      5/2010
WO    WO-2004/114391    12/2004

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensionsl Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In'Ga—Zn—Oxide TFTs With a Novel Passivation Layer,", SID

(56) References Cited

OTHER PUBLICATIONS

Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Pews. Lett. (Applied Physics Letters) , Sep. 1, 2003, vol. 83, No. 9, pp. 1755-1757.

\* cited by examiner

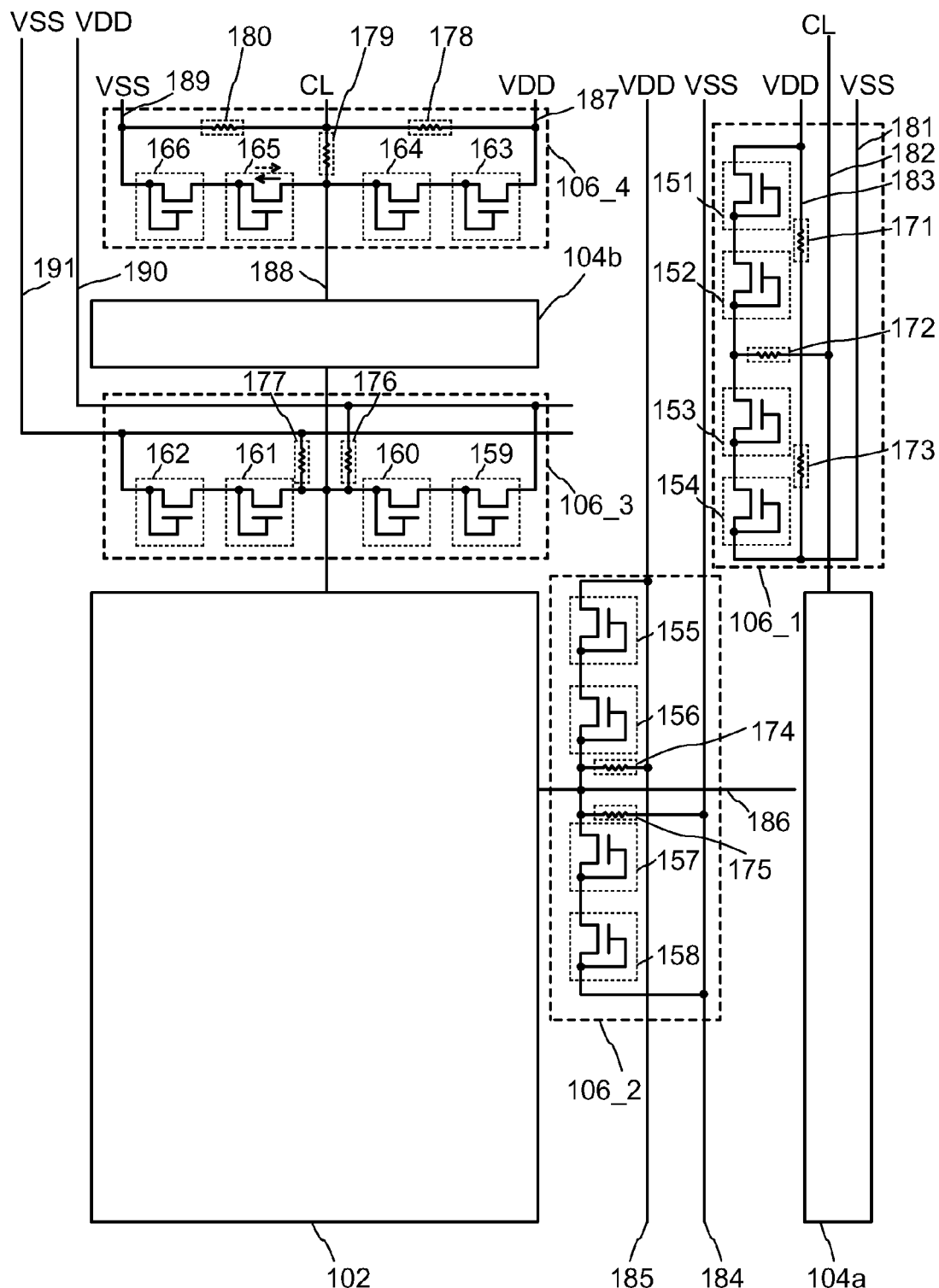

521 572 532 533 534 571 535 536 537

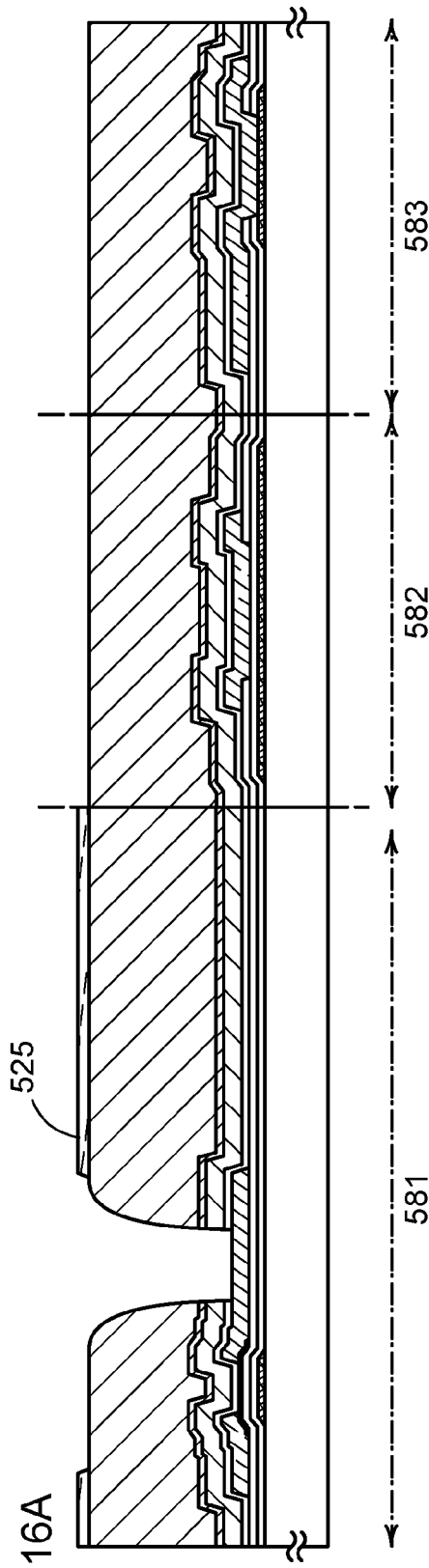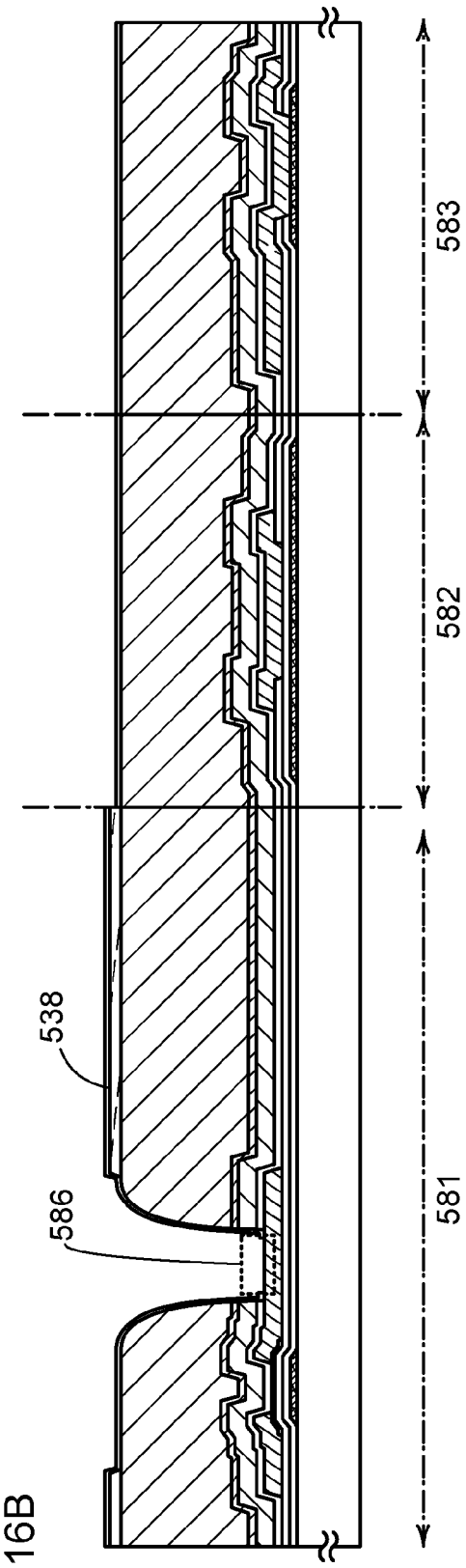

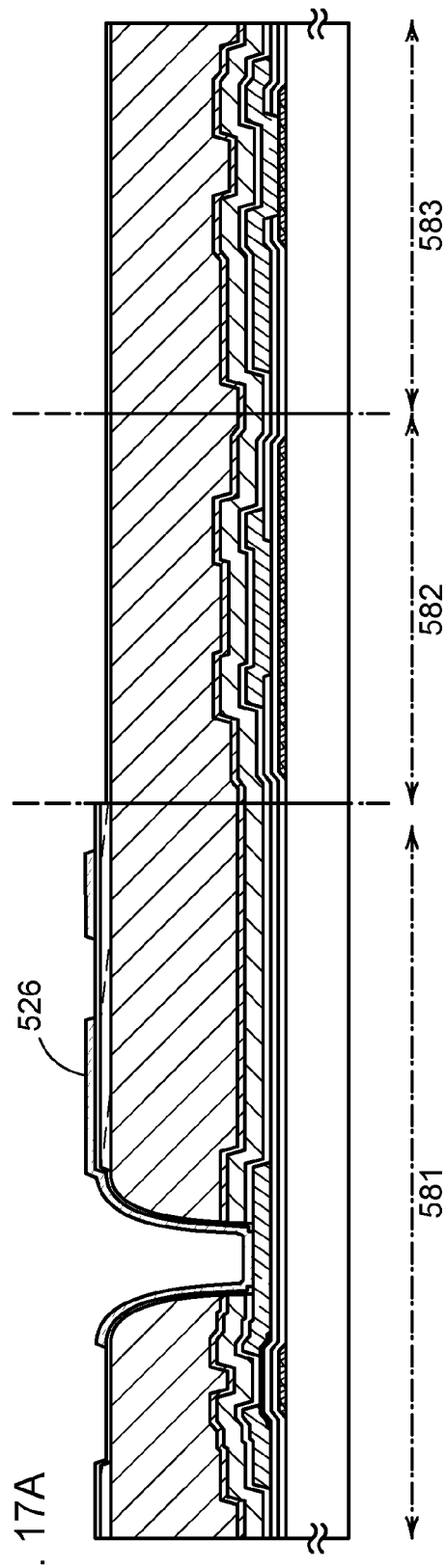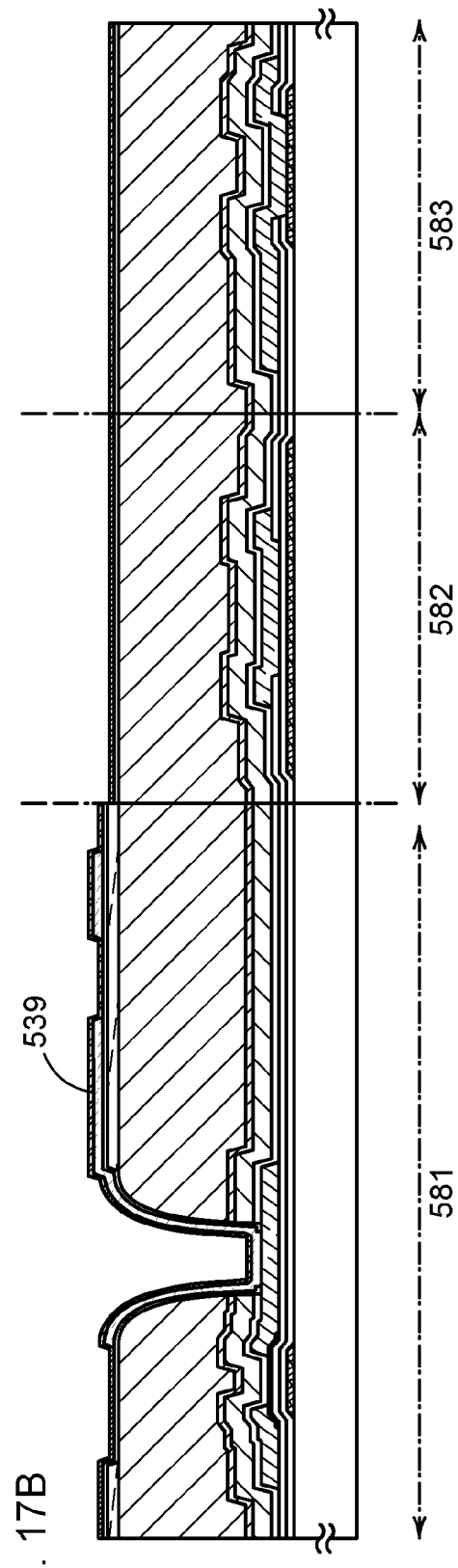

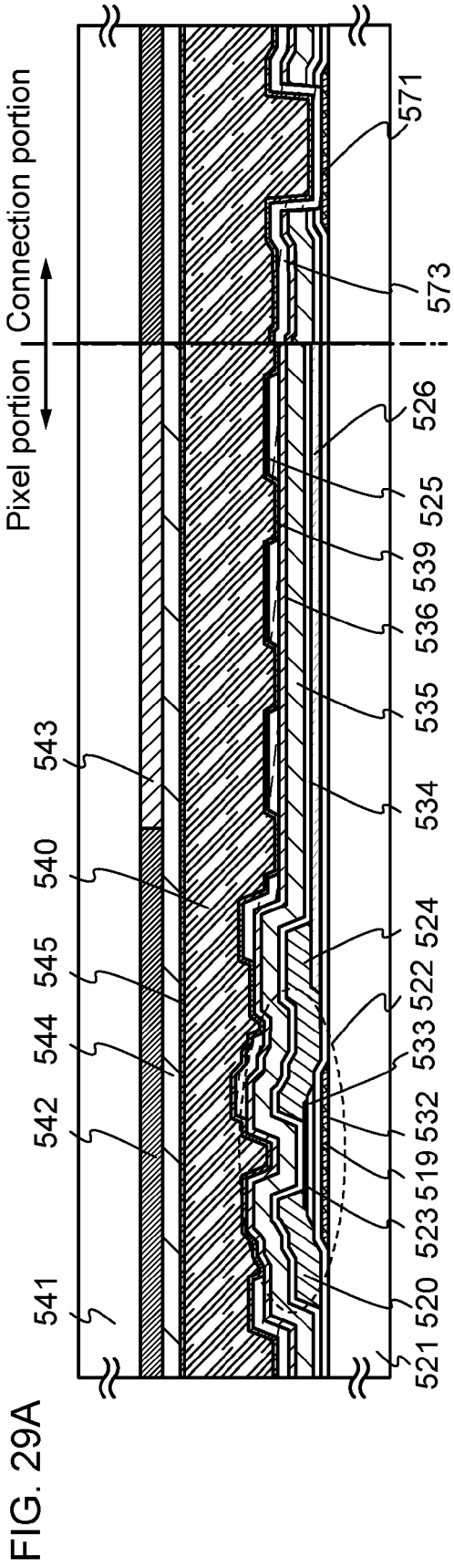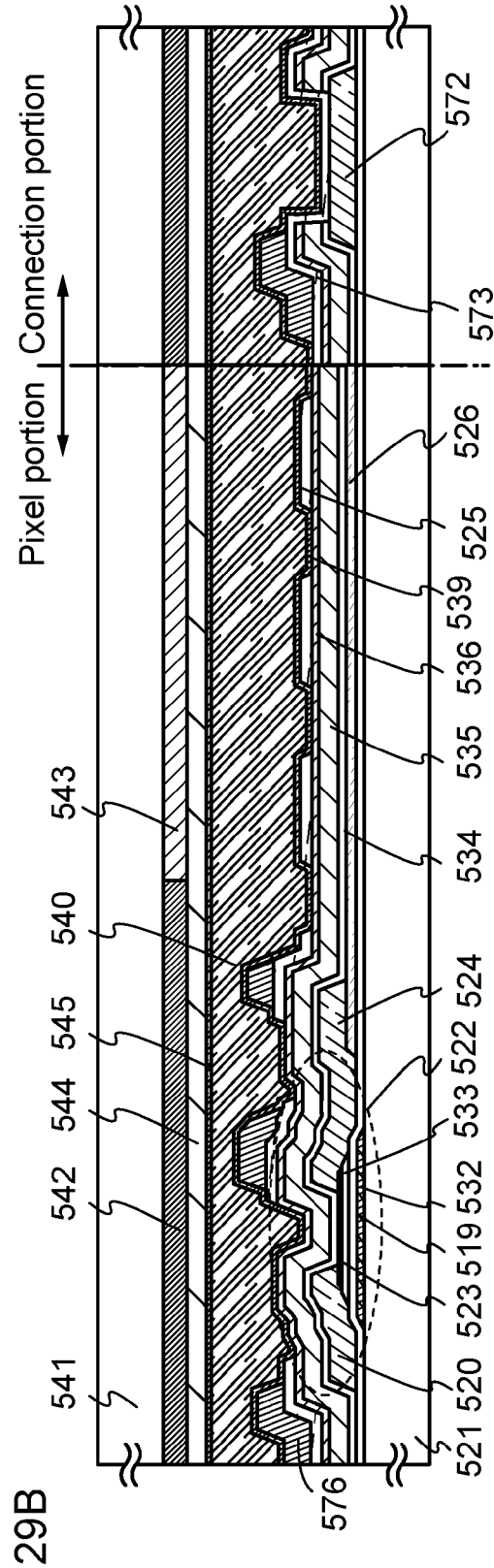

DISPLAY DEVICE

BACKGROUND OF THE INVENTION

1. Field of the Invention

The present invention relates to an object (a product including a machine, a manufacture, and a composition of matter) and a method (a process including a simple method and a production method). In particular, one embodiment of the present invention relates to a semiconductor device, a display device, a light-emitting device, an electronic device, a driving method thereof, or a manufacturing method thereof. In particular, one embodiment of the present invention relates to a semiconductor device, a display device, an electronic device or a light-emitting device each including an oxide semiconductor.

Note that the term "display device" means a device having a display element. In addition, the display device also includes a driver circuit for driving a plurality of pixels, and the like. Further, the display device includes a control circuit, a power source circuit, a signal generation circuit, or the like formed over another substrate.

2. Description of the Related Art

For display devices typified by liquid crystal display devices, elements and wirings have been downsized with recent technological innovation and mass production technology has also been improved greatly. Improvement in fabrication yield is required to achieve lower cost in the future.

If a surge voltage due to static electricity or the like is applied to a display device, an element is broken to produce abnormal display. Thus, fabrication yield might be decreased. To overcome that, a protection circuit for releasing a surge voltage to another wiring is provided in a display device (see, Patent Documents 1 to 7, for example).

REFERENCE

[Patent Document 1] Japanese Published Patent Application No. 2010-92036

[Patent Document 2] Japanese Published Patent Application No. 2010-92037

[Patent Document 3] Japanese Published Patent Application No. 2010-97203

[Patent Document 4] Japanese Published Patent Application No. 2010-97204

[Patent Document 5] Japanese Published Patent Application No. 2010-107976

[Patent Document 6] Japanese Published Patent Application No. 2010-107977

[Patent Document 7] Japanese Published Patent Application No. 2010-113346

SUMMARY OF THE INVENTION

A structure aiming at improvement in reliability is important for display devices, like a protection circuit.

It is an object of one embodiment of the present invention to provide a display device having a novel structure that can improve reliability. Alternatively, it is another object of one embodiment of the present invention to provide a display device having a novel structure that can reduce electrostatic discharge damages. Alternatively, it is another object of one embodiment of the present invention to provide a display device having a novel structure that can reduce adverse effects of static electricity. Alternatively, it is another object of one embodiment of the present invention is to provide a display device having a novel structure that hardly breaks down. Alternatively, it is another object of one embodiment of the present invention to provide a display device having a novel structure that can reduce adverse effects on a transistor in a rubbing process. Alternatively, it is another object of one embodiment of the present invention to provide a display device having a novel structure that can reduce adverse effects on a transistor in an inspecting step. Alternatively, it is another object of one embodiment of the present invention to provide a display device having a novel structure that can reduce adverse effects of a trouble when a touch sensor is used. Alternatively, it is another object of one embodiment of the present invention to provide a display device having a novel structure that can reduce fluctuation or deterioration of transistor characteristics. Alternatively, it is another object of one embodiment of the present invention to provide a display device having a novel structure that can reduce fluctuation in a threshold voltage or deterioration of a transistor. Alternatively, it is another object of one embodiment of the present invention to provide a display device having a novel structure that can inhibit normally-on of a transistor. Alternatively, it is another object of one embodiment of the present invention to provide a display device having a novel structure that can increase fabrication yield of a transistor. Alternatively, it is another object of one embodiment of the present invention to provide a display device having a novel structure that can protect a transistor. Alternatively, it is another object of one embodiment of the present invention to provide a display device having a novel structure that can discharge electric charge accumulated in a pixel electrode. Alternatively, it is another object of one embodiment of the present invention to provide a display device having a novel structure that can discharge electric charge accumulated in a wiring. Alternatively, it is another object of one embodiment of the present invention to provide a display device having a novel structure that has an oxide semiconductor layer having increased conductivity. Alternatively, it is another object of one embodiment of the present invention to provide a display device having a novel structure that can control the conductivity of an oxide semiconductor layer. Alternatively, it is another object of one embodiment of the present invention to provide a display device having a novel structure that can control the conductivity of a gate insulating film. Alternatively, it is another object of one embodiment of the present invention to provide a display device having a novel structure that enables normal display.

Note that the descriptions of these objects do not disturb the existence of other objects. Note that one embodiment of the present invention does not necessarily achieve all the objects. Objects other than the above objects will be apparent from and can be derived from the description of the specification, the drawings, the claims, and the like.

One embodiment of the present invention is a display device including an insulating layer between a first wiring and a second wiring. In the display device, the insulating layer includes a first insulating layer, a second insulating layer overlapping with the first insulating layer, and a region where a part of the second insulating layer is removed, and the region serves as a protection circuit.

Another embodiment of the present invention is a display device including an insulating layer between a first wiring and a second wiring. In the display device, the insulating layer includes a first insulating layer, a second insulating layer overlapping with the first insulating layer, and a region where a part of the second insulating layer is removed, the region serves as a protection circuit, and the first insulating layer and the second insulating layer are included in a region where the insulating layer overlaps with a semiconductor layer of a transistor.

Another embodiment of the present invention is a display device including an insulating layer between a first wiring and a second wiring. In the display device, the insulating layer includes a first insulating layer, a second insulating layer overlapping with the first insulating layer, and a region where a part of the second insulating layer is removed, the region serves as a protection circuit, the first insulating layer and the second insulating layer are included in a region where the insulating layer overlaps with a semiconductor layer of a transistor, and a region where the first insulating layer and the second insulating layer are removed is included in a region where the first wiring and the second wiring are directly connected to each other.

In the display device according to any of the above-described embodiments of the present invention, the first insulating layer preferably has a resistivity of $10^{10}$ Ωcm or higher and lower than $10^{18}$ Ωcm.

In the display device according to any of the above-described embodiments of the present invention, the semiconductor layer is preferably an oxide semiconductor layer.

In accordance with any of the above-described embodiments of the present invention, the reliability of the display device can be improved.

BRIEF DESCRIPTION OF THE DRAWINGS

In the accompanying drawings:

FIG. 3 is a schematic plan view of a display device, including a circuit diagram of a protection circuit;

FIGS. 16A and 16B are views illustrating a method of manufacturing a display device;

FIGS. 17A and 17B are views illustrating a method of manufacturing a display device;

FIGS. 29A and 29B are each a cross-sectional view of a display device;

DETAILED DESCRIPTION OF THE INVENTION

Figure 1A:
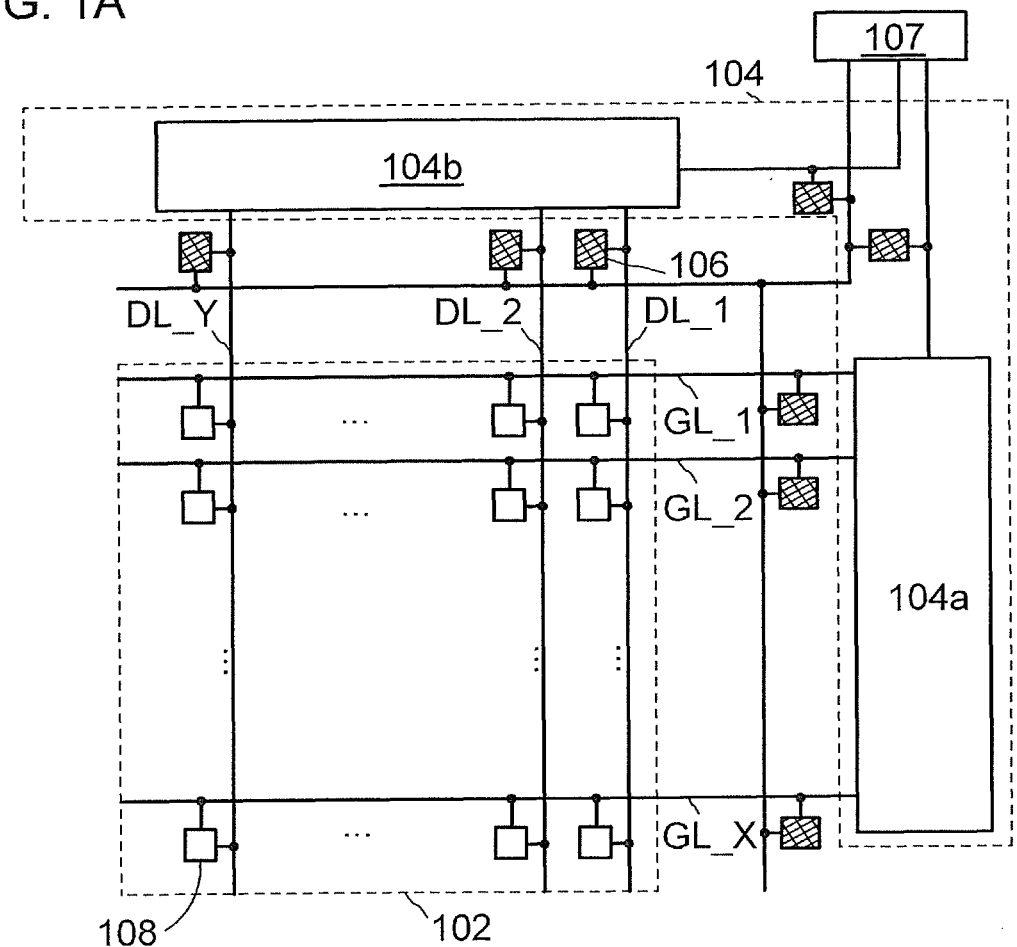
FIGS. 1A and 1B are a schematic plan view of a display device and a circuit diagram of a protection circuit.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the thickness of layers, and/or regions may be exaggerated for clarity in some cases. Therefore, embodiments of the present invention are not limited to such scales. Note that drawings are schematic views of ideal examples, and the embodiments of the present invention are not limited to the shape or the value illustrated in the drawings. For example, variation in signal, voltage, or current due to noise or difference in timing can be included.

Note that in this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain, and one of the source and the drain is referred to as a first electrode and the other thereof is referred to as a second electrode in some cases.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other in addition to the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" "above", "under", and "below", are used for convenience for describing a positional relation between components with reference to drawings. Further, a positional relation between components is changed as appropriate depending on a direction in which the components are illustrated. Thus, such a positional relation between components is not limited to the terms used in this specification, and can be described appropriately depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit or region. Further, a function of each circuit block in a block diagram in a drawing is specified for description. Thus, even when one circuit block is illustrated, an actual circuit or region may be configured so that processing which is illustrated as being performed in the one circuit block is performed in a plurality of circuit blocks.

Note that a pixel corresponds to a display unit controlling the luminance of one color component (e.g., any one of R (red), G (green), and B (blue)). Therefore, in a color display device, the minimum display unit of a color image is composed of three pixels of an R pixel, a G pixel and a B pixel. Note that the color elements for displaying a color image are not limited to the three colors, and color elements of more than three colors may be used or a color other than RGB may be used.

In this specification, embodiments of the present invention will be described with reference to the drawings. Embodiments are described in the following order:

1. Embodiment 1 (Basic structure relating to one embodiment of the present invention);
2. Embodiment 2 (Components of display device);
3. Embodiment 3 (Variations of components of display device);
4. Embodiment 4 (Structure of touch panel);
5. Embodiment 5 (Variations of touch panel);
6. Embodiment 6 (Variation of pixel circuit);
7. Embodiment 7 (Electronic devices); and
8. Embodiment 8 (Method of film formation).

Embodiment 1

In this embodiment, a display device of one embodiment of the present invention will be described with reference to FIGS. 1A and 1B, FIGS. 2A and 2B, FIG. 3, FIGS. 49A and 49B, FIG. 51, and FIGS. 52A and 52B.

The display device illustrated in FIG. 1A includes a region having a display element in a pixel (hereinafter the region is referred to as a pixel portion 102), a circuit portion having a circuit for driving a pixel (hereinafter the circuit portion is referred to as a driver circuit portion 104), circuits each having a protective function for an element (hereinafter the circuits are referred to as protection circuits 106), and a terminal portion 107.

The pixel portion 102 includes circuits for driving a plurality of display elements in X (X is a natural number of 2 or more) rows and Y columns (Y is a natural number of 2 or more) (hereinafter, such circuits are referred to as pixel circuits 108), and the driver circuit portion 104 includes driver circuits such as a circuit for supplying a signal (scan signal) to select a pixel (hereinafter the circuit is referred to as a gate driver 104a) and a circuit for supplying a signal (data signal) to drive a display element in a pixel (hereinafter the circuit is referred to as a source driver 104b).

The gate driver 104a includes a shift register or the like. The gate driver 104a receives a signal for driving the shift register and outputs a signal through a terminal portion 107. For example, the gate driver 104a receives a start pulse signal, a clock signal, or the like and outputs a pulse signal. The gate driver 104a has a function of controlling potentials of wirings supplied with scan signals (hereinafter such wirings are referred to as scan lines GL_1 to GL_X). Note that the plurality of gate drivers 104a may be provided to separately control the scan lines GL_1 to GL_X. Alternatively, the gate driver 104a has, but is not limited to, a function of supplying an initialization signal. The gate driver 104a can supply another signal.

The source driver 104b includes a shift register or the like. The source driver 104b receives a signal (video signal) from which a data signal is derived, as well as a signal for driving the shift register, through the terminal portion 107. The source driver 104b has a function of generating a data signal to be written in the pixel circuit 108 based on the video signal. In addition, the source driver 104b has a function of controlling output of a data signal in response to a pulse signal produced by input of a start pulse, a clock signal, or the like. Further, the source driver 104b has a function of controlling potentials of wirings supplied with data signals (hereinafter such wirings are referred to as data lines DL_1 to DL_Y). Alternatively, the source driver 104b has, but is not limited to, a function of supplying an initialization signal. The source driver 104b can supply another signal.

The source driver 104b includes a plurality of analog switches or the like, for example. The source driver 104b can output, as the data signals, signals obtained by time-dividing the video signal by sequentially turning on the plurality of analog switches. The source driver 104b may include a shift register or the like.

A pulse signal and a data signal are input to each of the plurality of the pixel circuits 108 through one of the plurality of wirings supplied with scan signals (hereinafter scan lines GL) and one of the plurality of wirings supplied with data signal (hereinafter data lines DL), respectively. Writing and holding of the data signal in each of the plurality of pixel circuits 108 are performed by the gate driver 104a. For example, to the pixel circuit 108 in m-th row and n-th column (m is a natural number of less than or equal to X, and n is a natural number of less than or equal to Y), a pulse signal is input from the gate driver 104a through the scan line GL_m, and a data signal is input from the source driver 104b through the data line DL_n depending on the potential of the scan line GL_m.

The protection circuit 106 is connected to the scan line GL making the connection between the gate driver 104a and the pixel circuit 108. Alternatively, the protection circuit 106 is connected to the data line DL making the connection between the source driver 104b and the pixel circuit 108. Alternatively, the protection circuit 106 can be connected to a wiring making the connection between the gate driver 104a and the terminal portion 107. Alternatively, the protection circuit 106 can be connected to a wiring making the connection between the source driver 104b and the terminal portion 107. Note that the terminal portion 107 means a portion having terminals for inputting power, control signals, and video signals to the display device from external circuits.

The protection circuit 106 is a circuit which electrically connects a wiring connected to the protection circuit to another wiring when a potential out of a certain range is applied to the wiring connected to the protection circuit. However, without being limited to that, the protection circuit 106 can supply another signal.

As illustrated in FIG. 1A, the protection circuit 106 is provided for the pixel portion 102 and the driver circuit portion 104, so that resistance of the display device to overcurrent generated by electrostatic discharge (ESD) or the like can be improved. Note that the configuration of the protection circuit 106 is not limited to that, and for example, the protection circuit 106 may be configured to be connected to only the gate driver 104a or the protection circuit 106 may be configured to be connected to only the source driver 104b. Alternatively, the protection circuit 106 may be configured to be connected to the terminal portion 107.

In the non-limiting example illustrated in FIG. 1A, the driver circuit portion 104 includes the gate driver 104a and the source driver 104b. For example, only the gate driver 104a may be formed and a separately prepared substrate where a source driver circuit is formed (e.g., a driver circuit substrate formed with a single crystal semiconductor film or a polycrystalline semiconductor film) may be mounted.

Figure 1B:
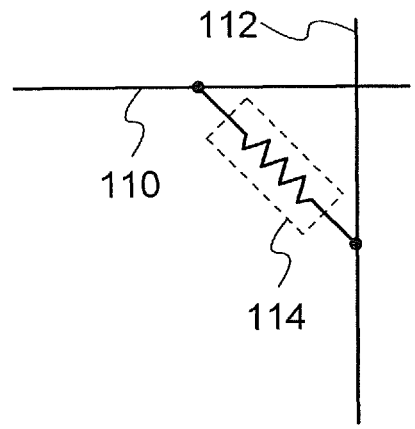

The protection circuit 106 can be formed using a resistor, for example. FIG. 1B illustrates a specific example of the protection circuit.

In the protection circuit 106 illustrated in FIG. 1B, a resistor 114 is connected between a wiring 110 and a wiring 112. The wiring 110 is, for example, a leading wiring led out from the scan line GL, the data line DL, or the terminal portion 107 to the driver circuit portion 104 in FIG. 1A.

The wiring 112 is, for example, a wiring supplied with a potential of a power source line to supply power to the gate driver 104a or the source driver 104b (the potential is a first potential (hereinafter referred to as a high power source potential VDD), a second potential (hereinafter referred to as a low power source potential VSS), or a ground potential GND, for example). Alternatively, the wiring 112 is a wiring supplied with a common potential (common line). As an example, the wiring 112 is preferably connected to the power source line to supply power to the gate driver 104a, especially, to a wiring for supplying low potentials. This is because the scan line GL has a low potential in most periods, and thus, when the wiring 112 also has a low potential, current leaked from the scan line GL to the wiring 112 can be reduced in a normal operation.

A structural example of the resistor 114 will be described with reference to FIGS. 2A and 2B.

The resistor 114 illustrated in FIG. 2A includes a layer having a conductive property formed over the substrate 140 (hereinafter the layer is referred to as a conductive layer 142), a layer having an insulating property formed over the substrate 140 and the conductive layer 142 (hereinafter the layer is referred to as an insulating layer 144), and a layer having a conductive property formed over the insulating layer 144 (hereinafter the layer is referred to as a conductive layer 148).

Figure 2A:
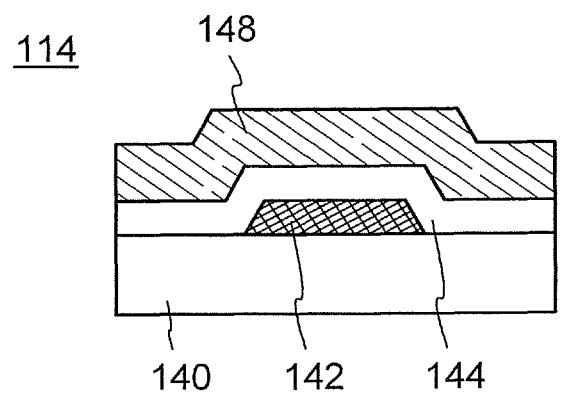
FIGS. 2A and 2B are cross-sectional views each illustrating a resistor in a display device.
Figure 2B:
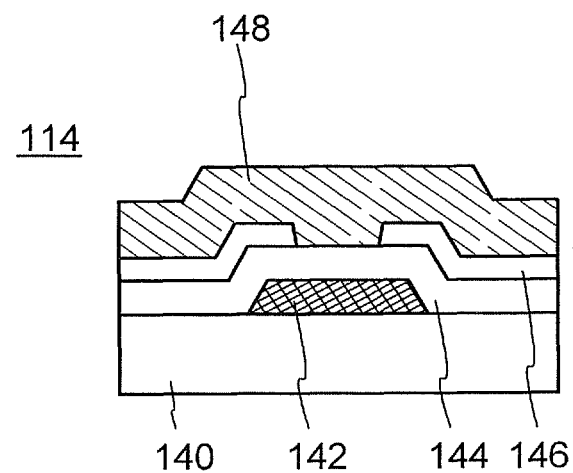

The resistor 114 illustrated in FIG. 2B includes the conductive layer 142 formed over the substrate 140, the insulating layer 144 formed over the substrate 140 and the conductive layer 142, an insulating layer 146 formed over the insulating layer 144, and the conductive layer 148 formed over the insulating layer 144 and the insulating layer 146.

Note that the wiring 112 illustrated in FIG. 1B corresponds to a wiring formed of the conductive layer 142, and the wiring 110 illustrated in FIG. 1B corresponds to a wiring formed of the conductive layer 148.

In other words, the resistor 114 illustrated in FIGS. 2A and 2B has a structure in which the insulating layer 144 is interposed between a pair of electrodes. The resistivity (also referred to as resistance, electric resistivity or specific resistance) of the insulating layer 144 is controlled, and thereby, when overcurrent flows in one of the pair of electrodes, part or the whole of the overcurrent can be made to flow to the other.

However, when the resistivity of the insulating layer interposed between the pair of electrodes is high, for example, an insulating layer having a resistivity of $10^{18}$ Ωcm or higher is used, overcurrent flowing through one of the pair of electrodes cannot be made flow to the other favorably.

For that reason, in one embodiment of the present invention, the resistivity of the insulating layer 144 interposed between the pair of electrodes is, for example, $10^{10}$ Ωcm or higher and lower than $10^{18}$ Ωcm, preferably, $10^{11}$ Ωcm or higher and lower than $10^{15}$ Ωcm. An example of the insulating film having such a resistivity includes an insulating film containing nitrogen and silicon.

In addition, the resistor 114 may have a structure in which the insulating layer 146 is formed over the insulating layer 144 so as to cover an end portion of one of the pair of electrodes as illustrated in FIG. 2B. The insulating layer 146 can be formed using a material having a resistivity higher than that of the insulating layer 144. For example, an insulating film having a resistivity of $10^{18}$ Ωcm or higher may be used for the insulating layer 146. An example of the insulating film having such a resistivity includes an insulating film containing oxygen, nitrogen, and silicon.

In addition, the conductive layers 142 and 148 serving as the pair of electrodes of the resistor 114 and the insulating layers 144 and 146 serving as the insulating layers of the resistor 114 can be formed in the same steps as the fabrication steps of the transistors included in the pixel portion 102 and the driver circuit portion 104 in the display device illustrated in FIG. 1A.

Specifically, the conductive layer 142 can be formed in the same step as the gate electrode of the transistor, the conductive layer 148 can be formed in the same step as the source electrode or the drain electrode of the transistor, and the insulating layers 144 and 146 can be formed in the same step as a gate insulating layer of the transistor.

By the protection circuit 106 provided in the display device illustrated in FIG. 1A in this manner, the pixel portion 102 and the driver circuit portion 104 can have an enhanced resistance to overcurrent generated by ESD or the like. Therefore, a novel display device with improved reliability can be provided.

Next, a specific structure of the display device illustrated in FIG. 1A will be described with reference to FIG. 3.

A display device illustrated in FIG. 3 includes the pixel portion 102, the gate driver 104a in the driver circuit portion, the source driver 104b in the driver circuit portion, a protection circuit 106_1, a protection circuit 106_2, a protection circuit 106_3, and a protection circuit 106_4.

Note that the pixel portion 102, the gate driver 104a, and the source driver 104b have the same structures as those illustrated in FIG. 1A.

The protection circuit 106_1 includes transistors 151, 152, 153, and 154 and resistors 171, 172, and 173. In addition, the protection circuit 106_1 is provided between the gate driver 104a and wirings 181, 182, and 183 connected to the gate driver 104a. In addition, a first terminal serving as a source electrode of the transistor 151 is connected to a second terminal serving as a gate electrode of the transistor 151, and a third terminal serving as a drain electrode of the transistor 151 is connected to the wiring 183. A first terminal serving as a source electrode of the transistor 152 is connected to a second terminal serving as a gate electrode of the transistor 152, and a third terminal serving as a drain electrode of the transistor 152 is connected to the first terminal of the transistor 151. A first terminal serving as a source electrode of the transistor 153 is connected to a second terminal serving as a gate electrode of the transistor 153, and a third terminal serving as a drain electrode of the transistor 153 is connected to the first terminal of the transistor 152. A first terminal serving as a source electrode of the transistor 154 is connected to a second terminal serving as a gate electrode of the transistor 154, and a third terminal serving as a drain electrode of the transistor 154 is connected to the first terminal of the transistor 153. The first terminal of the transistor 154 is connected to the wiring 183 and the wiring 181. In addition, the resistors 171 and 173 are provided in the wiring 183. In addition, the resistor 172 is provided between the wiring 182 and the first terminal of the transistor 152 and the third terminal of the transistor 153.

Note that for example, the wiring 181 can be used as a power source line supplied with the low power source potential VSS; the wiring 182 can be used as a common line; and the wiring 183 can be used as a power source line supplied with the high power source potential VDD.

The protection circuit 106_2 includes transistors 155, 156, 157, and 158 and resistors 174 and 175. In addition, the protection circuit 106_2 is provided between the gate driver 104a and the pixel portion 102. In addition, a first terminal serving as a source electrode of the transistor 155 is connected to a second terminal serving as a gate electrode of the transistor 155, and a third terminal serving as a drain electrode of the transistor 155 is connected to the wiring 185. A first terminal serving as a source electrode of the transistor 156 is connected to a second terminal serving as a gate electrode of the transistor 156, and a third terminal serving as a drain electrode of the transistor 156 is connected to the first terminal of the transistor 155. A first terminal serving as a source electrode of the transistor 157 is connected to a second terminal serving as a gate electrode of the transistor 157, and a third terminal serving as a drain electrode of the transistor 157 is connected to the first terminal of the transistor 156. A first terminal serving as a source electrode of the transistor 158 is connected to a second terminal serving as a gate electrode of the transistor 158, and a third terminal serving as a drain electrode of the transistor 158 is connected to the first terminal of the transistor 157. The first terminal of the transistor 158 is connected to the wiring 184. In addition, the resistor 174 is provided between the wiring 185, the first terminal of the transistor 156 and the third terminal of the transistor 157, and the resistor 175 is provided between the wiring 184, the first terminal of the transistor 156 and the third terminal of the transistor 157.

Note that for example, the wiring 184 can be used as a power source line supplied with the low power source potential VSS; the wiring 185 can be used as a power source line supplied with the high power source potential VDD; and the wiring 186 can be used as a gate line.

The protection circuit 106_3 includes transistors 159, 160, 161, and 162 and resistors 176 and 177. In addition, the protection circuit 106_3 is provided between the source driver 104b and the pixel portion 102. In addition, a first terminal serving as a source electrode of the transistor 159 is connected to a second terminal serving as a gate electrode of the transistor 159, and a third terminal serving as a drain electrode of the transistor 159 is connected to a wiring 190. A first terminal serving as a source electrode of the transistor 160 is connected to a second terminal serving as a gate electrode of the transistor 160, and a third terminal serving as a drain electrode of the transistor 160 is connected to the first terminal of the transistor 159. A first terminal serving as a source electrode of the transistor 161 is connected to a second terminal serving as a gate electrode of the transistor 161, and a third terminal serving as a drain electrode of the transistor 161 is connected to the first terminal of the transistor 160. A first terminal serving as a source electrode of the transistor 162 is connected to a second terminal serving as a gate electrode of the transistor 162, and a third terminal serving as a drain electrode of the transistor 162 is connected to the first terminal of the transistor 161. In addition, the first terminal of the transistor 162 is connected to a wiring 191. Further, the resistor 176 is provided between the wiring 190, the first terminal of the transistor 160 and the third terminal of the transistor 161, and the resistor 177 is provided between the wiring 191, the first terminal of the transistor 160 and the third terminal of the transistor 161.

Note that for example, the wiring 188 can be used as a common line or a source line; the wirings 189 and 190 can be used as a power source line supplied with the high power source potential VDD; and the wiring 191 can be used as a power source line supplied with the low power source potential VSS.

The protection circuit 106_4 includes transistors 163, 164, 165, and 166 and resistors 178, 179, and 180. In addition, the protection circuit 106_4 is provided between the source driver 104b and wirings 187, 188, 189, 190, and 191 connected to the source driver 104b. In addition, a first terminal serving as a source electrode of the transistor 163 is connected to a second terminal serving as a gate electrode of the transistor 163, and a third terminal serving as a drain electrode of the transistor 163 is connected to the wiring 187. A first terminal serving as a source electrode of the transistor 164 is connected to a second terminal serving as a gate electrode of the transistor 164, and a third terminal serving as a drain electrode of the transistor 164 is connected to the first terminal of the transistor 163. A first terminal serving as a source electrode of the transistor 165 is connected to a second terminal serving as a gate electrode of the transistor 165, and a third terminal serving as a drain electrode of the transistor 165 is connected to the first terminal of the transistor 164. A first terminal serving as a source electrode of the transistor 166 is connected to a second terminal serving as a gate electrode of the transistor 166, and a third terminal serving as a drain electrode of the transistor 166 is connected to the first terminal of the transistor 165. In addition, the first terminal of the transistor 166 is connected to the wiring 189. Further, the resistor 178 is provided between the wiring 187 and the wiring 188 and the resistor 179 is provided in the wiring 188, and is connected to the first terminal of the transistor 164 and the third terminal of the transistor 165. The resistor 180 is provided between the wiring 188 and the wiring 189.

Note that for example, the wirings 187 and 191 can be used as power source lines supplied with the low power source potential VSS; the wiring 188 can be used as a common line or a source line; the wirings 189 and 190 can be used as power source lines supplied with the high power source potential VDD.

Note that the functions of the wirings 181 to 191 are not limited to functions of being supplied with the high power source potential VDD and the low power source potential VSS, and a function of the common line CL illustrated in FIG. 3, and the wirings 181 to 191 can have functions of a scan line, a signal line, a power source line, a ground line, a capacitor line, a common line, and the like, independently.

In this manner, the protection circuits 106_1 to 106_4 each include a plurality of transistors that are diode-connected and a plurality of resistors. In other words, the protection circuits 106_1 to 106_4 can include transistors that are diode-connected and resistors that are combined in parallel.

In addition, the protection circuits 106_1 to 106_4 illustrated in FIG. 3 can be provided between the gate driver 104a and wirings connected to the gate driver 104a, between the pixel portion 102 and the gate driver 104a, between the pixel portion 102 and the source driver 104b, and between the source driver 104b and wirings connected to the source driver 104b.

Figure 49A:
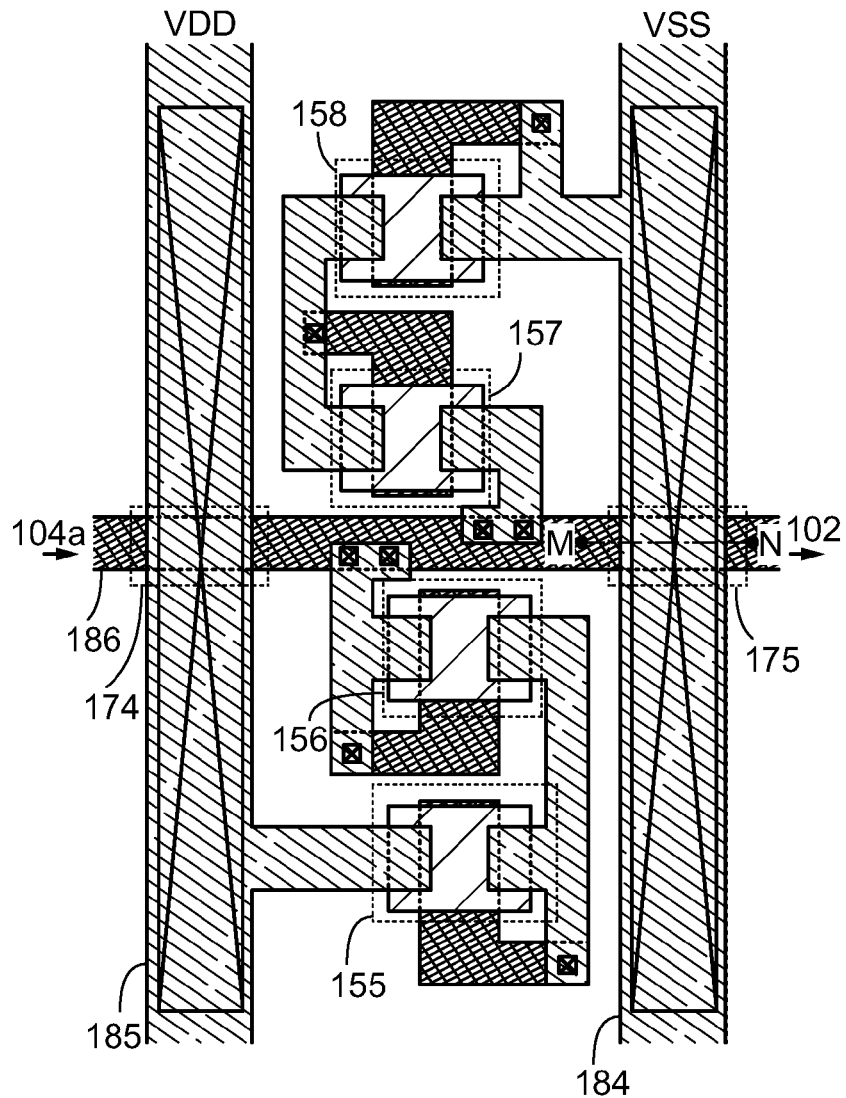
FIGS. 49A and 49B are a plan view and a cross-sectional view of a display device.
Figure 49B:
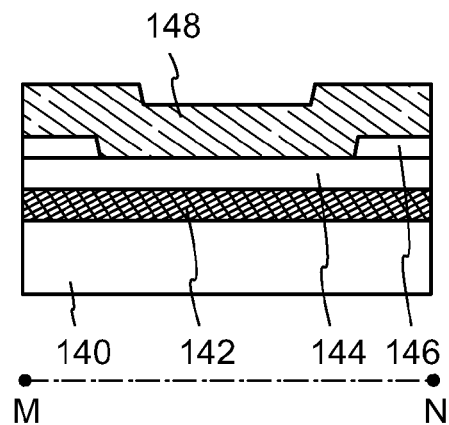

FIG. 49A is a plan view of the protection circuit 106_2 illustrated in FIG. 3 and FIG. 49B is a cross-sectional view of a region serving as the resistor. The reference numerals in the plan view of FIG. 49A correspond to the reference numerals in FIG. 3. FIG. 49B is a cross-sectional view taken along the section line M-N in FIG. 49A. As illustrated in FIGS. 49A and 49B, a part of the insulating layer overlapping with the wiring is removed to control the resistivity of the insulating layer between wirings, so that the resistor in the protection circuit described in this embodiment can transfer overcurrent favorably.

Figure 51:
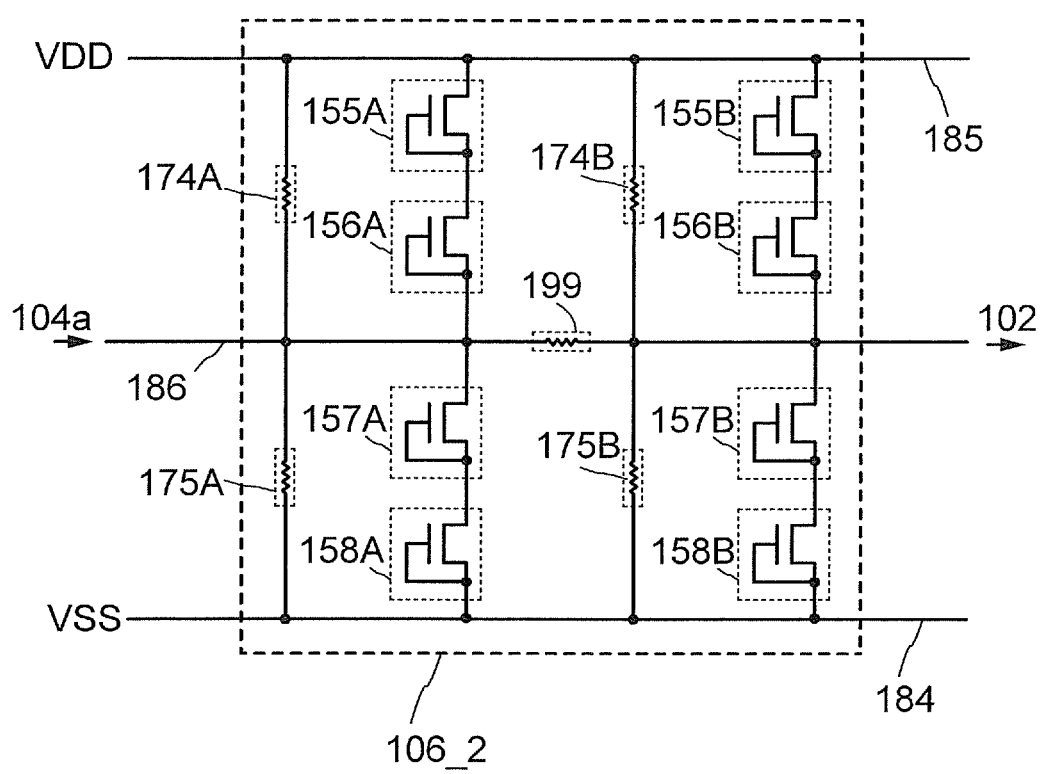
FIG. 51 is a circuit diagram illustrating a protection circuit.

Further, FIG. 51 is a circuit diagram having a structure different from the protection circuit described with reference to FIG. 3. In the circuit diagram illustrated in FIG. 51, transistors 155A to 158A, transistors 155B to 158B, resistors 174A and 175A, resistors 174B and 175B, a resistor 199, the wiring 184, the wiring 185 and the wiring 186 are illustrated. The reference numerals in the circuit diagram of FIG. 51 correspond to the reference numerals used for the protection circuit 106_2 in FIG. 3 for the components common in FIG. 51 and FIG. 3. The protective circuit 106_2 in FIG. 51 is different from that in FIG. 3 in that circuits corresponding to the protection circuit 106_2 in FIG. 3 are placed side by side and the resistor 199 is placed between wirings.

Note that the resistor 199 included in the protection circuit 106_2 illustrated in FIG. 51 preferably has a resistivity much lower than resistivities of the resistors 174A, 175A, 174B, and 175B, in which case the resistivity of the resistor 199 is $10^3$ Ωcm or higher and lower than $10^6$ Ωcm and the resistivities of the resistors 174A, 175A, 174B, and 175B are $10^{10}$ Ωcm or higher and lower than $10^{18}$ Ωcm. With the structure of the circuit diagram illustrated in FIG. 51, a steep change of signals supplied to the wirings can be suppressed.

By the plurality of protection circuits provided in the display device illustrated in FIG. 3, the resistances of the pixel portion 102 and the driver circuit portion 104 (the gate driver 104a and the source driver 104b) to overcurrent due to ESD or the like can be further improved. Therefore, a novel display device with improved reliability can be provided.

The plurality of transistors that are diode-connected in the protection circuit 106_1 to the protection circuit 106_4 in FIG. 3 can have superior functions for the protection circuits, by using oxide semiconductors in semiconductor layers serving as channel formation regions in particular.

Figure 52A:
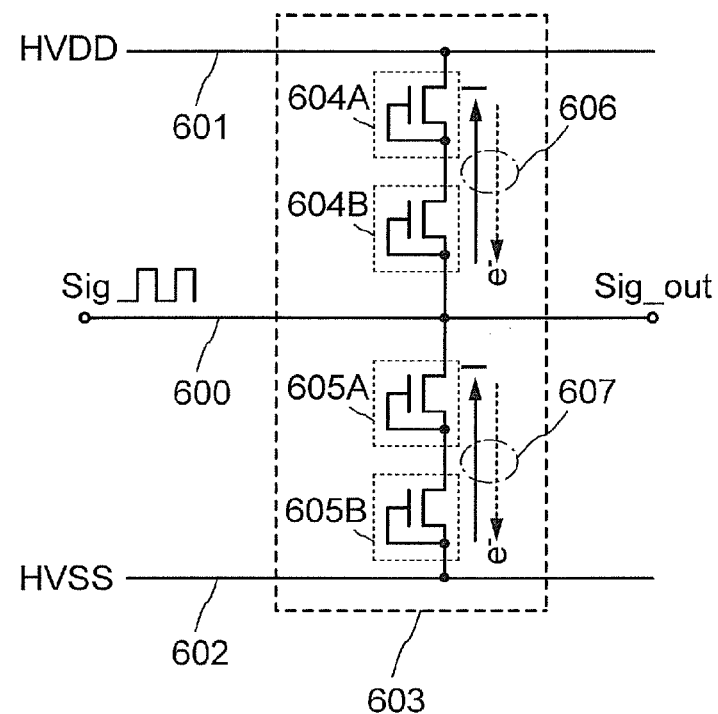
FIGS. 52A and 52B are a circuit diagram and a waveform diagram illustrating a protection circuit.
Figure 52B:
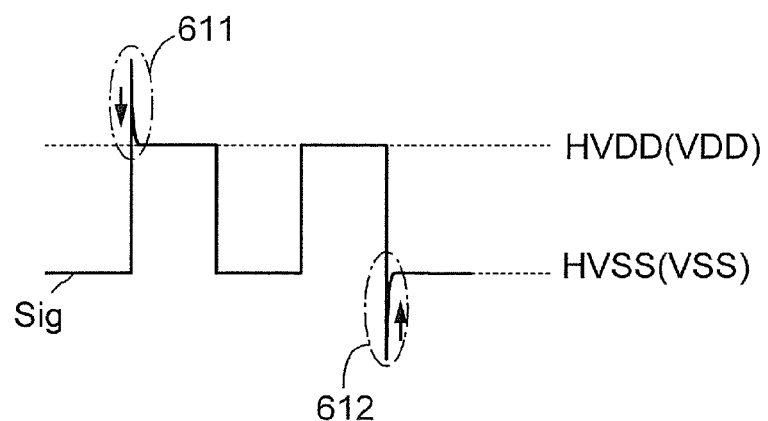

With reference to the circuit diagram and the waveform chart in FIGS. 52A and 52B, an advantage of the use of the transistor using an oxide semiconductor in a semiconductor layer to serve as a channel formation region as a diode-connected transistor in a protection circuit is described.

In FIG. 52A, a wiring 600 for inputting and outputting a signal, a wiring 601 supplied with a high power source potential HVDD, a wiring 602 supplied with a low power source potential HVSS, and a protection circuit 603 are illustrated.

A signal Sig supplied to the wiring 600 is a clock signal, a selection signal, a signal of a fixed potential, or the like. In the example in FIGS. 52A and 52B, the signal Sig is described as a clock signal. In this case, a signal Sig_out which the wiring 600 supplies to another element or another wiring serves as a clock signal supplied to a gate driver or a source driver.

The high power source potential HVDD supplied to the wiring 601 may be equal to or higher than the high power source potential VDD. The low power source potential HVSS supplied to the wiring 602 may be equal to or lower than the low power source potential VSS.

The protection circuit 603 includes transistors 604A, 604B, 605A, and 605B as examples of the plurality of diode-connected transistors.

The transistor 604A and the transistor 604B are transistors that are diode-connected between the wiring 600 and the wiring 601. The transistor 604A and the transistor 604B allow almost no current to flow in a normal operation and can supply the signal Sig itself as the signal Sig_out. In addition, the transistor 604A and the transistor 604B allow overcurrent to flow when a surge voltage is applied and the transistors can supply a signal obtained by lowering the surge voltage of the signal Sig as the signal Sig_out. In addition, electrons flow in the direction opposite to the direction in which overcurrent flows in the transistor 604A and the transistor 604B.

FIG. 52B shows an example of a waveform when the signal Sig serves as a clock signal. The transistor 604A and the transistor 604B can lower the surge voltage 611 to the high power source potential when overcurrent and electrons flow at application of the surge voltage 611 higher than the high power source potential HVDD in the waveform of the signal Sig in FIG. 52B, and the transistor 604A and the transistor 604B can supply the clock signal with the surge voltage removed, as the signal Sig_out. Thus, dielectric breakdown of a circuit supplied with the signal Sig_out can be forestalled.

The flow directions of overcurrent and electrons in the transistor 604A and the transistor 604B are represented by arrows 606. Of the arrows 606, the solid arrow I represents the flow direction of overcurrent and the broken line arrow $e^-$ represents the flow direction of electrons.

The transistor 605A and transistor 605B are diode-connected between the wiring 600 and the wiring 602. The transistor 605A and the transistor 605B allow almost no current flow in a normal operation and can supply the signal Sig itself as the signal Sig_out. In addition, the transistor 605A and the transistor 605B can allow overcurrent to flow when a surge voltage is applied and the transistors can supply a signal with increased surge voltage of the signal Sig as the signal Sig_out. In addition, electrons flow in the direction opposite to the flow direction of overcurrent in the transistor 605A and the transistor 605B.

Further, in the transistor 604A and the transistor 604B, when a surge voltage 612 lower than the low power source potential HVSS in the waveform chart of the signal Sig illustrated in FIG. 52B is applied, overcurrent and electrons flow, and thereby the surge voltage 612 can be increased to the low power source potential, and the clock signal with the surge voltage removed can be supplied as the signal Sig_out. Therefore, dielectric breakdown of a circuit supplied with the signal Sig_out can be forestalled.

The flow directions of overcurrent and electrons in the transistor 605A and the transistor 605B are represented by arrows 607. Of the arrows 607, the solid arrow I represents the flow direction of overcurrent and the broken line arrow e⁻ represents the flow direction of electrons.

Note that the transistor 604A, the transistor 604B, the transistor 605A, and the transistor 605B in FIG. 52B employ oxide semiconductors especially in semiconductor layers serving as channel formation regions. The transistors using oxide semiconductors in semiconductor layers serving as channel formation regions are transistors with extremely low off-state leakage current. Thus, the amount of leakage current in non-operation of the protection circuit 603 can be minimized.

Because the transistors using oxide semiconductors in semiconductor layers serving as channel formation regions have band gaps higher by about 1 V to 2 V than those of transistors using silicon in semiconductor layers, the transistors using oxide semiconductors hardly cause avalanche breakdown and can have a high resistance to electric field. For this reason, with use of the oxide semiconductors in the semiconductor layers serving as the channel formation regions, the protection circuit can have superior functions.

As described above with reference to FIGS. 52A and 52B, the functions of the protection circuit such as the minimum amount of leakage current and a high resistance to electric field can be improved with use of the transistors using oxide semiconductors in the protection circuit.

Although this embodiment has described that the protection circuits are used, one embodiment of the present invention is not limited to this embodiment. Depending on the situation, no protection circuit can be provided.

The structure described in this embodiment can be used in appropriate combination with a structure described in another embodiment.

Embodiment 2

In this embodiment, a structure of a display device using a transverse electric field mode liquid crystal element (the device is also referred to simply as a liquid crystal display device) including the protection circuit described in Embodiment 1 is described. Since a liquid crystal display device of a transverse electric field mode can have a wider viewing angle than that of a vertical electric field mode, in recent years, liquid crystal display devices with a variety of screen sizes are used as display devices of mobile devices, and the like.

The term "liquid crystal display device" means a device having a liquid crystal element. Note that the liquid display device can also include a peripheral driver circuit for driving the plurality of pixels. The liquid crystal display device also includes a control circuit, a power source circuit, a signal generation circuit, a back light module, and the like which are arranged on another substrate, and can be referred to as a liquid crystal module.

Typical examples of transverse electric field mode liquid crystal elements include an in-plane-switching (IPS) mode and a fringe field switching (FFS) mode. In this embodiment, a structure of an FFS mode liquid crystal display device will be described.

A liquid crystal display device in this embodiment is described with reference to FIG. 4, FIGS. 5A and 5B, FIGS. 6A and 6B, FIGS. 7A and 7B, FIG. 8, FIGS. 9A and 9B, FIG. 10, FIGS. 11A to 11D, FIGS. 12A to 12C, FIGS. 13A and 13B, FIGS. 14A to 14C, FIGS. 15A and 15B, FIGS. 16A and 16B, and FIGS. 17A and 17B.

<Structure of Transverse Electric Field Mode LCD in Schematic Plan View>

Figure 4:
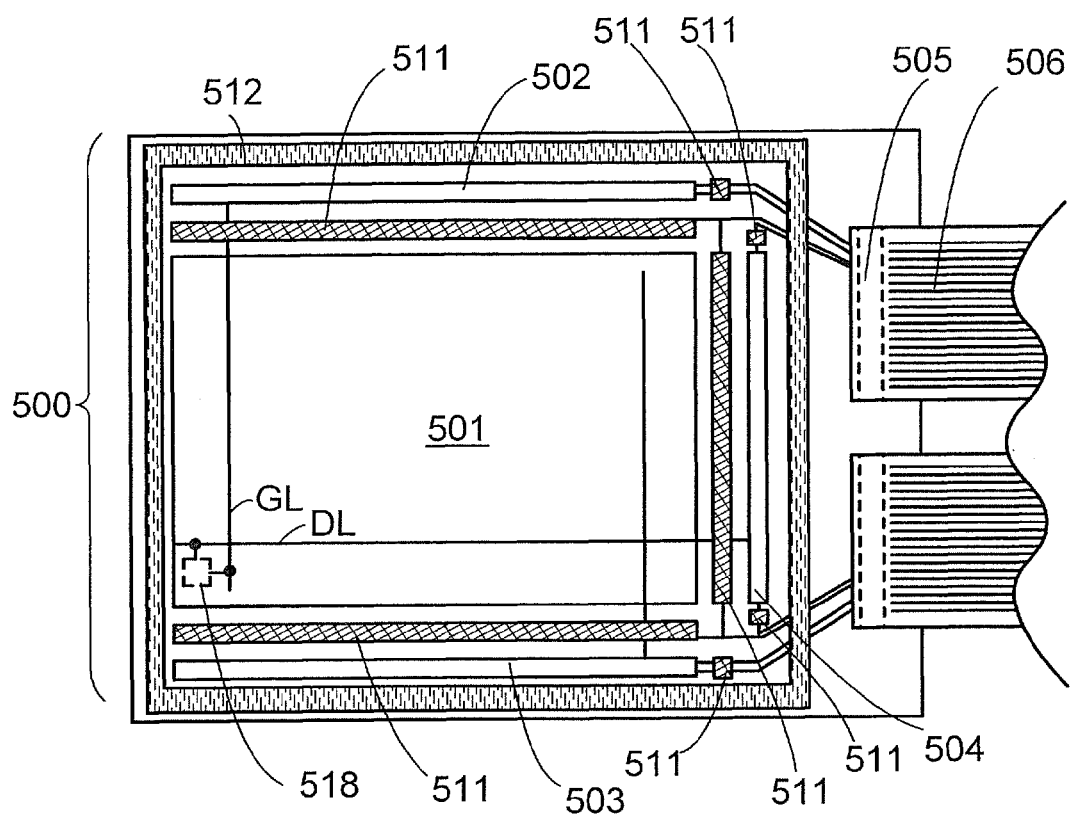
FIG. 4 is a schematic plan view of a display device.

FIG. 4 is a schematic plan view illustrating an example of a structure of a liquid crystal display device 500.

In the schematic plan view of the liquid crystal display device 500 in FIG. 4, a circuit having pixels (hereinafter referred to as a pixel portion 501), circuits for outputting signals (scan signals) to select pixels (hereinafter referred to as gate drivers 502 and 503), a circuit for supplying a signal (data signal) for driving a display element in a pixel (hereinafter, referred to as a source driver 504), a terminal portion 505, a flexible printed circuit (FPC) 506, a sealant 512, and a circuit for protecting an element (hereinafter referred to as a protection circuit 511) are illustrated.

In the schematic plan view of the pixel portion 501 illustrated in FIG. 4, a pixel 518, a wiring (hereinafter referred to as a scan line GL), and a wiring (hereinafter referred to as a data line DL) are illustrated. A scan signal is supplied to the pixel 518 through the scan line GL. Further, a data signal is supplied to the pixel 518 through the data line DL.

In FIG. 4, the scan lines GL of odd-numbered rows are connected to one of the gate driver 502 and the gate driver 503 and the scan lines GL of even-numbered rows are connected to the other of the gate driver 502 and the gate driver 503. The data lines DL are connected to the source driver 504.

A terminal portion 505 illustrated in FIG. 4 is connected to the FPC 506 outside the sealant 512. The terminal portion 505 and the FPC 506 are electrically connected to each other through an anisotropic conductive film or the like. In the terminal portion 505 in the schematic plan view in FIG. 4, a wiring for supplying a control signal and a wiring for supplying power (power supply line) are illustrated between the gate drivers 502 and 503 and the source driver 504.

The sealant 512 illustrated in FIG. 4 is provided to seal in a liquid crystal layer inside. In addition, the sealant 512 is provided to block moisture from outside and maintain the constant interval between substrates, between which the liquid crystal layer is interposed.

In the schematic plan view in FIG. 4, the protection circuits 511 are placed in a wiring making electrical connection between the gate driver 502 and the terminal portion 505, in a wiring making electrical connection between the gate driver 503 and the terminal portion 505, in a wiring making electrical connection between the gate driver 502 and the pixel portion 501, in a wiring making electrical connection between the gate driver 503 and the pixel portion 501, and in a wiring making electrical connection between the source driver 504 and the pixel portion 501.

Although not illustrated in FIG. 4, the liquid crystal display device 500 further includes a common contact portion where a wiring supplied with a common potential (the wiring is referred to as a common line) and another wiring are connected, a connection portion where wirings formed in different layers are connected to each other, and the like.

<Pixel Structure>

Figure 5A:
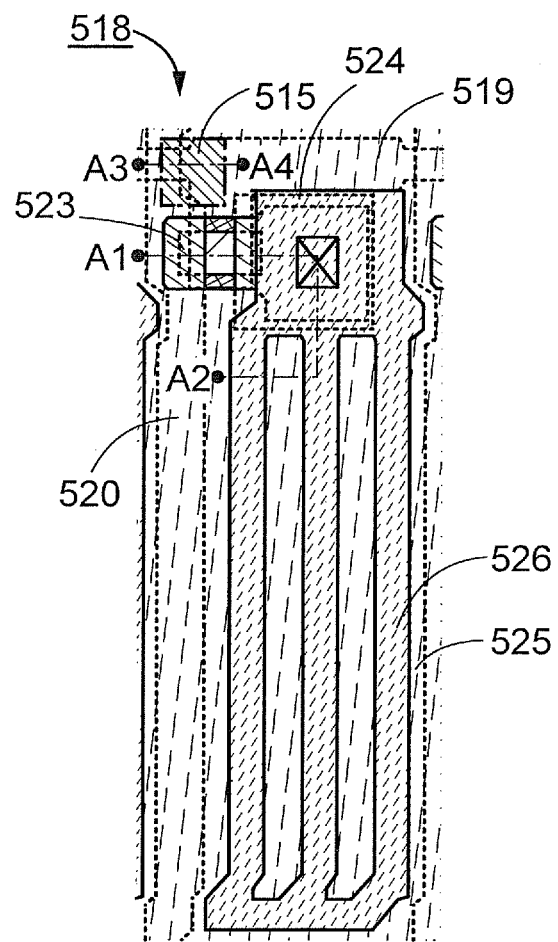
FIGS. 5A and 5B are a plan view and a circuit diagram of a display device.
Figure 5B:
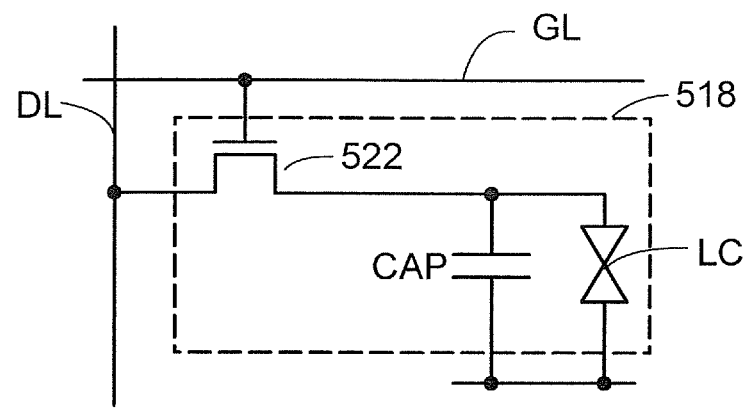

Next, a structural example of the pixel 518 will be described. FIG. 5A is a plan view illustrating a structural example of the pixel and FIG. 5B is a circuit diagram of a part of the plan view.

Figure 6A:
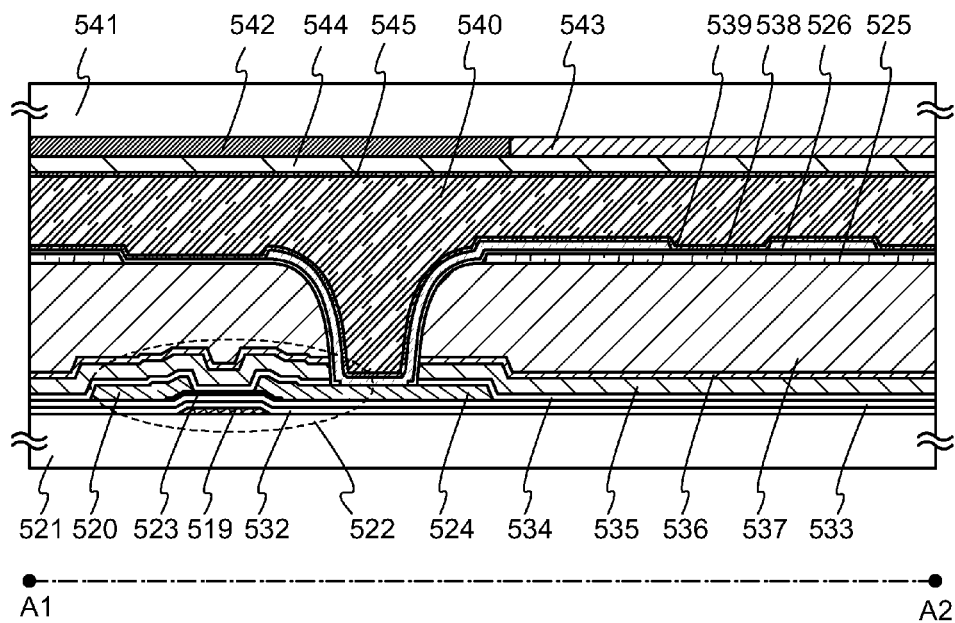
FIGS. 6A and 6B are cross-sectional views of a display device.
Figure 6B:
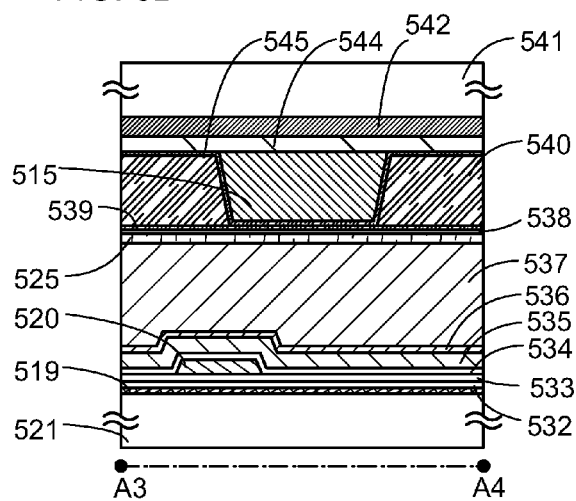

FIG. 6A is a cross-sectional view taken along the section line A1-A2 in FIG. 5A. FIG. 6B is a cross-sectional view taken along the section line A3-A4 in FIG. 5A.

In the plan view of the pixel 518 in FIG. 5A, a layer having a conductive property (hereinafter referred to as a conductive layer 519), a layer having a conductive property (hereinafter referred to as a conductive layer 520), a semiconductor layer 523, a layer having a conductive property (hereinafter referred to as a conductive layer 524), a layer having a conductive property (hereinafter referred to as a conductive layer 525), a layer having a conductive property (hereinafter referred to as a conductive layer 526), and a spacer 515 are exemplified.

The conductive layer 519 is a wiring serving as a scan line. The conductive layer 519 can serve as a gate electrode of the transistor 522. The conductive layer 519 can serve as a wiring supplied with a signal of a constant potential such as a high power source potential VDD, a low power source potential VSS, a ground potential or a common potential. The conductive layer 519 can serve as a wiring led out to make electric connection between wirings formed in different layers. As the conductive layer 519, a single layer or two or more layers of a film including a conductive material containing one or more kinds of aluminum, titanium, chromium, cobalt, nickel, copper, yttrium, zirconium, molybdenum, ruthenium, silver, tantalum, and tungsten are preferably formed.

The conductive layer 520 is a wiring serving as a data line. The conductive layer 520 can serve as one electrode of a source and a drain of the transistor 522. The conductive layer 520 can serve as a wiring supplied with a signal of a constant potential such as the high power source potential VDD, the low power source potential VSS, the ground potential, or the common potential. The conductive layer 520 can serve as a wiring led out to make electric connection between wirings formed in different layers. The conductive layer 520 can be formed in a manner similar to that of the conductive layer 519.

The semiconductor layer 523 is a layer with semiconductor characteristics. The layer with semiconductor characteristics can be a semiconductor layer mainly containing silicon (Si), a semiconductor layer mainly containing an organic material, or a semiconductor layer mainly containing a metal oxide. An example of the semiconductor layer mainly containing a metal oxide is an oxide semiconductor layer.

The conductive layer 524 serves as the other electrode of the source and the drain of the transistor 522. In addition, the conductive layer 524 can serve as a wiring led out to make electric connection between wirings formed in different layers. The conductive layer 524 can be formed in a manner similar to that of the conductive layer 520.

The conductive layer 525 is a layer serving as a common electrode or a pixel electrode of a liquid crystal element, and further can serve as a wiring led out to make electric connection between wirings formed in different layers. As an example of the conductive layer 525, a film of an indium oxide containing tungsten oxide, an indium zinc oxide containing tungsten oxide, an indium oxide containing titanium oxide, an indium tin oxide containing titanium oxide, an indium tin oxide, an indium zinc oxide, an indium tin oxide to which silicon oxide is added, or the like can be used. Note that one of the common electrode and the pixel electrode has a comb-like shape and the other thereof has a planar shape.

The conductive layer 526 is a layer serving as the common electrode or the pixel electrode of the liquid crystal element, and further can serve as a wiring led out to make electric connection between wirings formed in different layers. The conductive layer 526 can be formed in a manner similar to that of the conductive layer 525.

In this embodiment, as the arrangement of the conductive layer 525 and the conductive layer 526, an example where the conductive layer 525 serving as a common electrode is placed below the conductive layer 526 serving as a pixel electrode (on the substrate 521 side) is illustrated, but the conductive layer 525 serving as a common electrode can be placed above the conductive layer 526 serving as a pixel electrode.

The spacer 515 maintains the cell gap. As illustrated in FIG. 5A, the spacer 515 is formed in a region where the conductive layer 519 serving as a scan line and the conductive layer 520 serving as a data line overlap with each other. The region does not contribute to display because the alignment of the liquid crystal material is disordered in the region. When the spacer 515 is formed in such a region, the aperture ratio of the pixel 518 can be increased.

In the circuit diagram of the pixel 518 in FIG. 5B, the scan line GL, the data line DL, the transistor 522, a capacitor CAP, and a liquid crystal element LC are illustrated.

The transistor 522 serves as a switching element for controlling the connection between the liquid crystal element LC and the data line DL. On/off of the transistor 522 is controlled by the scan signal supplied to the gate of the transistor 522 through the scan line GL.

The capacitor CAP is an element formed in a region where the conductive layer 525 and the conductive layer 526 overlap with each other, for example. Thus, a capacitor line is not needed in the pixel 518.

The liquid crystal element LC includes the common electrode, the pixel electrode, and the liquid crystal layer, for example. Alignment of the liquid crystal material of the liquid crystal layer is changed by the action of an electric field generated between the common electrode and the pixel electrode.

In the cross-sectional view of the pixel 518 taken along the section line A1-A2 in FIG. 6A, the substrate 521, the conductive layer 519, a layer having an insulating property (hereinafter referred to as an insulating layer 532), a layer having an insulating property (hereinafter referred to as an insulating layer 533), the semiconductor layer 523, the conductive layer 520, the conductive layer 524, a layer having an insulating property (hereinafter referred to as an insulating layer 534), a layer having an insulating property (hereinafter referred to as an insulating layer 535), a layer having an insulating property (hereinafter referred to as an insulating layer 536), a layer having an insulating property (hereinafter referred to as an insulating layer 537), the conductive layer 525, the conductive layer 526, a layer having an insulating property (hereinafter referred to as an insulating layer 538), a film imparting an alignment property to a liquid crystal (hereinafter referred to as an alignment film 539), a liquid crystal layer 540, a substrate 541, a film having a light-blocking property (hereinafter referred to as a black matrix 542), a color filter 543, an overcoat 544, and a film imparting an alignment property to a liquid crystal (hereinafter referred to as an alignment film 545) are exemplified. In FIG. 5B, the transistor 522 is illustrated.

Examples of the substrate 521 include a glass substrate, a ceramic substrate, a quartz substrate, a sapphire substrate, and the like. The same can be applied to the substrate 541.

The insulating layer 532 serves as a gate insulating film of the transistor 522. In addition, the insulating layer 532 serves as a resistor in the protection circuit. The insulating layer 532 may be formed with a single layer or a stacked layer using one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 532 has a lower resistivity than that of the insulating layer 533.

The insulating layer 533 serves as a gate insulating film of the transistor 522. In addition, the insulating layer 533 can be formed in a way similar to that of the insulating layer 532. The insulating layer 533 preferably has a higher resistivity than that of the insulating layer 532.

The insulating layer 532 is formed with a single layer or a stacked layer using one or more of a silicon nitride oxide film, a silicon nitride film, an aluminum oxide film, and the like, for example. The insulating layer 533 is formed with a single layer or a stacked layer using one or more of a silicon oxide film, a silicon oxynitride film, and the like. For example, a 300-nm-thick silicon nitride film can be used as the insulating layer 532, and a 50-nm-thick silicon oxynitride film can be used as the insulating layer 533.

Note that silicon nitride oxide refers to an insulating material that contains more nitrogen than oxygen, whereas silicon oxynitride refers to an insulating material that contains more oxygen than nitrogen.

The insulating layers 534 to 536 are formed using insulating films of inorganic materials. In particular, preferably, the insulating layer 534 and the insulating layer 535 are oxide films, while the insulating layer 536 is a nitride film. In addition, the use of a nitride insulating film as the insulating layer 536 can inhibit entry of impurities such as hydrogen and water into the semiconductor layer 523 from the outside. Note that the insulating layer 534 is not necessarily provided.

The insulating layer 537 is formed using an insulating film of organic material. In particular, the insulating layer 537 preferably enables a layer or film to be formed thereover to be planarized. Heat-resistant organic materials such as an acrylic-based resin or a polyimide-based resin can be used for the insulating layer 537.

The insulating layer 538 is formed as a passivation film for preventing entry of water or an impurity from the outside. In addition, the insulating layer 538 serves as a dielectric of the capacitor formed in a region where the conductive layer 525 overlaps with the conductive layer 526. Like the insulating layer 536, the insulating layer 538 is preferably an insulating film of a nitride or a nitride oxide and for example, a silicon nitride film or a silicon nitride oxide film can be formed.

The alignment film 539 is preferably a film imparting alignment to liquid crystal molecules in the liquid crystal layer. The same can be applied to the alignment film 545.

The black matrix 542 is formed in a desired position with a known material having a light-blocking property by a printing method, an inkjet method, an etching method using a photolithography technique, or the like, for example.

For the color filter 543, a color filter for transmitting light in a red wavelength range, a color filter for transmitting light in a green wavelength range, a color filter for transmitting light in a blue wavelength range, or the like can be used. Each color filter is formed in a desired position with a known material by a printing method, an inkjet method, an etching method using a photolithography technique, or the like.

The overcoat 544 is a layer that protects the black matrix 542 and the color filter 543. The overcoat 544 can be, for example, an insulating layer of an acrylic-based resin or the like.

In the cross-sectional view of the pixel 518 in FIG. 6B taken along the section line A3-A4, a region where the layers described with reference to FIG. 6A are stacked and the spacer 515 is placed to keep the cell gap is exemplified.

<Configuration of Protection Circuit>

Figure 7A:
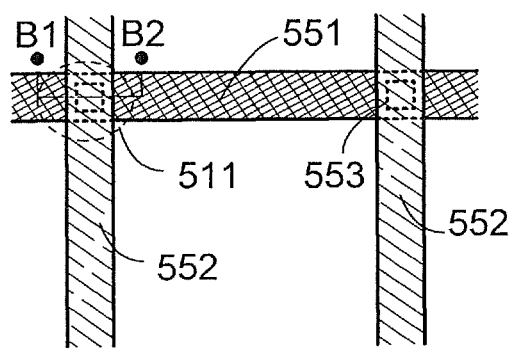
FIGS. 7A and 7B are a plan view and a circuit diagram of a display device.
Figure 7B:
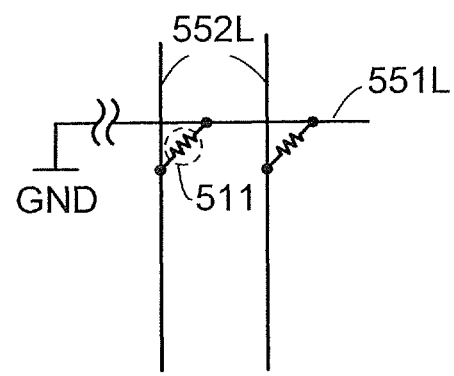

Next, a configuration example of the protection circuit 511 will be described. FIG. 7A is a plan view of a structure example of a pixel, and FIG. 7B is a circuit diagram corresponding to the plan view.

Figure 8:
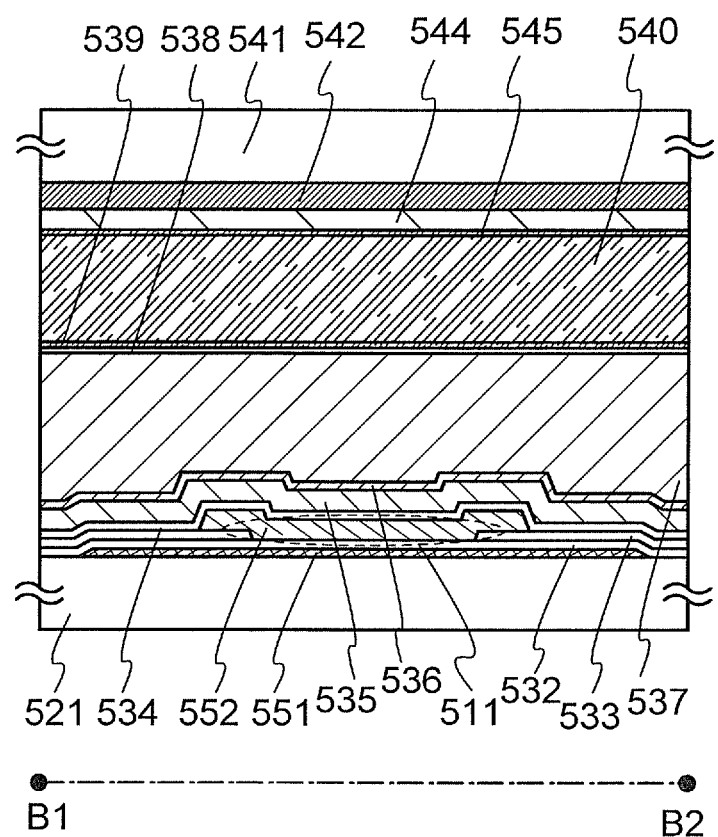
FIG. 8 is a cross-sectional view of a display device.

FIG. 8 is a cross-sectional view taken along the section line B1-B2 in FIG. 7A.

In the plan view of the protection circuit 511 illustrated in FIG. 7A, a layer having a conductive property (hereinafter referred to as a conductive layer 551), a layer having a conductive property (hereinafter referred to as a conductive layer 552), and an opening portion 553 are exemplified.

The conductive layer 551 is a wiring that enables overcurrent due to a surge voltage to be released. The conductive layer 551 is fixed to a ground potential (GND) for example. The conductive layer 551 can be formed in a manner similar to that of the conductive layer 519.

The conductive layer 552 is a wiring serving as a scan line or a signal line. The conductive layer 552 can be formed in a manner similar to that of the conductive layer 520.

The opening portion 553 is formed as follows: of the insulating layer 532 and the insulating layer 533 formed between the conductive layer 551 and the conductive layer 552, a part of the insulating layer 533 is removed.

In other words, the protection circuit 511 illustrated in FIG. 7A has a structure in which the insulating layer 532 is interposed between one pair of electrodes, and the resistivity of the insulating layer 532 is controlled, and thereby when overcurrent flows through one of the pair of electrodes, part or the whole of the overcurrent can be made to flow to the other of the electrodes.

In one embodiment of the present invention, the resistivity of the insulating layer 532 interposed between one pair of electrodes is, for example, $10^{10}$ Ωcm or higher and lower than $10^{18}$ Ωcm, preferably $10^{11}$ Ωcm or higher and lower than $10^{15}$ Ωcm. An insulating film having the range of resistivity is an insulating film containing nitrogen and silicon, for example.

With the protection circuit 511 formed between the conductive layers illustrated in FIG. 7A, the display device can have an enhanced resistance to overcurrent due to ESD. Therefore, the display device with improved reliability can be provided.

In the circuit diagram including the protection circuit 511 in FIG. 7B, a wiring 551L and a wiring 552L are illustrated.

The wiring 551L has a function of allowing overcurrent to be released when a surge voltage is applied to the wiring 552L.

The wiring 552L is a wiring supplied with a signal such as a scan signal or a data signal. In addition, the wiring 552L has a function of allowing overcurrent to flow to the wiring 551L when a surge voltage is applied, and a function of not allowing a signal such as a scan signal or a data signal to be transmitted to the wiring 551L.

The protection circuit 511 is placed between the wiring 551L and the wiring 552L. The protection circuit 511 enables overcurrent resulting from a surge voltage to be released to the wiring 551L that is fixed to the ground potential. In addition, the protection circuit 511 has a resistivity that does not allow a potential of the signal such as a scan signal or a data signal supplied to the wiring 552L to vary.

In the cross-sectional view of the protection circuit 511 in FIG. 8 taken along the section line B1-B2, the substrate 521, the conductive layer 551, the insulating layer 532, the insulating layer 533, the conductive layer 552, the insulating layer 534, the insulating layer 535, the insulating layer 536, the insulating layer 537, the insulating layer 538, the alignment film 539, the liquid crystal layer 540, the substrate 541, the black matrix 542, the overcoat 544, and the alignment film 545 are exemplified.

As described above, in the protection circuit 511, of the insulating layer 532 and the insulating layer 533 formed between the conductive layer 551 and the conductive layer 552, a part of the insulating layer 533 is removed. Thus, by changing the size of the opening portion 553, the resistivity of the insulating layer 532 can be controlled, and thereby when overcurrent flows through one of the pair of electrodes, part or the whole of the overcurrent can be made to flow to the other of the electrodes.

<Structure of Connection Portion>

Figure 9A:
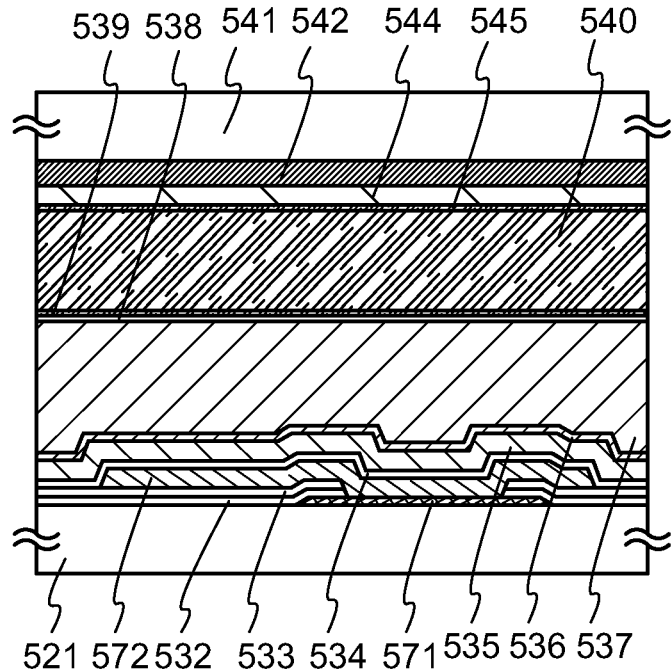
FIGS. 9A and 9B are cross-sectional views of a display device.
Figure 9B:
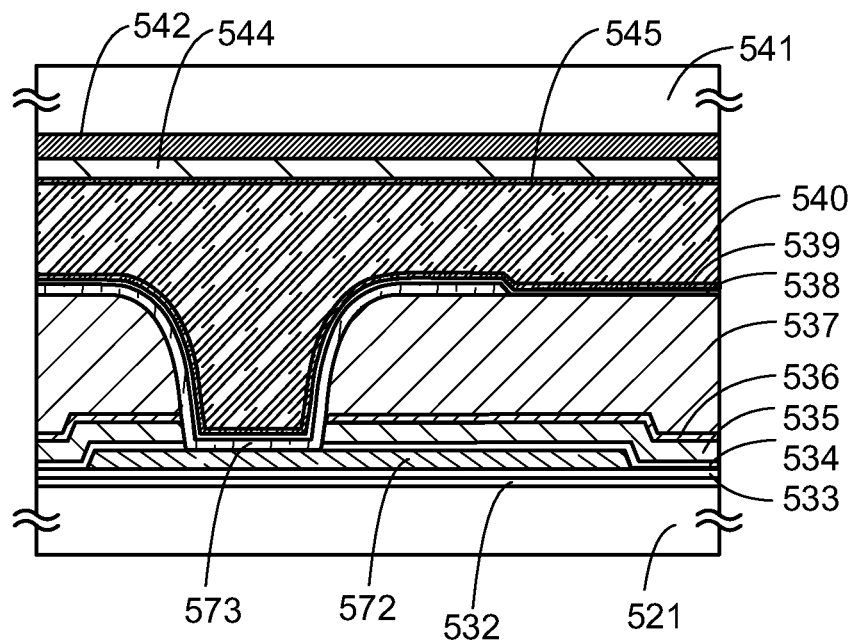

Next, a structure of a connection portion where conductive layers formed in different layers are connected to each other is described. FIG. 9A is a cross-sectional view illustrating an example of a structure of a connection portion where the conductive layer 571 and the conductive layer 572 are connected. In addition, FIG. 9B is a cross-sectional view illustrating an example of a structure of a connection portion where the conductive layer 572 and the conductive layer 573 are connected.

In the cross-sectional view of the connection portion illustrated in FIG. 9A, the substrate 521, the conductive layer 571, the insulating layer 532, the insulating layer 533, the conductive layer 572, the insulating layer 534, the insulating layer 535, the insulating layer 536, the insulating layer 537, the insulating layer 538, the alignment film 539, the liquid crystal layer 540, the substrate 541, the black matrix 542, the overcoat 544, and the alignment film 545 are exemplified.

The conductive layer 571 is formed in the same layer as the conductive layer 519 and the conductive layer 551, and can be formed in a way similar to those of the conductive layer 519 and the conductive layer 551.

The conductive layer 572 is formed in the same layer as the conductive layer 520, the conductive layer 524, and the conductive layer 552 and can be formed in a way similar to those of the conductive layer 520, the conductive layer 524, and the conductive layer 552.

At the connection portion of the conductive layer 571 and the conductive layer 572, the insulating layer 532 and the insulating layer 533 formed between the conductive layer 571 and the conductive layer 572 are removed. Thereby, the conductive layer 571 and the conductive layer 572 can be connected directly with each other.

In the cross-sectional view of the connection portion in FIG. 9B, the substrate 521, the insulating layer 532, the insulating layer 533, the conductive layer 572, the insulating layer 534, the insulating layer 535, the insulating layer 536, the insulating layer 537, the conductive layer 573, the insulating layer 538, the alignment film 539, the liquid crystal layer 540, the substrate 541, the black matrix 542, the overcoat 544, and the alignment film 545 are exemplified.

The conductive layer 573 is formed in the same layer as the conductive layer 525, and can be formed in a way similar to that of the conductive layer 525.

At the connection portion of the conductive layer 573 and the conductive layer 572, the insulating layer 534, the insulating layer 535, the insulating layer 536, and the insulating layer 537 formed between the conductive layer 573 and the conductive layer 572 are removed. Thereby, the conductive layer 573 and the conductive layer 572 can be connected directly with each other.

<Structure of Terminal Portion>

Figure 10:
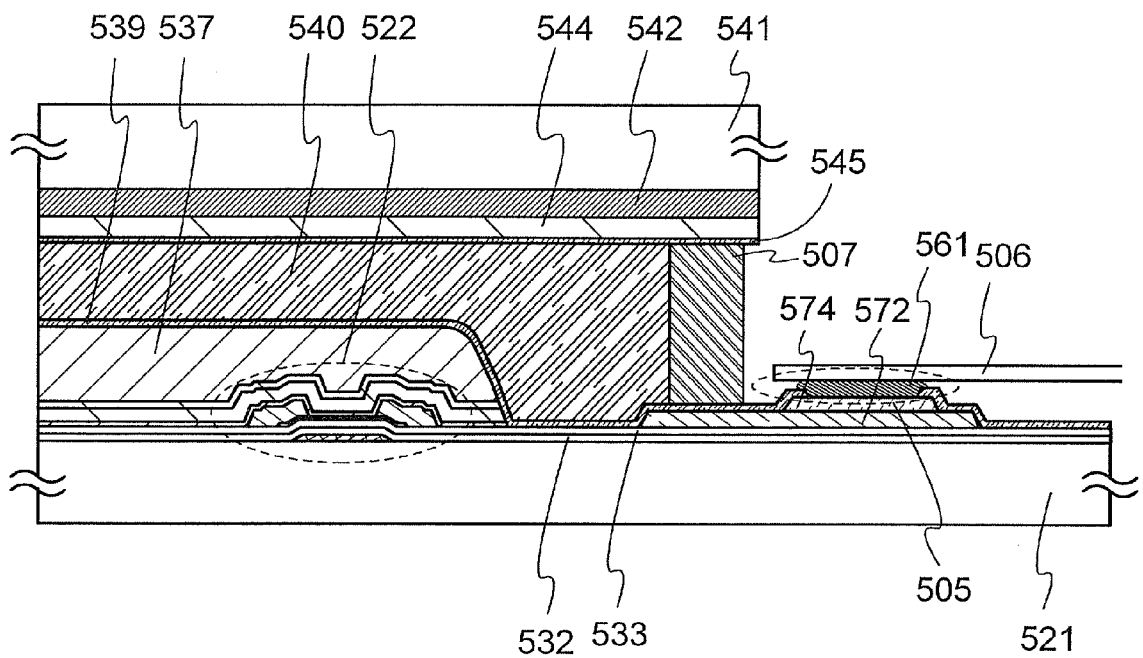
FIG. 10 is a cross-sectional view of a display device.

Next a structural example of the terminal portion 505 will be described. FIG. 10 is a cross-sectional view of a structural example of a connection portion where the terminal portion 505 and the FPC 506 are connected.

In the cross-sectional view of the terminal portion in FIG. 10, the substrate 521, the insulating layer 532, the insulating layer 533, the transistor 522, the conductive layer 572, the conductive layer 574, the insulating layer 537, the alignment film 539, the liquid crystal layer 540, the substrate 541, the black matrix 542, the overcoat 544, the alignment film 545, the conductive layer 561, and the FPC 506 are exemplified.

The conductive layer 574 is formed in the same layer as the conductive layer 526, and can be formed in a way similar to that of the conductive layer 526.

The conductive layer 561 attaches the conductive layer 574 to the FPC 506 to make an electrical conduction state therebetween. The conductive layer 561 can be an anisotropic conductive film as an example. The anisotropic conductive film is one formed by curing a paste-form or sheet-form material that is obtained by mixing conductive particles to a thermosetting resin or a thermosetting and photo-curing resin. The anisotropic conductive film exhibits anisotropic conductivity by light irradiation or thermocompression bonding. As conductive particles used for the anisotropic conductive film, for example, particles of a spherical organic resin coated with thin-film metal such as Au, Ni, Co, or the like can be used.

A part of the alignment film 539 is removed, so that the conductive layer 572 and the conductive layer 574 can be directly connected to each other through the conductive layer 561.

<Method for Fabricating Transistor>

A method for fabricating transistors in a display device, including the transistor 522, is described below.

A method for fabricating the transistor 522 is described with reference to FIGS. 11A to 11D and FIGS. 12A to 12C. FIGS. 11A to 11D and FIGS. 12A to 12C are cross-sectional views illustrating the method for fabricating the transistor 522 in the pixel 518, and transistors included in the gate drivers 502 and 503 and the source driver 504 can also be fabricated over the substrate where the transistor 522 is formed, with the same structures at the same time.

Components in FIGS. 11A to 11D and FIGS. 12A to 12C are described first. With reference to FIGS. 11A to 11D and FIGS. 12A to 12C, a substrate 400, a conductive film 401, a gate electrode 402, a first insulating film 403, a second insulating film 404, an oxide semiconductor film 405, an island-shaped oxide semiconductor layer 406, a conductive film 407, a source electrode 408, a drain electrode 409, an insulating layer 410, an insulating layer 411, and an insulating layer 412 are described in order. Note that the substrate 400 has the same structure as that of the substrate 521 in FIG. 6A; the gate electrode 402 has the same structure as that of the conductive layer 519 in FIG. 6A; the first insulating film 403 has the same structure as that of the insulating layer 532 in FIG. 6A; the second insulating film 404 has the same structure as that of the insulating layer 533 in FIG. 6A; the island-shaped oxide semiconductor layer 406 has the same structure as that of the semiconductor layer 523 in FIG. 6A; the source electrode 408 has the same structure as that of the conductive layer 520 in FIG. 6A; the drain electrode 409 has the same structure as that of the conductive layer 524 in FIG. 6A; the insulating layer 410 has the same structure as that of the insulating layer 534 in FIG. 6A; the insulating layer 411 has the same structure as that of the insulating layer 535 in FIG. 6A; and the insulating layer 412 has the same structure as that of the insulating layer 536 in FIG. 6A.

Figure 11A:
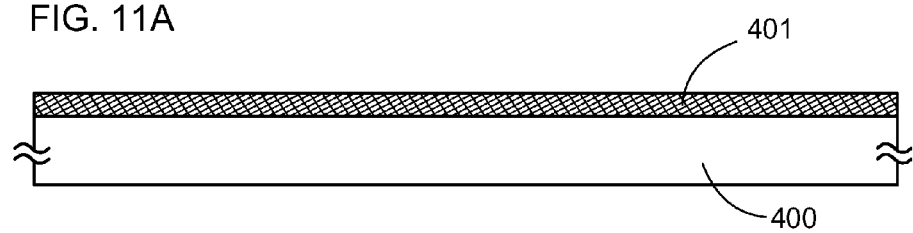
FIGS. 11A to 11D are views illustrating a method for fabricating a transistor.

As illustrated in FIG. 11A, the conductive film 401 serving as a wiring and an electrode in the first layer is formed over the substrate 400.

For example, as the conductive film 401, a film in which a copper film is stacked over a tungsten nitride film or a single layer film of tungsten can be formed.

Figure 11B:
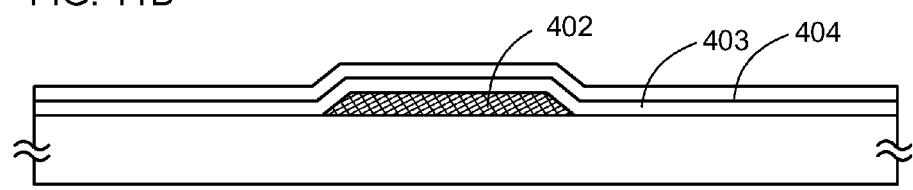

Next, as illustrated in FIG. 11B, the conductive film 401 is processed into the gate electrode 402 of the transistor.

The first insulating film 403 is formed to cover the gate electrode 402. Then, the second insulating film 404 is formed as the second layer over the first insulating film 403.

The first insulating film 403 and the second insulating film 404 serve as gate insulating films of the transistor.

For example, a multilayer film including a silicon nitride film as the first layer and a silicon oxide film as the second layer can be used. The silicon oxide film in the second layer can be replaced with a silicon oxynitride film. The silicon nitride film in the first layer can be replaced with a silicon nitride oxide film.

As the silicon oxide film, a silicon oxide film with a low defect density is preferably used. Specifically, a silicon oxide film which has a spin density of $3 \times 10^{17}$ spins/cm$^3$ or less, preferably $5 \times 10^{16}$ spins/cm$^3$ or less is used. The spin density is obtained by a signal at a g-factor of 2.001 in electron spin resonance (ESR). As the silicon oxide film, a silicon oxide film having excess oxygen is preferably used. As the silicon nitride film, a silicon nitride film from which hydrogen and ammonia are less released is used. The amount of released hydrogen and ammonia can be measured by thermal desorption spectroscopy (TDS) analysis.

The resistivity of the silicon nitride film is preferably $10^{10}$ Ωcm or higher and lower than $10^{18}$ Ωcm, preferably $10^{11}$ Ωcm or higher and lower than $10^{15}$ Ωcm. Thus, the insulating film 403 in the first layer is preferably a silicon nitride film.

Figure 11C:
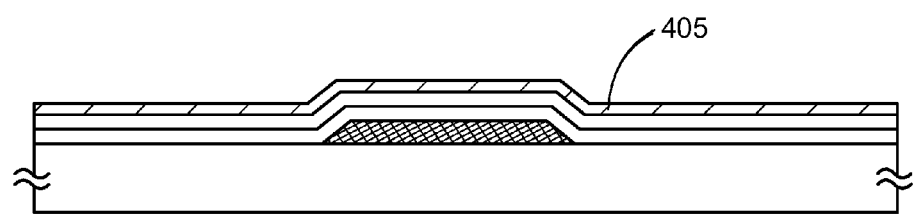

Next, as illustrated in FIG. 11C, the oxide semiconductor film 405 is formed over the second insulating film 404. Here, the oxide semiconductor film 405 is formed using an In—Ga—Zn oxide film by a sputtering method.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio where In:Ga:Zn=1:1:1, In:Ga:Zn=3:1:2, In:Ga:Zn=1:3:2, or In:Ga:Zn=2:1:3, or an oxide whose atomic ratio is in the neighborhood of the above compositions can be used.

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts to the negative side. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For that reason, it is preferable that oxygen be added to the oxide semiconductor film to fill oxygen vacancies in the oxide semiconductor film, which are produced by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by the dehydration treatment (dehydrogenation treatment) and oxygen vacancies therein are repaired by the oxygen-adding treatment, so that the oxide semiconductor film can be an i-type (intrinsic) oxide semiconductor film or an oxide semiconductor film extremely close to an i-type oxide semiconductor (a substantially i-type oxide semiconductor). Note that the substantially i-type oxide semiconductor means that the oxide semiconductor film includes extremely few (close to zero) carriers derived from a donor, and the carrier concentration thereof is lower than or equal to $1 \times 10^{17}$/cm$^3$, lower than or equal to $1 \times 10^{16}$/cm$^3$, lower than or equal to $1 \times 10^{15}$/cm$^3$, lower than or equal to $1 \times 10^{14}$/cm$^3$, or lower than or equal to $1 \times 10^{13}$/cm$^3$.

Thus, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1 \times 10^{-18}$ A, preferably less than or equal to $1 \times 10^{-21}$ A, and further preferably $1 \times 10^{-24}$ A; or at 85° C., less than or equal to $1 \times 10^{-15}$ A, preferably $1 \times 10^{-18}$ A, further preferably less than or equal to $1 \times 10^{-21}$ A. An off state of a transistor refers to a state where gate voltage is much lower than the threshold voltage in an n-channel transistor. Specifically, the transistor is in an off state when the gate voltage is lower than the threshold voltage by 1V or more, 2V or more, or 3V or more.

Further, the oxide semiconductor film can have a non-single-crystalline structure including an amorphous structure, a microcrystalline structure, or a polycrystalline structure, or a single crystalline structure.

As the oxide semiconductor film, a c-axis aligned crystalline oxide semiconductor film (also referred to as CAAC-OS film) having crystal parts can be used.

The CAAC-OS film is not completely single crystal nor completely amorphous. Note that in most cases, such a crystal part in the CAAC-OS film fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor film may be substituted with nitrogen.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Figure 11D:
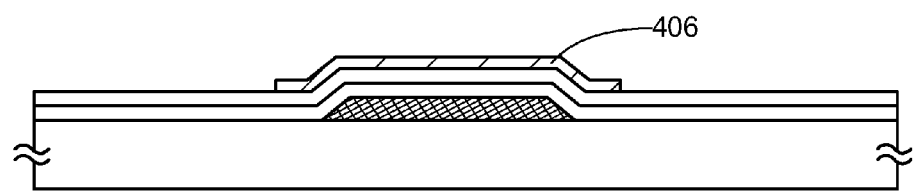

Next, as illustrated in FIG. 11D, the oxide semiconductor film 405 is processed into the island-shaped oxide semiconductor layer 406.

Figure 12A:
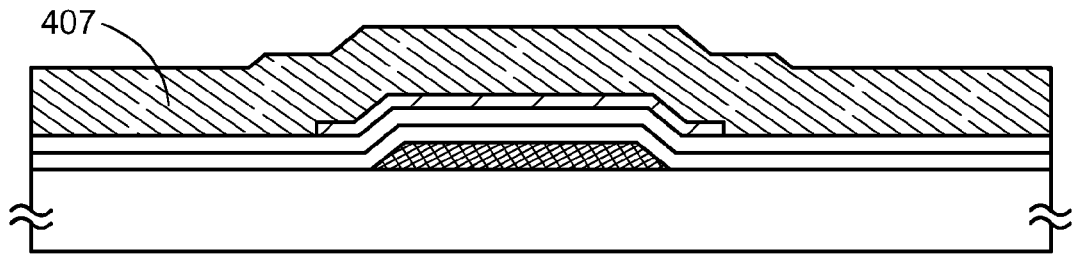
FIGS. 12A to 12C are views illustrating a method for fabricating the transistor.

Then, as illustrated in FIG. 12A, the conductive film 407 serving as source and drain electrodes of the transistor or serving as a data line is formed. The conductive film 407 can be formed in a manner similar to that of the conductive film 401. As an example, a three-layer structure is employed for the conductive film 407. Titanium films are formed as the first and third layers and an aluminum film is formed as the second layer. The titanium films and the aluminum film are formed by a sputtering method.

Figure 12B:
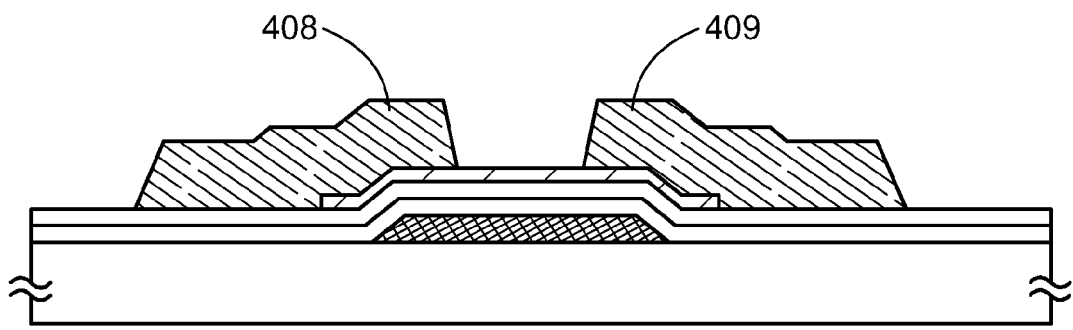

Next, as illustrated in FIG. 12B, the conductive film 407 is processed into the source electrode 408 and the drain electrode 409.

Figure 12C:
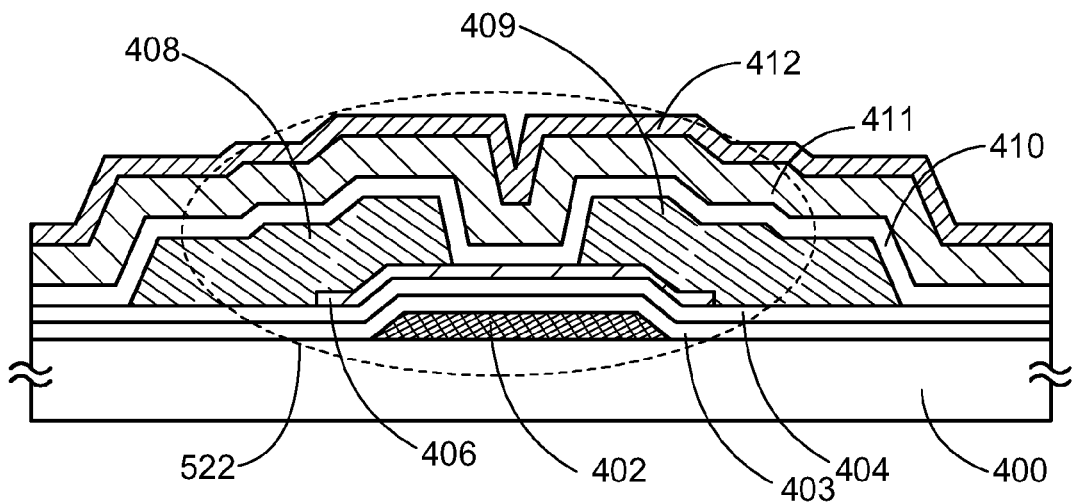

Next, as illustrated in FIG. 12C, the insulating layers 410 to 412 are formed.

Further, in the case where one or both of the insulating layers 410 and 411 is/are oxide film(s), the oxide film in which the oxygen content is higher than that in the stoichiometric composition is preferably used. In that case, oxygen can be prevented from being released from the island-shaped oxide semiconductor layer 406, and the oxygen contained in an oxygen-excess region can be transferred to the oxide semiconductor film to fill oxygen vacancies.

When the insulating layer 411 is an oxide film in which the oxygen content is higher than that in the stoichiometric composition, the insulating layer 410 is preferably an oxide film through which oxygen can pass. Oxygen which enters the insulating layer 411 from the outside partly remains in the insulating layer 411. Further, oxygen that has been originally contained in the insulating layer 411 is released from the insulating layer 411 to the outside in some cases. Thus, the insulating layer 411 is preferably an oxide insulating film having a high coefficient of diffusion of oxygen.

When a nitride insulating film is used as the insulating layer 412, an insulating film having a barrier property against nitrogen is preferably used as one or both of the insulating layer 410 and the insulating layer 411. For example, a dense oxide insulating film can have a barrier property against nitrogen. Specifically, an oxide insulating film whose etching rate is less than or equal to 10 nm per minute with use of 0.5 wt % fluoric acid at 25° C. is preferred.

The insulating layers 410 to 412 can be formed by any of a variety of deposition methods such as a PECVD method and a sputtering method. It is preferable that the insulating layers 410 to 412 be formed in succession in a vacuum. In such a case, entry of impurities into the interfaces between the insulating layer 410, the insulating layer 411, and the insulating layer 412 can be inhibited. In the case where the insulating layer 410 and the insulating layer 411 are formed using the same kind of materials, the interface between the insulating layer 410 and the insulating layer 411 cannot be clearly defined in some cases.

For example, as the insulating layers 410 and 411, a silicon oxide film or a silicon oxynitride film can be formed by a PECVD method under the following formation conditions. The substrate is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into a treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

For example, in the case where a silicon nitride film with a low hydrogen content is formed by a PECVD apparatus as the insulating layer 412, the insulating layer 412 can be formed under the following conditions. The substrate is held at a temperature higher than or equal to 80° C. and lower than or equal to 400° C., preferably higher than or equal to 200° C. and lower than or equal to 370° C., a source gas is introduced into the treatment chamber, the pressure is greater than or equal to 100 Pa and less than or equal to 250 Pa, preferably greater than or equal to 100 Pa and less than or equal to 200 Pa, and high-frequency power is supplied to an electrode provided in the treatment chamber.

Preferably, heat treatment is performed after the insulating layer 411 is formed, so that excess oxygen contained in the insulating layer 410 or the insulating layer 411 is transferred to the island-shaped oxide semiconductor layer 406 to fill oxygen vacancies in the island-shaped oxide semiconductor layer 406. The heat treatment can be performed as heat treatment for dehydration or dehydrogenation of the island-shaped oxide semiconductor layer 406.

That is description of the method for fabricating transistors in the display device, including the transistor 522.

In the description with reference to FIGS. 11A to 11D and FIGS. 12A to 12C, the island-shaped oxide semiconductor layer 406 has a single layer structure, but can be an oxide semiconductor layer having a multilayer structure with two or more layers.

Figure 13A:
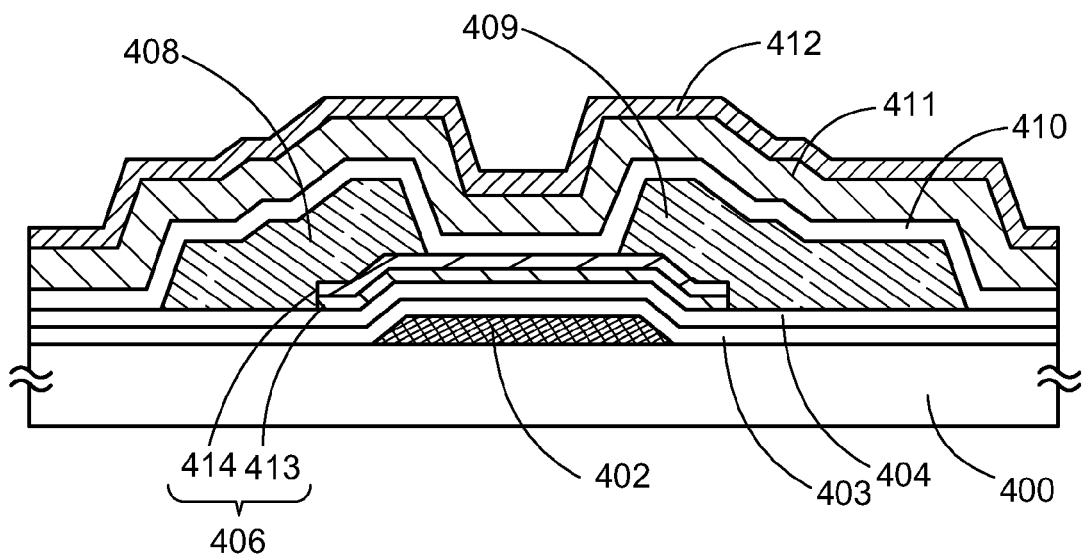
FIGS. 13A and 13B are each a cross-sectional view illustrating a transistor.

For example, as illustrated in FIG. 13A, the island-shaped oxide semiconductor layer 406 can have two layers, an oxide semiconductor layer 413 and oxide semiconductor layer 414.

Figure 13B:
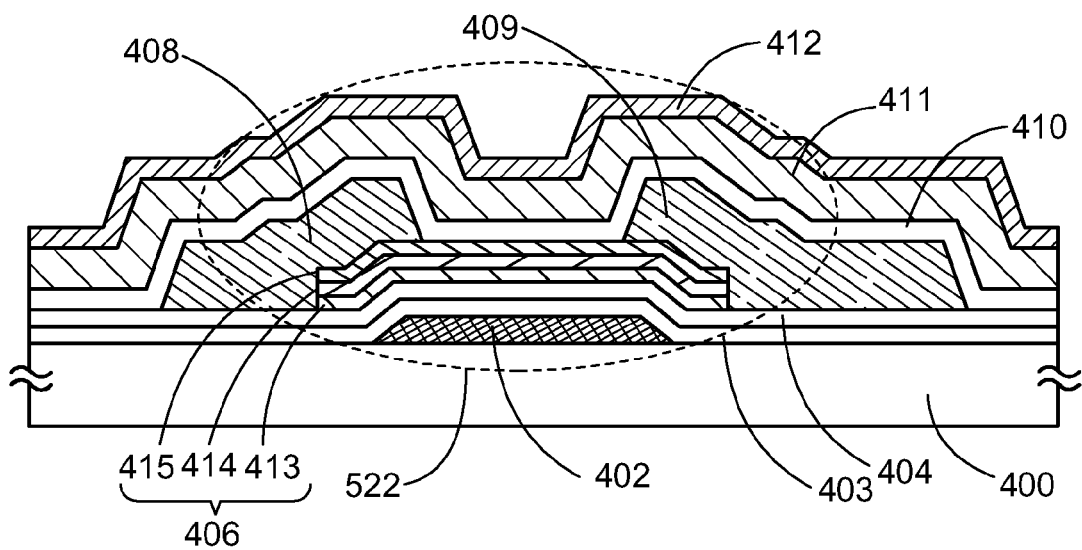

As another example, as illustrated in FIG. 13B, the island-shaped oxide semiconductor layer 406 can have three layers, an oxide semiconductor layer 413, an oxide semiconductor layer 414, and an oxide semiconductor layer 415.

The oxide stacks illustrated in FIGS. 13A and 13B are described in detail with reference to FIGS. 50A to 50C. As the example of the oxide stack, the case where two layers of oxide semiconductor layers are stacked illustrated in FIG. 13A is described. Note that in the description below, the island-shaped oxide semiconductor layer 406 illustrated in FIG. 13A is replaced with an oxide stack 406s and the oxide semiconductor layer 414 is replaced with an oxide layer 414s.

Figure 50A:
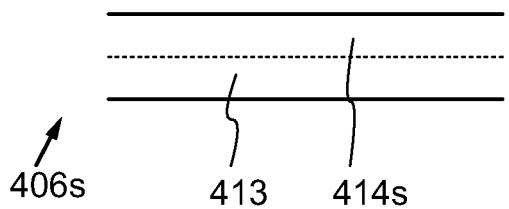
FIGS. 50A to 50C are a cross-sectional view and band diagrams illustrating an oxide stack.

FIG. 50A is an enlarged view of the oxide stack 406s. The oxide stack 406s includes the oxide semiconductor layer 413 and the oxide layer 414s.

The oxide semiconductor layer 413 preferably includes a layer represented by an In-M-Zn oxide that contains at least indium (In), zinc (Zn), and M (M is a metal such as Al, Ga, Ge, Y, Zr, Sn, La, Ce, or Hf).

The oxide layer 414s contains one or more kinds of elements contained in the oxide semiconductor layer 413. The energy at the bottom of the conduction band of the oxide layer 414s is located closer to the vacuum level than that of the oxide semiconductor layer 413 by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the gate electrode 402, a channel is formed in the oxide semiconductor layer 413 in the oxide stack 406s of which energy at the bottom of the conduction band is lowest. In other words, the oxide layer 414s is placed between the oxide semiconductor layer 413 and the insulating layer 410, whereby the channel of the transistor can be formed in the oxide semiconductor layer 413 not in contact with the insulating layer 410. Since the oxide layer 414s contains one or more elements contained in the oxide semiconductor layer 413, interface scattering is unlikely to occur at the interface between the oxide semiconductor layer 413 and the oxide layer 414s. Thus, transfer of carriers is not inhibited between the oxide semiconductor layer 413 and the oxide layer 414s, resulting in an increase in the field-effect mobility of the transistor. Moreover, an interface state is less likely to be produced between the oxide semiconductor layer 413 and the oxide layer 414s. If an interface state is produced between the oxide semiconductor layer 413 and the oxide layer 414s, a second transistor in which the interface between the oxide semiconductor layer 413 and the oxide layer 414s serves as a channel and which has different threshold voltage from the transistor is formed and the apparent threshold voltage of the transistor may vary in some cases. Thus, with the oxide layer 414s, fluctuation in the electrical characteristics of the transistors, such as threshold voltage, can be reduced.

As the oxide layer 414s, an oxide layer that is represented by an In-M-Zn-based oxide (M is a metal such as Al, Ti, Ga, Ge, Y, Zr, Sn, La, Ce, or Hf) and contains a larger amount of M in an atomic ratio than that in the oxide semiconductor layer 413 is used. Specifically, the amount of any of the above elements in the oxide layer 414s in an atomic ratio is one and a half times or more, preferably twice or more, further preferably three times or more as large as that in the oxide semiconductor layer 413 in an atomic ratio. Any of the above elements is more strongly bonded to oxygen than indium is, and thus has a function of suppressing generation of oxygen vacancies in the oxide layer. In other words, the oxide layer 414s is an oxide layer in which oxygen vacancies are less likely to be generated than in the oxide semiconductor layer 413.

That is to say, when each of the oxide semiconductor layer 413 and the oxide layer 414s is an In-M-Zn-based oxide containing at least indium, zinc, and M (M is a metal such as Al, Ti, Ga, Ge, Y, Zr, Sn, La, Ce, or Hf), the oxide layer 414s has an atomic ratio of In to M and Zn which is $x_1:y_1:z_1$, and the oxide layer 414s has an atomic ratio of In to M and Zn which is $x_2:y_2:z_2$, $y_1/x_1$ is preferably larger than $y_2/x_2$. $y_1/x_1$ is one and a half times or more as large as $y_2/x_2$, preferably two times or more, more preferably three times or more as large as $y_2/x_2$. At this time, when $y_2$ is larger than $x_2$ in the oxide semiconductor layer 413, the transistor can have stable electrical characteristics. However, when $y_2$ is three times or more as large as $x_2$, the field-effect mobility of the transistor is reduced; accordingly, $y_2$ is preferably equal to or larger than $x_2$ and smaller than three times $x_2$.

When the oxide semiconductor layer 413 is an In-M-Zn-based oxide, the atomic ratio of In to M is preferably as follows: the proportion of In is higher than or equal to 25 atomic % and the proportion of M is lower than 75 atomic %; more preferably, the proportion of In is higher than or equal to 34 atomic % and the proportion of M is lower than 66 atomic %. When an In-M-Zn-based oxide is used as the oxide layer 414s, the atomic ratio between In to M is preferably as follows: the proportion of In is lower than 50 atomic % and the proportion of M is higher than or equal to 50 atomic %; more preferably, the proportion of In is lower than 25 atomic % and the proportion of M is higher than or equal to 75 atomic %.

For the oxide semiconductor layer 413 and the oxide layer 414s, an oxide semiconductor containing indium, zinc, and gallium can be used. Specifically, the oxide semiconductor layer 413 can be formed using an In—Ga—Zn-based oxide whose atomic ratio of In to Ga and Zn is 1:1:1, an In—Ga—Zn-based oxide whose atomic ratio of In to Ga and Zn is 3:1:2, or an oxide having a composition in the neighborhood of any of the above atomic ratios. The oxide layer 414s can be formed using an In—Ga—Zn-based oxide whose atomic ratio of In to Ga and Zn is 1:3:2, an In—Ga—Zn-based oxide whose atomic ratio of In to Ga and Zn is 1:6:4, an In—Ga—Zn-based oxide whose atomic ratio of In to Ga and Zn is 1:9:6, or an oxide having a composition in the neighborhood of any of the above atomic ratios.

The thickness of the oxide semiconductor layer 413 is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide layer 414s is greater than or equal to 3 nm and less than or equal to 100 nm, preferably greater than or equal to 3 nm and less than or equal to 50 nm.

Next, the band structure of the oxide stack 406s will be described with reference to FIGS. 50B and 50C.

For example, the oxide semiconductor layer 413 is formed using an In—Ga—Zn-based oxide having an energy gap of 3.15 eV, and the oxide layer 414s is formed using an In—Ga—Zn-based oxide having an energy gap of 3.5 eV. The energy gaps are measured using a spectroscopic ellipsometer (UT-300 manufactured by HORIBA JOBIN YVON S.A.S.).

The energy gap between the vacuum level and the top of the valence band (also called ionization potential) of the oxide semiconductor layer 413 and the energy gap therebetween of the oxide layer 414s were 8 eV and 8.2 eV, respectively. Note that the energy gap between the vacuum level and the top of the valence band was measured with an ultraviolet photoelectron spectrometer (UPS) (VersaProbe manufactured by ULVAC-PHI, Inc.).

Thus, the energy gap between the vacuum level and the bottom of the conduction band (also called electron affinity) of the oxide semiconductor layer 413 and the energy gap therebetween of the oxide layer 414s are 4.85 eV and 4.7 eV, respectively.

Figure 50B:
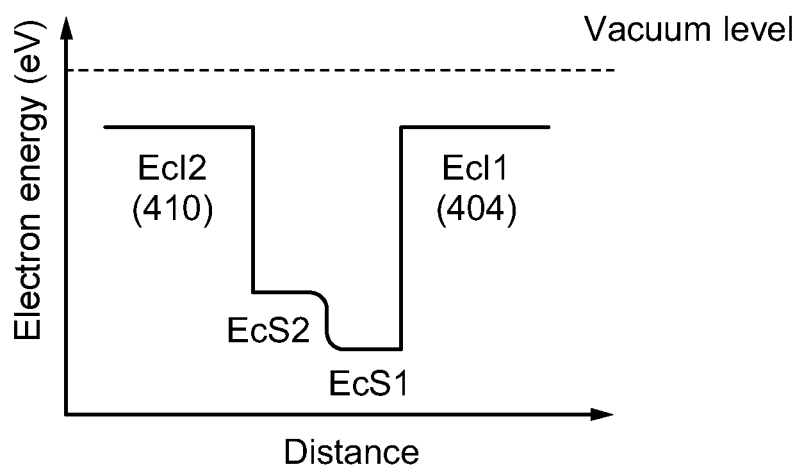

FIG. 50B schematically illustrates a part of the band structure of the oxide stack 406s. Here, a case where silicon oxide films are provided in contact with the oxide stack 406s will be described. In FIG. 50B, EcI1 denotes the energy of the bottom of the conduction band in the silicon oxide film; EcS1 denotes the energy of the bottom of the conduction band in the oxide semiconductor layer 413; EcS2 denotes the energy of the bottom of the conduction band in the oxide layer 414s; and EcI2 denotes the energy of the bottom of the conduction band in the silicon oxide film. Further, EcI1 and EcI2 correspond to the second insulating layer 404 and the insulating layer 410 in FIG. 13A, respectively.

As illustrated in FIG. 50B, there is no barrier at the interface between the oxide semiconductor layer 413 and the oxide layer 414s, and the energy of the bottom of the conduction band is changed smoothly, or continuously. This is because the oxide layer 414s contains an element contained in the oxide semiconductor layer 413 and oxygen is transferred between the oxide semiconductor layer 413 and the oxide layer 414s, so that a mixed layer is formed.

As shown in FIG. 50B, the oxide semiconductor layer 413 in the oxide stack 406s serves as a well and a channel region of the transistor including the oxide stack 406s is formed in the oxide semiconductor layer 413. Note that since the energy of the bottom of the conduction band of the oxide stack 406s is continuously changed, it can be said that the oxide semiconductor layer 413 and the oxide layer 414s make a continuous junction.

Although trap levels due to impurities or defects are likely to be formed in the vicinity of the interface between the oxide layer 414s and the insulating layer 410 as illustrated in FIG. 50B, the oxide semiconductor layer 413 can be distanced from the trap levels owing to existence of the oxide layer 414s. However, when the energy gap between EcS1 and EcS2 is small, an electron in the oxide semiconductor layer 413 might reach the trap level by passing over the energy gap. When the electron is captured by the trap level, a negative fixed charge is generated in the vicinity of the interface with the insulating layer, so that the threshold voltage of the transistor is shifted to the positive side. Therefore, it is preferable that the energy difference between EcS1 and EcS2 be 0.1 eV or more, more preferably 0.15 eV or more because a change in the threshold voltage of the transistor is prevented and stable electrical characteristics are obtained.

Figure 50C:
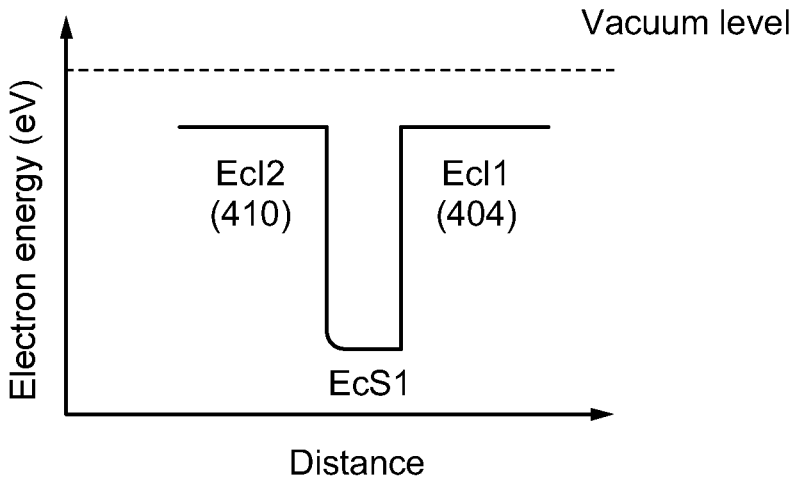

FIG. 50C schematically illustrates a part of the band structure of the oxide stack 406s, which is a modification example of the band structure shown in FIG. 50B. Here, the case where silicon oxide films are provided in contact with the oxide stack 406s will be described. In FIG. 50C, EcI1 denotes the energy of the bottom of the conduction band in the silicon oxide film; EcS1 denotes the energy of the bottom of the conduction band in the oxide semiconductor layer 413; and EcI2 denotes the energy of the bottom of the conduction band in the silicon oxide film. Further, EcI1 corresponds to the second insulating layer 404 in FIG. 13A, and EcI2 corresponds to the insulating layer 410 in FIG. 13A.

In the transistor illustrated in FIG. 13A, an upper portion of the oxide stack 406s, that is, the oxide layer 414s is etched in some cases in formation of the source electrode 408 and the drain electrode 409. However, a mixed layer of the oxide semiconductor layer 413 and the oxide layer 414s is formed on the top surface of the oxide semiconductor layer 413 in some cases in formation of the oxide layer 414s.

For example, when the oxide semiconductor layer 413 is an In—Ga—Zn-based oxide whose atomic ratio of In to Ga and Zn is 1:1:1 or an In—Ga—Zn-based oxide whose atomic ratio of In to Ga and Zn is 3:1:2, and the oxide layer 414s is an In—Ga—Zn-based oxide whose atomic ratio of In to Ga and Zn is 1:3:2 or an In—Ga—Zn-based oxide whose atomic ratio of In to Ga and Zn is 1:6:4, the Ga content in the oxide layer 414s is higher than that in the oxide semiconductor layer 413. Thus, a $GaO_x$ layer or a mixed layer whose Ga content is higher than that in the oxide semiconductor layer 413 is likely to be formed on the top surface of the oxide semiconductor layer 413.

For that reason, even when the oxide layer 414s is etched, the energy of the bottom of the conduction band of EcS1 on the EcI2 side is increased and the band structure shown in FIG. 50C is shown in some cases.

<Method of Forming Pixel Portion, Protection Circuit, and Connection Portion>

Next, with reference to FIGS. 14A to 14C, FIGS. 15A and 15B, FIGS. 16A and 16B, and FIGS. 17A and 17B, a process in which a pixel portion 581, a protection circuit 582, and a connection portion 583 are formed over the substrate 521 is described.

Figure 14A:
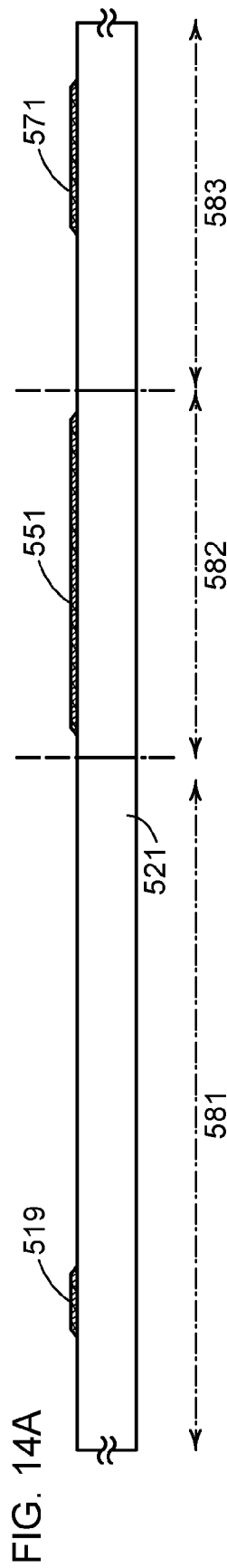
FIGS. 14A to 14C are views illustrating a method of manufacturing a display device.

As illustrated in FIG. 14A, the conductive layer 519, the conductive layer 551, and the conductive layer 571 are formed over the substrate 521 by a photolithography process and an etching process. The conductive layer 519, the conductive layer 551, and the conductive layer 571 are formed as follows: a mask made of a resist (hereinafter referred to as a resist mask) is formed over a conductive film with use of a first photomask and the conductive film is etched, and then the resist mask is removed after the conductive layer 519, the conductive layer 551, and the conductive layer 571 are formed.

Figure 14B:
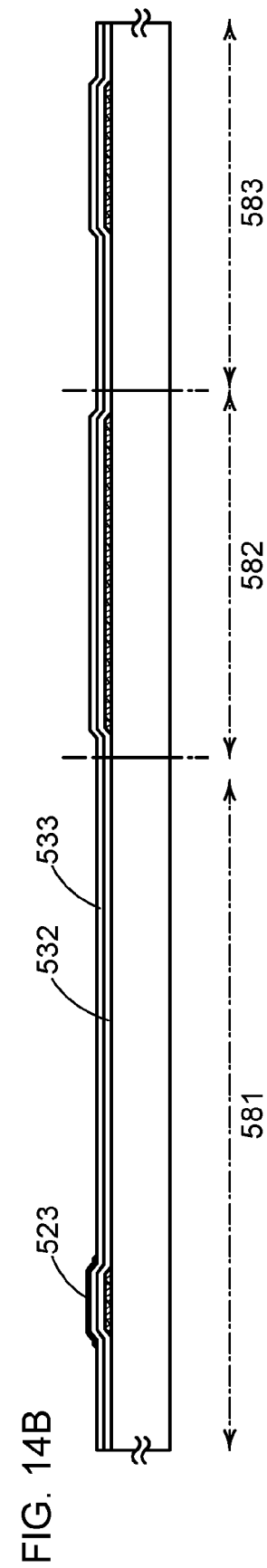

Then, the insulating layer 532 and the insulating layer 533 are formed over the conductive layer 519, the conductive layer 551 and the conductive layer 571. As illustrated in FIG. 14B, the semiconductor layer 523 is formed over the insulating layer 533 by a photolithography process and an etching process. The semiconductor layer 523 is formed as follows: a resist mask is formed over a semiconductor film with use of a second photomask and the semiconductor film is etched, and then the resist mask is removed after the semiconductor layer 523 is formed.

Figure 14C:
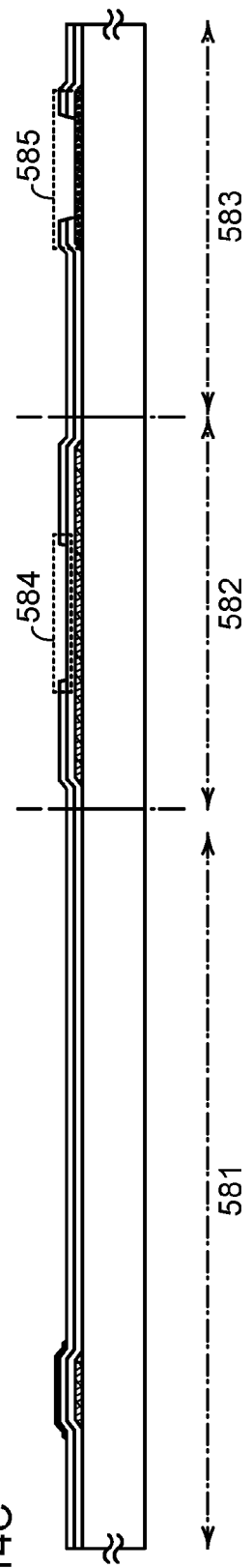

Then an opening portion 584 is formed in the insulating layer 532, and an opening portion 585 is formed in the insulating layer 532 and the insulating layer 533. Specifically, as illustrated in FIG. 14C, by a photolithography process and an etching process, the opening portion 584 in which the insulating layer 532 is left is formed in the protection circuit 582, and the opening portion 585 in which the insulating layer 532 and the insulating layer 533 are removed is formed in the connection portion 583. The opening portion 584 and the opening portion 585 are formed as follows: a resist mask which has different thicknesses is formed over the insulating layer 533 with use of a third photomask, and the insulating layer 533 and/or the insulating layer 532 are/is etched, and then the resist mask is removed after the opening portion 584 and the opening portion 585 are formed.

The mask used in the formation of the opening portion 584 and the opening portion 528 can be a multi-tone mask. The multi-tone mask can perform three levels of light exposure to obtain an exposed portion, a half-exposed portion, and an unexposed portion. The multi-tone mask is a mask through which light is transmitted to have a plurality of intensities. One-time light exposure and development process with use of the multi-tone mask enables a resist mask with regions of plural thicknesses (typically, two kinds of thicknesses) to be formed. Accordingly, by the multi-tone mask, the number of photomasks can be reduced. Examples of the multi-tone mask include a half-tone mask, a gray-tone mask, and the like.

With the use of such a multi-tone mask, the opening portions 584 and 585 can be formed so as to have a depth different from each other. In this manner, the insulating layer 532 is exposed in the opening portion 584, while the conductive layer 519 is exposed in the opening portion 585. Note that the formation method of the opening portions 584 and 585 is not limited to this method, and for example, different masks may be used.

Thus, the insulating layers 532 and 533 formed in the pixel portion 581 can be stacked gate insulating layers. In addition, the insulating layer 532 formed in the protection circuit 582 can function as a resistor. In addition, the insulating layers 532 and 533 in the connection portion 583 can be removed so as to directly connect the conductive layers. In other words, in the display device described in this embodiment, the pixel portion 581, the protection circuit 582, and the connection portion 583 can be formed in the same process. Therefore, the display device can be manufactured without increased manufacturing cost or the like.

Figure 15A:
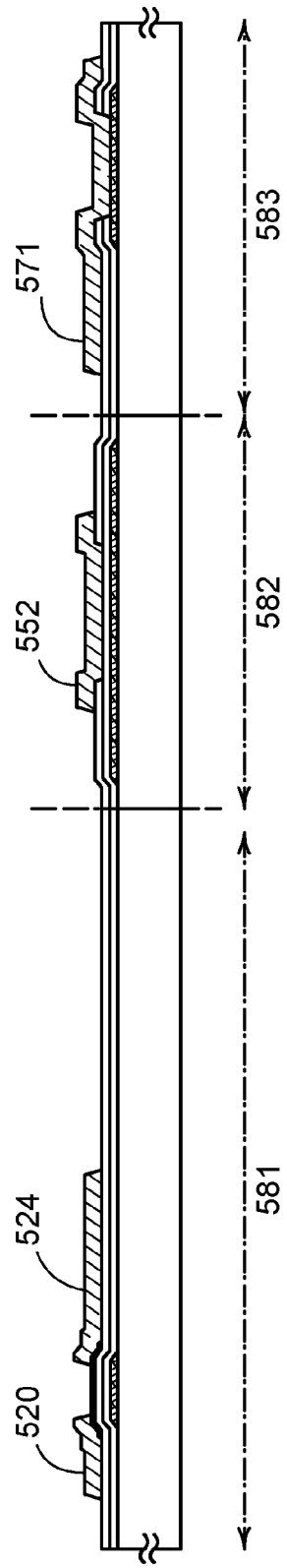
FIGS. 15A and 15B are views illustrating a method of manufacturing a display device.

Next, a conductive film is formed over the semiconductor layer 523, the conductive layer 571, the insulating layer 532, and the insulating layer 533. As illustrated in FIG. 15A, by a photolithography process and an etching process, the conductive layer 520, the conductive layer 524, the conductive layer 552, and the conductive layer 571 are formed over the semiconductor layer 523, the conductive layer 571, the insulating layer 532, and the insulating layer 533. The conductive layer 520, the conductive layer 524, the conductive layer 552, and the conductive layer 571 are formed as follows: a resist mask is formed over the conductive film with use of a fourth photomask and the conductive film is etched, and then the resist mask is removed after the conductive layer 520, the conductive layer 524, the conductive layer 552, and the conductive layer 571 are formed.

Figure 15B:
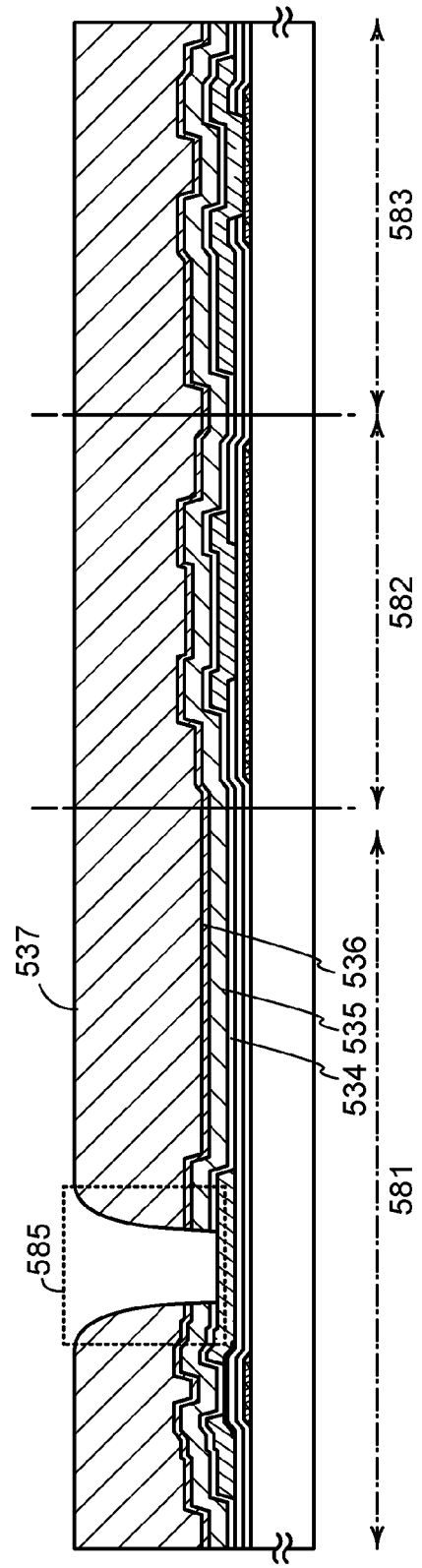

Then, the insulating layer 534, the insulating layer 535, the insulating layer 536, and the insulating layer 537 are formed over the conductive layer 520, the conductive layer 524, the conductive layer 552, the conductive layer 571, and insulating layer 533. As illustrated in FIG. 15B, by a photolithography process and an etching process, in the pixel portion 581, the opening portion 585 that reaches the conductive layer 524 is formed. The opening portion 585 is formed as follows: a resist mask is formed over the insulating layer 537 with use of a fifth photomask, and the insulating layer 534, insulating layer 535, the insulating layer 536, and the insulating layer 537 are etched, and then the resist mask is removed after the opening portion 585 is formed.

Note that although the number of photomasks used is increased by one, the photomask used for formation of the opening portion in the insulating layer 537 may be different from the photomask used for formation of the contact hole in the insulating layer 534, the insulating layer 535, and the insulating layer 536.

Then a conductive film is formed over the conductive layer 524 and the insulating layer 537. As illustrated in FIG. 16A, by a photolithography process and an etching process, the conductive layer 525 is formed over the insulating layer 537. The conductive layer 525 is formed as follows: a resist mask is formed over the conductive film with use of a sixth photomask and the conductive film is etched, and then the resist mask is removed after the conductive layer 525 is formed.

Note that a connection portion may be formed so as to directly connect a conductive layer formed in the same layer as that of the conductive layer 525 and another conductive layer in a layer different from the conductive layer 525 by formation of the conductive layer 525. In this case, an opening portion is preferably formed in advance at a predetermined position with use of the fifth photomask. Alternatively, by formation of the conductive layer 525, a plurality of conductive layers formed in different layers may be directly connected to each other. In this case, with the opening portions formed at the same time with use of the same photomask, different conductive layers can be electrically connected to each other, which leads to reduction in the number of the photomasks used.

Then, the insulating layer 538 is formed over the conductive layer 524, the conductive layer 525, and insulating layer 537. As illustrated in FIG. 16B, by a photolithography process and an etching process, in the pixel portion 581, the opening portion 586 that reaches the conductive layer 524 is formed. The opening portion 586 is formed as follows: a resist mask is formed over the insulating layer 538 with use of a seventh photomask, and the insulating layer 538 is etched, and then the resist mask is removed after the opening portion 586 is formed.

Then a conductive film is formed over the conductive layer 524 and the insulating layer 538. As illustrated in FIG. 17A, by a photolithography process and an etching process, the conductive layer 526 is formed over the conductive layer 524 and the insulating layer 538. The conductive layer 526 is formed as follows: a resist mask is formed over the conductive film with use of an eighth photomask and the conductive film is etched, and then the resist mask is removed after the conductive layer 526 is formed.

Note that a connection portion may be formed so as to directly connect a conductive layer formed in the same layer as that of the conductive layer 526 and another conductive layer in a layer different from the conductive layer 526 by formation of the conductive layer 526. In this case, an opening portion is preferably formed in advance at a predetermined position with use of the seventh photomask. Alternatively, by formation of the conductive layer 526, a plurality of conductive layers formed in different layers may be directly connected to each other. In this case, with the opening portions formed at the same time with use of the same photomask, different conductive layers can be electrically connected to each other, which leads to reduction in the number of the photomasks used.

As illustrated in FIG. 17B, the alignment film 539 is formed over the conductive layer 526 and the insulating layer 538. The alignment film 539 can be formed as follows: a polyimide resin is applied on the conductive layer 526 and the insulating layer 538 by a printing method or the like, and baked, and then alignment treatment is performed on the alignment film 539 through rubbing or irradiation with light.

Although not illustrated, a spacer is formed over the alignment film 539 to maintain a cell gap. The spacer is formed as follows: a photosensitive curable resin is applied on the alignment film 539, exposed to light through a ninth photomask, and developed, and then the spacer made of the resin is formed in each pixel.

Next, a structure formed over the substrate 541 that is opposite to the substrate 521 is described simply, although not illustrated.

The black matrix 542, the color filter 543, the overcoat 544 are formed over the substrate 541. Note that the black matrix 542 and the color filter 543 can be formed on the substrate 521 side. The overcoat 544 is provided with the alignment film 545.

Then, the liquid crystal layer 540 is formed between the substrate 521 and the substrate 541. The liquid crystal layer 540 can be formed by a dispenser method (a dropping method), or an injecting method by which a liquid crystal is injected using a capillary phenomenon after the substrate 521 and the substrate 541 are bonded to each other.

Through the cell process described above, the liquid crystal panel in which the liquid crystal layer 540 is sealed in is manufactured.

This embodiment can be combined with another embodiment in this specification as appropriate.

Embodiment 3

In this embodiment, variations of the components in the transverse electric field mode liquid crystal display device described in Embodiment 2 will be described.
<Variation of Pixel Structure>

Figure 18:
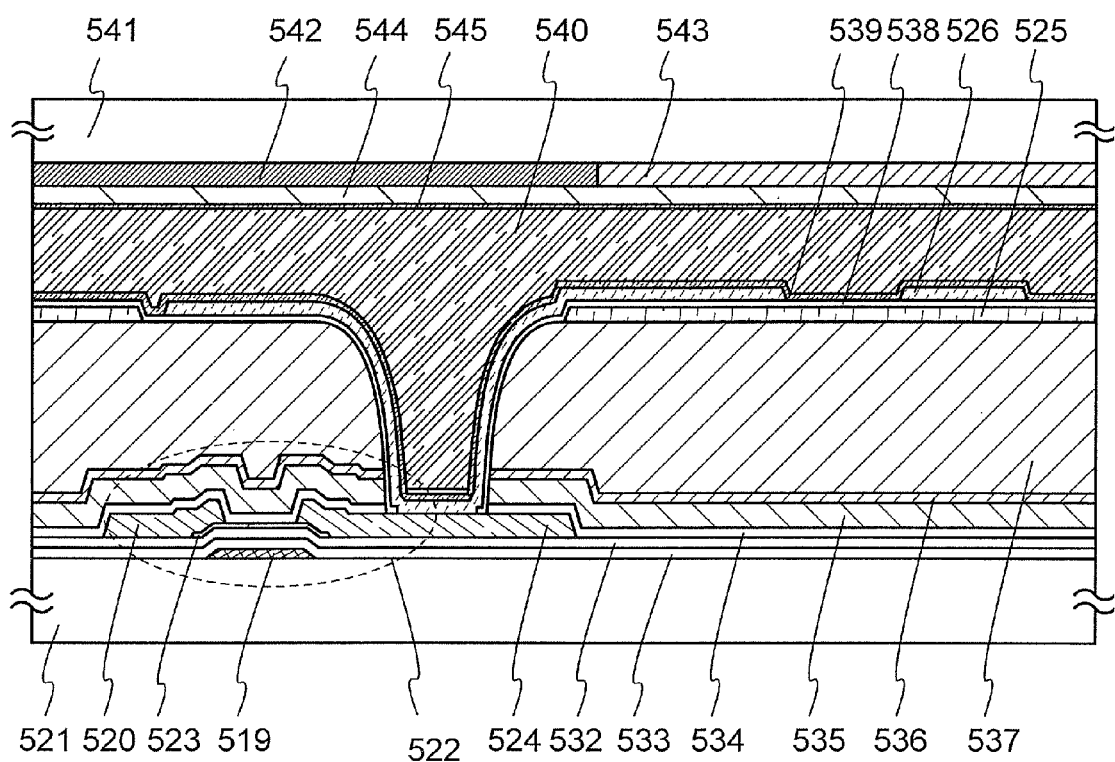
FIG. 18 is a cross-sectional view of a display device.

The conductive layer 526 may overlap with the transistor 522 as illustrated in FIG. 18.
<Variation of Protection Circuit>

Figure 19A:
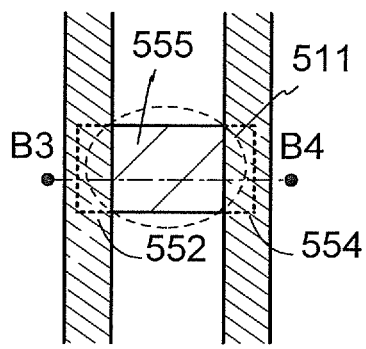
FIGS. 19A and 19B are a plan view and a cross-sectional view of a display device.
Figure 19B:
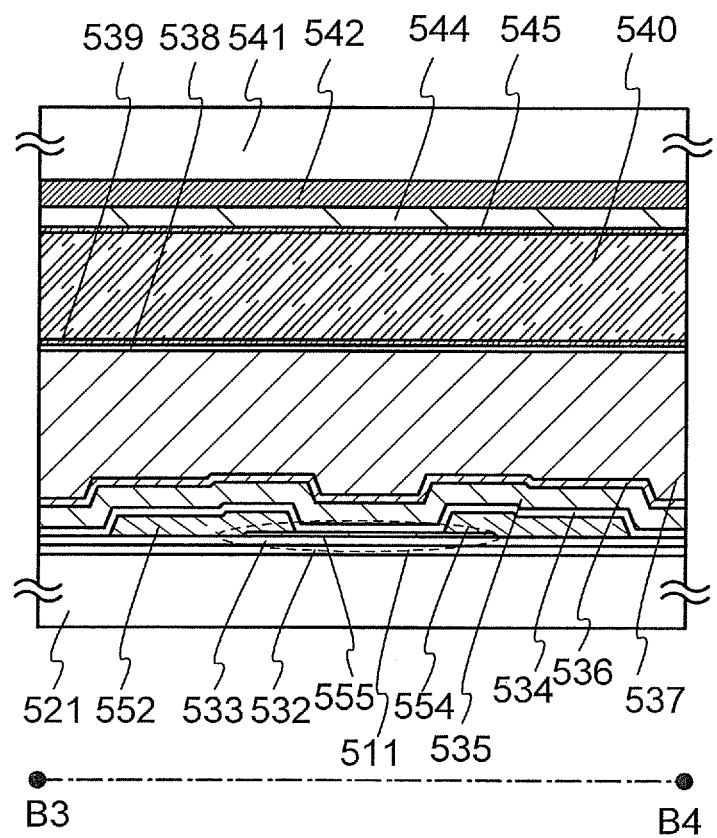

A variation of the protection circuit 511 is described next. FIG. 19A is a plan view illustrating a structural example of the protection circuit and FIG. 19B is a cross-sectional view taken along the section line B3-B4 in FIG. 19A.

In the plan view of the protection circuit 511 illustrated in FIG. 19A, the conductive layer 552, a layer having a conductive property (hereinafter referred to as a conductive layer 554), and a semiconductor layer 555 are exemplified.

The conductive layer 554 is a wiring that enables overcurrent due to a surge voltage to be released. The conductive layer 554 is fixed to a ground potential (GND) for example. The conductive layer 554 can be formed in a manner similar to that of the conductive layer 520.

The semiconductor layer 555 is a layer with semiconductor characteristics. The semiconductor layer 555 can be formed in a manner similar to that of the semiconductor layer 523.

In other words, the protection circuit 511 illustrated in FIG. 19A has a structure in which the semiconductor layer 555 is interposed between one pair of electrodes, and the resistivity of the semiconductor layer 555 is controlled, and thereby when overcurrent flows through one of the pair of electrodes, part or the whole of the overcurrent can made to flow to the other of the electrodes.

With the protection circuit 511 illustrated in FIG. 19A, the pixel portion 501, the gate drivers 502 and 503 and the source driver 504 can have an enhanced resistance to overcurrent due to ESD. Therefore, a display device with improved reliability can be provided.

In the cross-sectional view of the protection circuit 511 illustrated in FIG. 19B, taken along the line B3-B4, the substrate 521, the insulating layer 532, the insulating layer 533, the semiconductor layer 555, the conductive layer 552, the conductive layer 554, the insulating layer 534, the insulating layer 535, the insulating layer 536, the insulating layer 537, the insulating layer 538, the alignment film 539, the liquid crystal layer 540, the substrate 541, the black matrix 542, the overcoat 544, and the alignment film 545 are exemplified.

As described above, the semiconductor layer 555 is placed between the conductive layer 552 and the conductive layer 554 in the protection circuit 511. The pixel portion 501, the gate drivers 502 and 503 and the source driver 504 can have an enhanced resistance to overcurrent due to ESD. Therefore, a display device with improved reliability can be provided.

Figure 20A:
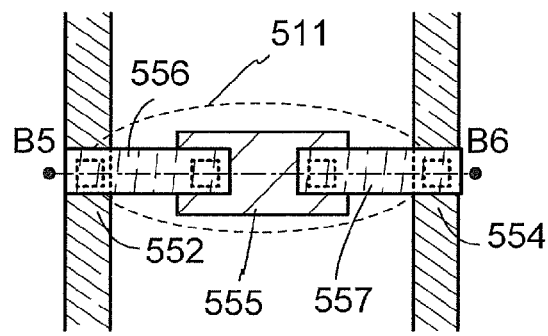
FIGS. 20A and 20B are a plan view and a cross-sectional view of a display device.
Figure 20B:
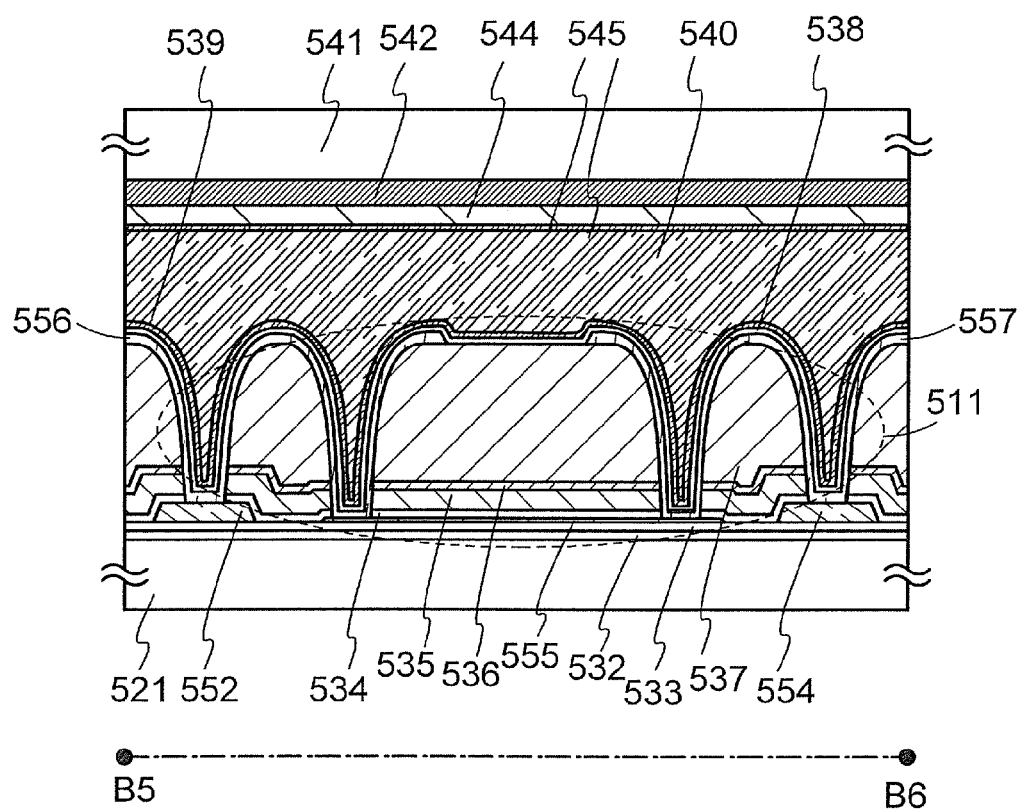

Another variation of the protection circuit 511 is described next. FIG. 20A is a plan view illustrating a structural example of the protection circuit and FIG. 20B is a cross-sectional view taken along the section line B5-B6 in FIG. 20A.

In the plan view of the protection circuit 511 illustrated in FIG. 20A, the conductive layer 552, the conductive layer 554, the semiconductor layer 555, a conductive layer 556, and a conductive layer 557 are exemplified.

The conductive layer 556 serves as a wiring that connect the conductive layer 552 to the semiconductor layer 555 and the conductive layer 557 serve as a wiring that connects the conductive layer 554 to the semiconductor layer 555. The conductive layer 556 and the conductive layer 557 can be formed in a manner similar to that of the conductive layer 525.

In other words, the protection circuit 511 illustrated in FIG. 20A has a structure in which the conductive layer 556, the semiconductor layer 555, and the conductive layer 557 are interposed between one pair of electrodes, and the resistivity of the semiconductor layer 555 is controlled, and thereby when overcurrent flows through one of the pair of electrodes, part or the whole of the overcurrent can be made to flow to the other of the electrodes.

With the protection circuit 511 illustrated in FIG. 20A, the pixel portion 501, the gate drivers 502 and 503, and the source driver 504 can have an enhanced resistance to overcurrent due to ESD. Therefore, a display device with improved reliability can be provided.

In the cross-sectional view of the protection circuit 511 illustrated in FIG. 20B, taken along the section line B5-B6, the substrate 521, the insulating layer 532, the insulating layer 533, the semiconductor layer 555, the conductive layer 552, the conductive layer 554, the insulating layer 534, the insulating layer 535, the insulating layer 536, the insulating layer 537, the conductive layer 556, the conductive layer 557, the insulating layer 538, the alignment film 539, the liquid crystal layer 540, the substrate 541, the black matrix 542, the overcoat 544, and the alignment film 545 are exemplified.

As described above, the conductive layer 556, the conductive layer 557, and the semiconductor layer 555 are placed between the conductive layer 552 and the conductive layer 554 in the protection circuit 511. The pixel portion 501, the gate drivers 502 and 503, and the source driver 504 can have an enhanced resistance to overcurrent due to ESD. Therefore, a display device with improved reliability can be provided.

Figure 21A:
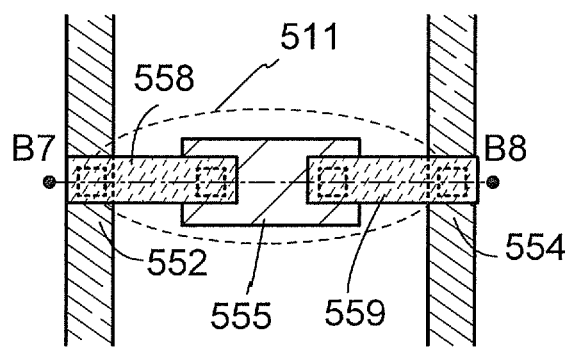
FIGS. 21A and 21B are a plan view and a cross-sectional view of a display device.
Figure 21B:
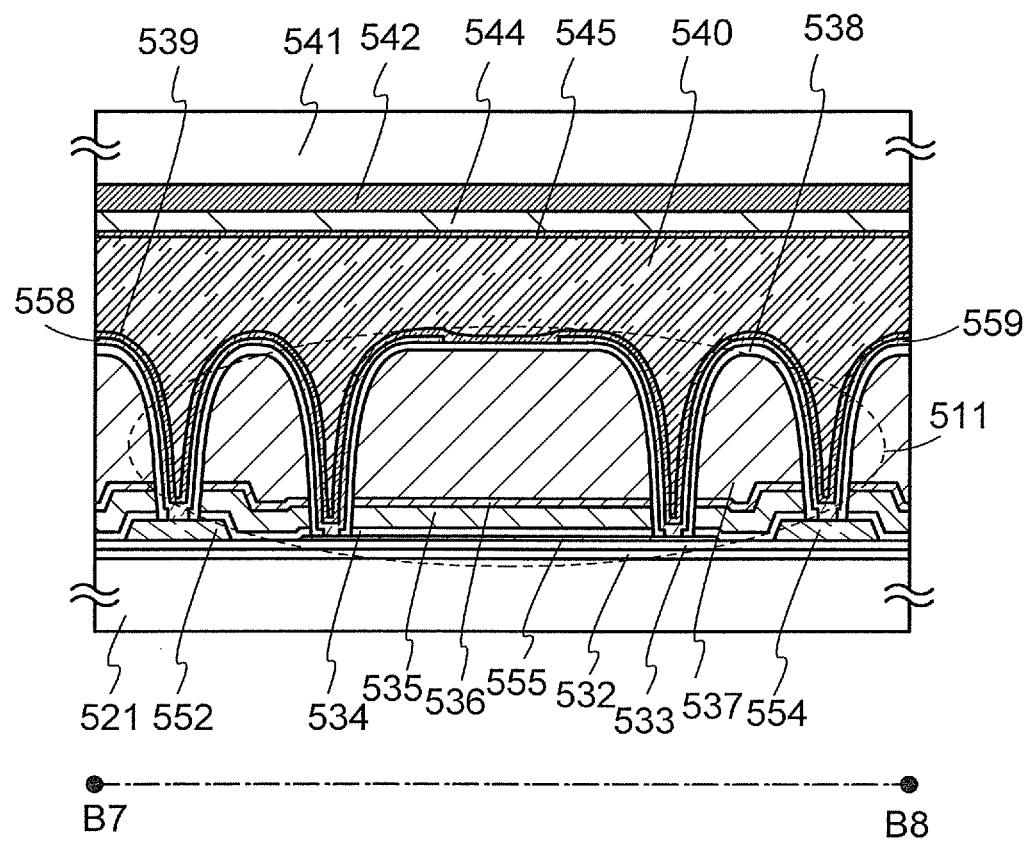

Another variation of the protection circuit 511 is described next. FIG. 21A is a plan view illustrating a structural example of the protection circuit and FIG. 21B is a cross-sectional view taken along the section line B7-B8 in FIG. 21A.

In the plan view of the protection circuit 511 illustrated in FIG. 21A, the conductive layer 552, the conductive layer 554, the semiconductor layer 555, a conductive layer 558, and a conductive layer 559 are exemplified.

The conductive layer 558 serves as a wiring that connects the conductive layer 552 to the semiconductor layer 555 and the conductive layer 559 serve as a wiring that connects the conductive layer 554 to the semiconductor layer 555. The conductive layer 558 and the conductive layer 559 can be formed in a manner similar to that of the conductive layer 526.

In other words, the protection circuit 511 illustrated in FIG. 21A has a structure in which the conductive layer 558, the semiconductor layer 555 and the conductive layer 559 are interposed between one pair of electrodes, and the resistivity of the semiconductor layer 555 is controlled, and thereby when overcurrent flows through one of the pair of electrodes, part or the whole of the overcurrent can be made to flow to the other of the electrodes.

With the protection circuit 511 illustrated in FIG. 21A, the pixel portion 501, the gate drivers 502 and 503 and the source driver 504 can have an enhanced resistance to overcurrent due to ESD. Therefore, a display device with improved reliability can be provided.

In the cross-sectional view of the protection circuit 511 illustrated in FIG. 21B, taken along the section line B7-B8, the substrate 521, the insulating layer 532, the insulating layer 533, the semiconductor layer 555, the conductive layer 552, the conductive layer 554, the insulating layer 534, the insulating layer 535, the insulating layer 536, the insulating layer 537, the conductive layer 558, the conductive layer 559, the insulating layer 538, the alignment film 539, the liquid crystal layer 540, the substrate 541, the black matrix 542, the overcoat 544, and the alignment film 545 are exemplified.

As described above, the conductive layer 558, the conductive layer 559, and the semiconductor layer 555 are placed between the conductive layer 552 and the conductive layer 554 in the protection circuit 511. The pixel portion 501, the gate drivers 502 and 503, and the source driver 504 can have an enhanced resistance to overcurrent due to ESD. Therefore, a display device with improved reliability can be provided.

Figure 22A:
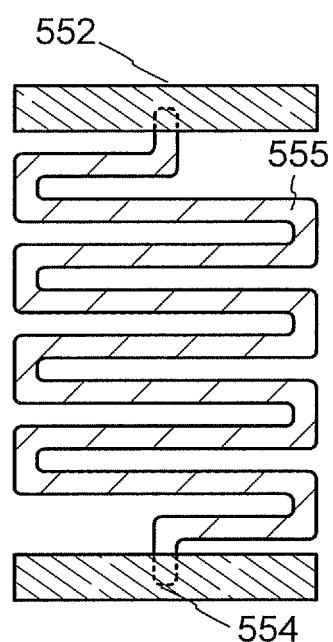
FIGS. 22A and 22B are each a plan view of a display device.
Figure 22B:
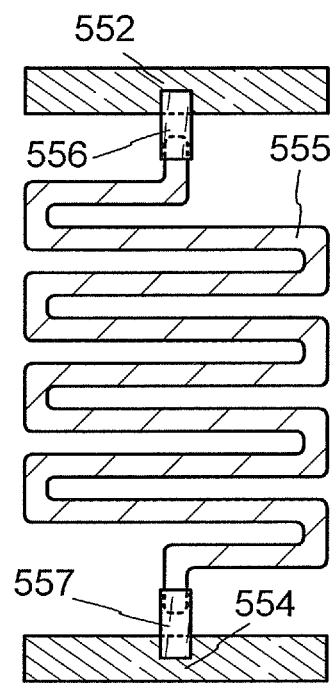

The shape of the semiconductor layer in each of the plan views of the protection circuits illustrated in FIG. 19A, FIG. 20A, and FIG. 21A can be a meander shape as illustrated in FIG. 22A or FIG. 22B.

Figure 23A:
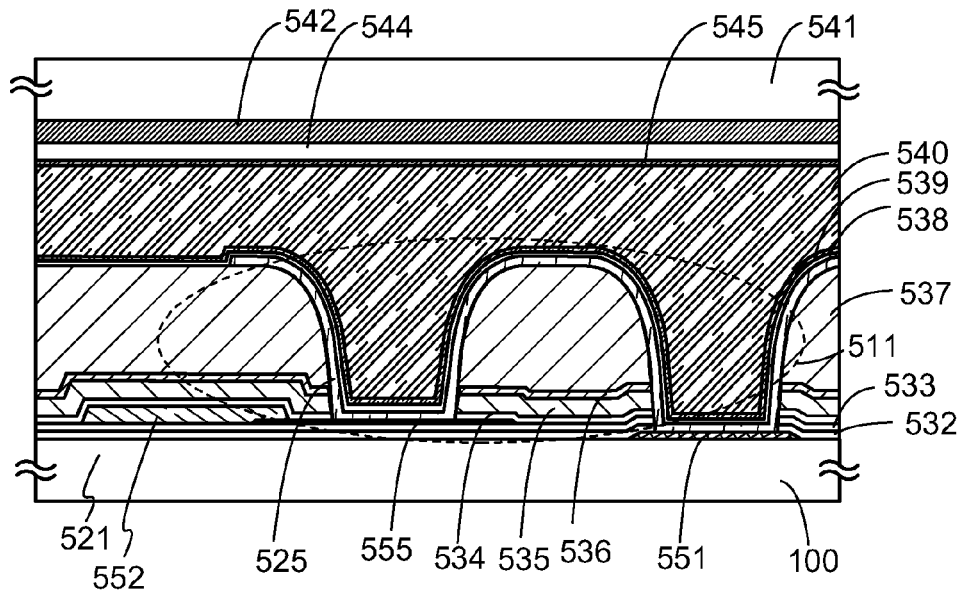
FIGS. 23A and 23B are each a cross-sectional view of a display device.
Figure 23B:
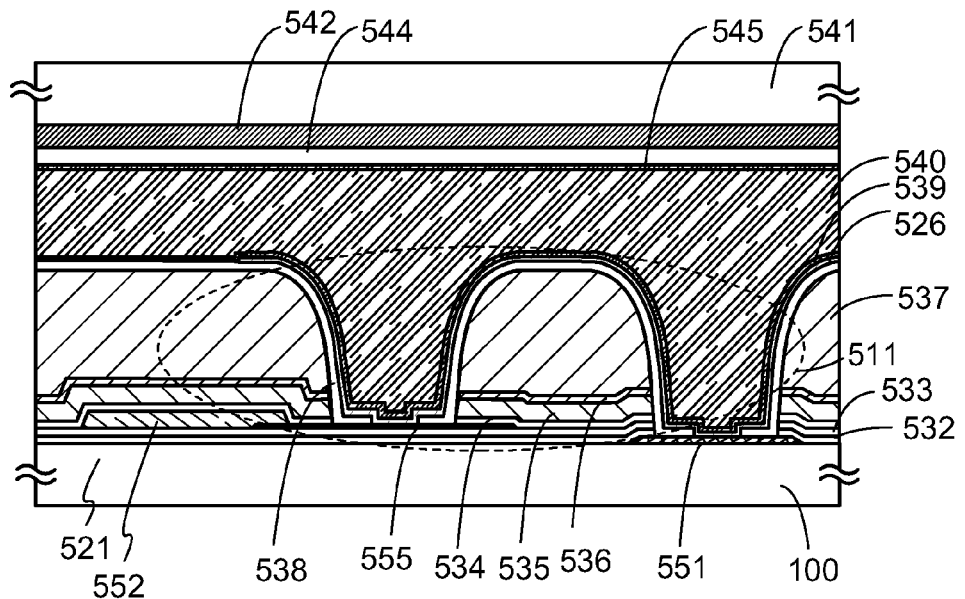

Another structural example of the protection circuit 511 is described next. FIGS. 23A and 23B are cross-sectional views of structural examples of protection circuits.

In the cross-sectional view of the protection circuit 511 illustrated in FIG. 23A, the substrate 521, the insulating layer 532, the insulating layer 533, the conductive layer 551, the conductive layer 552, the semiconductor layer 555, the insulating layer 534, the insulating layer 535, the insulating layer 536, the insulating layer 537, the conductive layer 525, the conductive layer 558, the conductive layer 559, the insulating layer 538, the alignment film 539, the liquid crystal layer 540, the substrate 541, the black matrix 542, the overcoat 544, and the alignment film 545 are exemplified.

As described above, the conductive layer 525 and the semiconductor layer 555 are placed between the conductive layer 552 and the conductive layer 551 in the protection circuit 511. The pixel portion 501, the gate drivers 502 and 503, and the source driver 504 can have an enhanced resistance to overcurrent due to ESD. Therefore, a display device with improved reliability can be provided.

In the cross-sectional view of the protection circuit 511 illustrated in FIG. 23B, the substrate 521, the insulating layer 532, the insulating layer 533, the conductive layer 551, the conductive layer 552, the semiconductor layer 555, the insulating layer 534, the insulating layer 535, the insulating layer 536, the insulating layer 537, the conductive layer 526, the conductive layer 558, the conductive layer 559, the insulating layer 538, the alignment film 539, the liquid crystal layer 540, the substrate 541, the black matrix 542, the overcoat 544, and the alignment film 545 are exemplified.

As described above, the conductive layer 526 and the semiconductor layer 555 are placed between the conductive layer 552 and the conductive layer 551 in the protection circuit 511. The pixel portion 501, the gate drivers 502 and 503, and the source driver 504 can have an enhanced resistance to overcurrent due to ESD. Therefore, a display device with improved reliability can be provided.

Figure 24A:
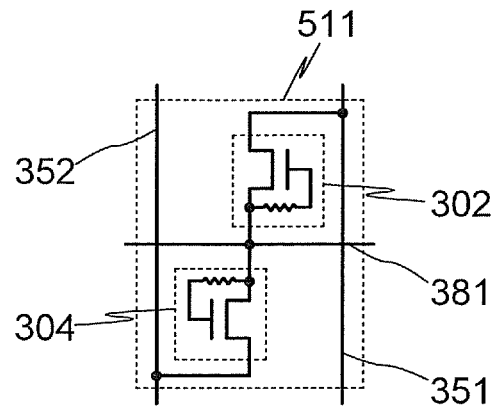
FIGS. 24A to 24C are each a circuit diagram of a display device.
Figure 24B:
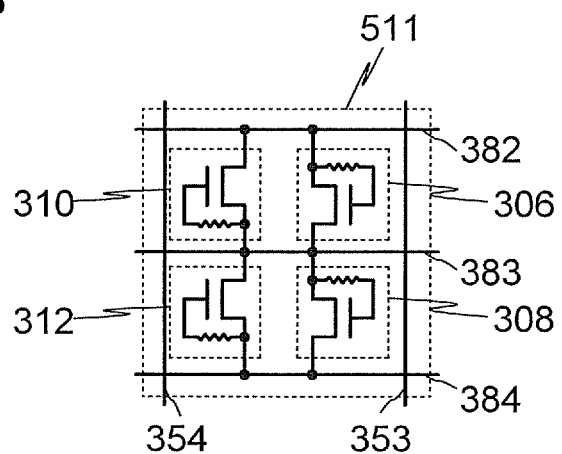
Figure 24C:
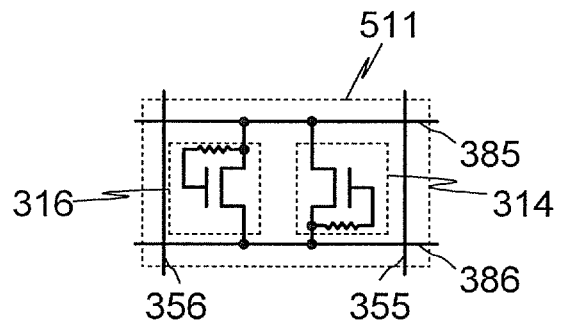

Further, FIGS. 24A, 24B, and 24C exemplify circuit configurations that can be used as the protection circuit 511.

The circuit configuration in FIG. 24A includes wirings 351, 352, and 381 and transistors 302 and 304.

A first terminal serving as a source electrode of the transistor 302 is connected to a second terminal serving as a gate electrode of the transistor 302, and a third terminal serving as a drain electrode of the transistor 302 is connected to the wiring 351. The first terminal of the transistor 302 is also connected to the wiring 381. Similarly, a first terminal serving as a source electrode of the transistor 304 is connected to a second terminal serving as a gate electrode of the transistor 304, and a third terminal serving as a drain electrode of the transistor 304 is connected to the wiring 352. The first terminal of the transistor 304 is also connected to the wiring 381.

The circuit configuration in FIG. 24B includes wirings 353, 354, 382, 383, and 384 and transistors 306, 308, 310, and 312.

A first terminal serving as a source electrode of the transistor 306 is connected to a second terminal serving as a gate electrode of the transistor 306, and a third terminal serving as a drain electrode of the transistor 306 is connected to the wiring 383. The first terminal of the transistor 306 is also connected to the wiring 382.

A first terminal serving as a source electrode of the transistor 308 is connected to a second terminal serving as a gate electrode of the transistor 308, and a third terminal serving as a drain electrode of the transistor 308 is connected to the wiring 384. The first terminal of the transistor 308 is also connected to the wiring 383.

A first terminal serving as a source electrode of the transistor 310 is connected to a second terminal serving as a gate electrode of the transistor 310, and a third terminal serving as a drain electrode of the transistor 310 is connected to the wiring 382. The first terminal of the transistor 310 is also connected to the wiring 383.

A first terminal serving as a source electrode of the transistor 312 is connected to a second terminal serving as a gate electrode of the transistor 312, and a third terminal serving as a drain electrode of the transistor 312 is connected to the wiring 383. The first terminal of the transistor 312 is also connected to the wiring 384.

The circuit configuration in FIG. 24C includes wirings 355, 356, 385, and 386 and transistors 314 and 316.

A first terminal serving as a source electrode of the transistor 314 is connected to a second terminal serving as a gate electrode of the transistor 314, and a third terminal serving as a drain electrode of the transistor 314 is connected to the wiring 385. The first terminal of the transistor 314 is also connected to the wiring 386.

A first terminal serving as a source electrode of the transistor 316 is connected to a second terminal serving as a gate electrode of the transistor 316, and a third terminal serving as a drain electrode of the transistor 316 is connected to the wiring 386. The first terminal of the transistor 316 is also connected to the wiring 385.

The protection circuit 511 that can be used in one embodiment of the present invention can employ diode-connected transistors as illustrated in the circuit configurations in FIGS. 24A, 24B, and 24C.

Figure 25A:
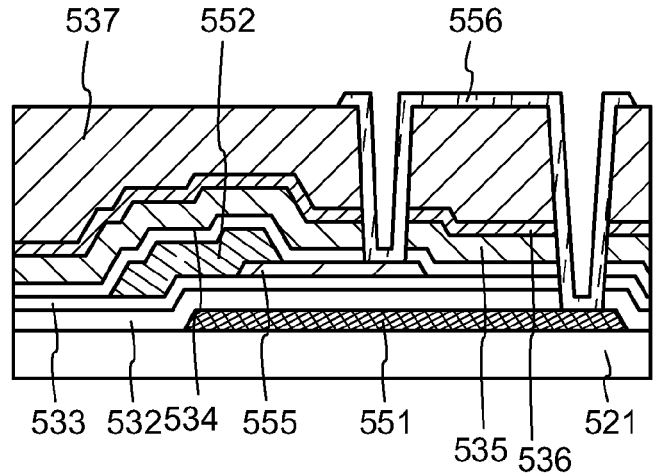
FIGS. 25A to 25C are each a cross-sectional view of a display device.
Figure 25B:
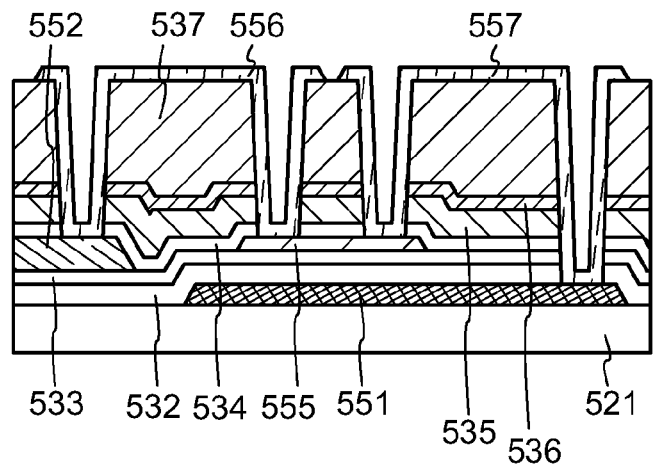
Figure 25C:
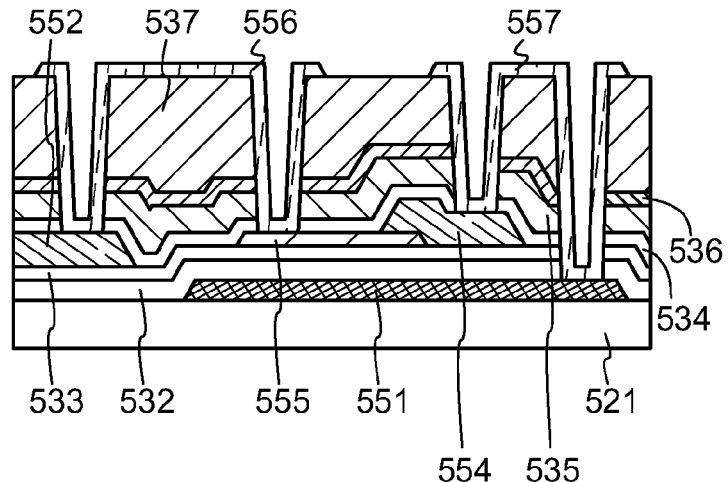

Further, in the circuit configurations in FIGS. 24A, 24B, and 24C, the connection between the first terminal serving as a source electrode and the second terminal serving as a gate electrode can be controlled to have an arbitrary resistivity with structures illustrated in schematic cross-sectional views in FIGS. 25A to 25C.

FIG. 25A illustrates a resistor that can be used as the protection circuit 511. In the cross-sectional view of the resistor in FIG. 25A, the substrate 521, the conductive layer 551, the insulating layer 532, the insulating layer 533, the semiconductor layer 555, the conductive layer 552, the insulating layer 534, the insulating layer 535, the insulating layer 536, the insulating layer 537, and the conductive layer 556 are exemplified.

FIG. 25B illustrates a resistor that can be used as the protection circuit 511. In the cross-sectional view of the resistor in FIG. 25B, the substrate 521, the conductive layer 551, the insulating layer 532, the insulating layer 533, the semiconductor layer 555, the conductive layer 552, the insulating layer 534, the insulating layer 535, the insulating layer 536, the insulating layer 537, the conductive layer 556, and the conductive layer 557 are exemplified.

FIG. 25C illustrates a resistor that can be used as the protection circuit 511. In the cross-sectional view of the resistor in FIG. 25C, the substrate 521, the conductive layer 551, the insulating layer 532, the insulating layer 533, the semiconductor layer 555, the conductive layer 552, the conductive layer 554, the insulating layer 534, the insulating layer 535, the insulating layer 536, the insulating layer 537, the conductive layer 556, and the conductive layer 557 are exemplified.

This embodiment can be combined with another embodiment in this specification as appropriate.

<Variation of Transistor>

Next, a variation of the transistor 522 will be described.

A method for fabricating a transistor in a display device, including the transistor 522, is described below.

A method for fabricating the transistor 522 is described with reference to FIGS. 26A to 26D and FIGS. 27A to 27C.

The method illustrated in FIGS. 26A to 26D and FIGS. 27A to 27C is different from the method illustrated in FIGS. 11A to 11D and FIGS. 12A to 12C in that the length L1 in the channel length direction of the gate electrode 402 is set larger than the length L2 in the channel length direction of the oxide semiconductor layer (L1>L2), and the second insulating film 404 is processed at the same time as the formation step of the island-shaped oxide semiconductor layer 406 to form a second insulating layer 416. With this structure, a resistor that can be used as a protection circuit can be formed between the source electrode 408 (or the drain electrode 409) and the gate electrode 402.

Figure 26A:
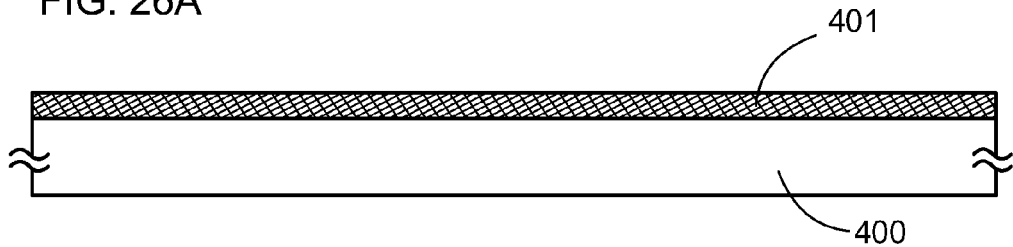
FIGS. 26A to 26D are cross-sectional views illustrating a method for fabricating a display device.
Figure 26B:
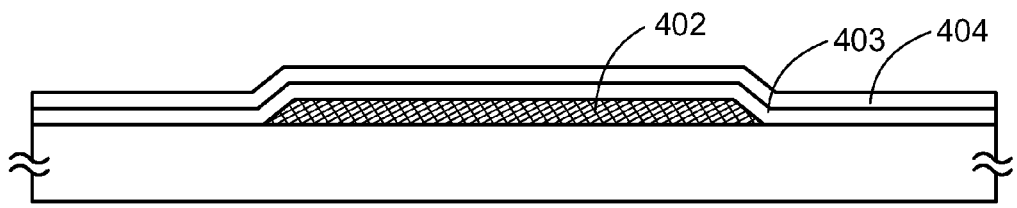
Figure 26C:
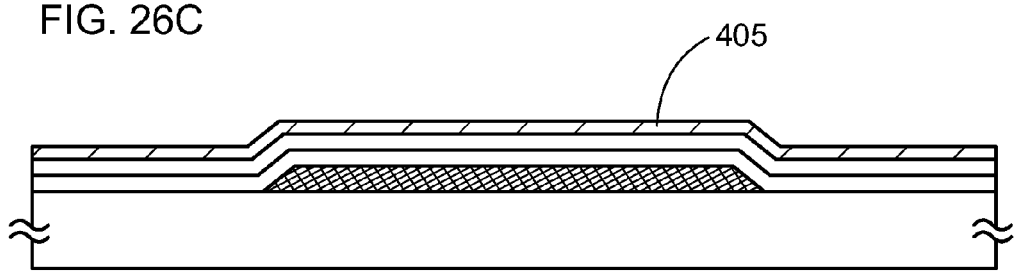
Figure 26D:
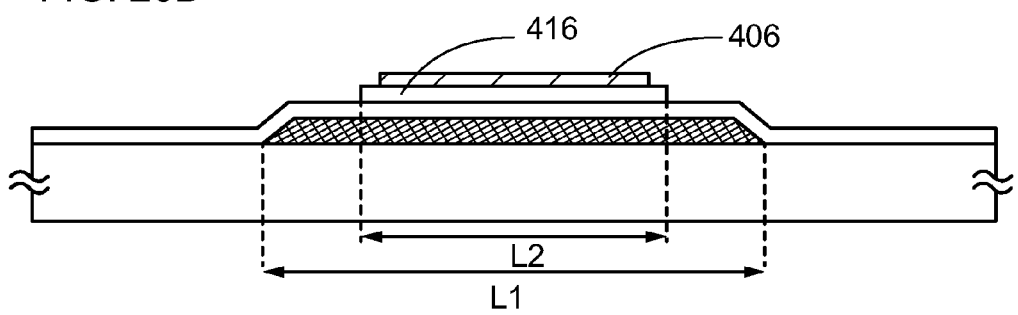
Figure 27A:
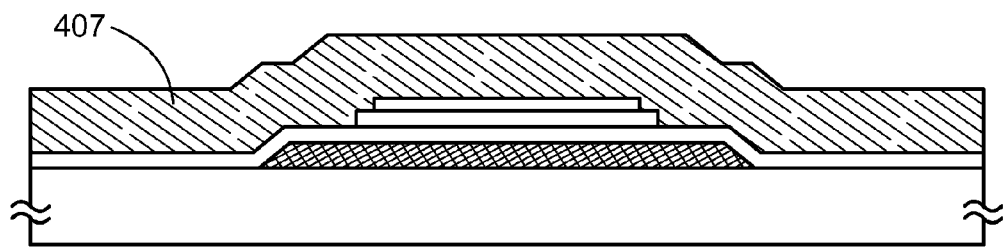
FIGS. 27A to 27C are cross-sectional views illustrating a method for fabricating the display device.
Figure 27B:
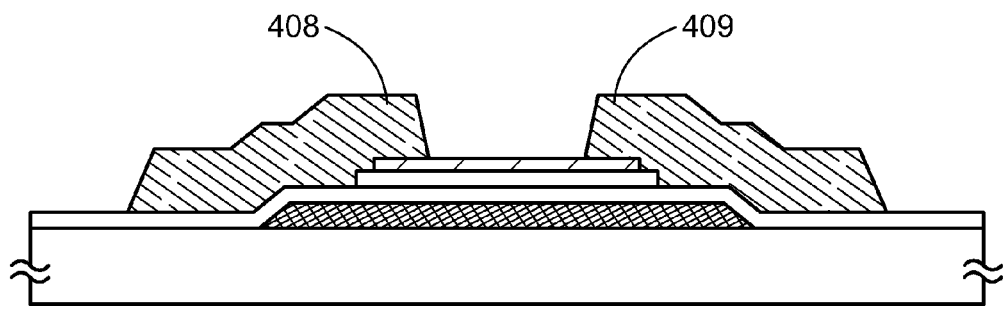
Figure 27C:
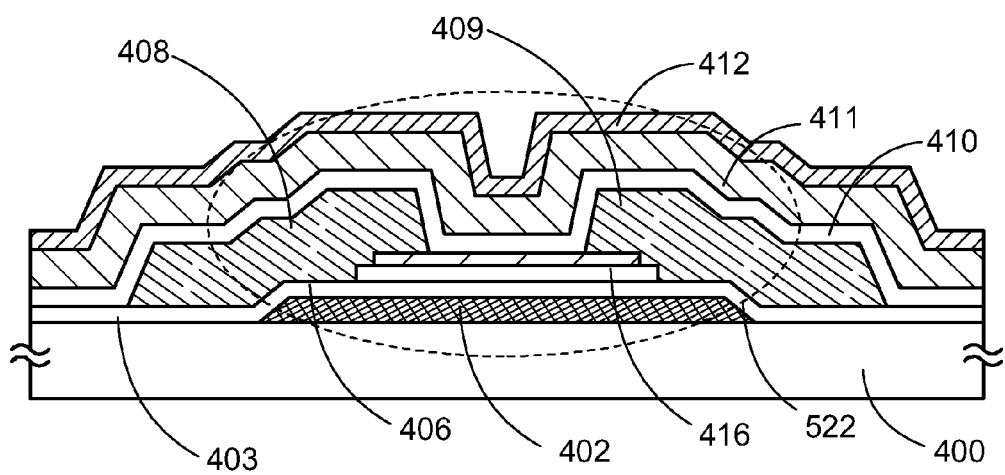

When the length L1 in the channel length direction of the gate electrode 402 is larger than the length L2 in the channel length direction of the oxide semiconductor layer as illustrated in FIG. 26D, the gate electrode 402 can be processed such that the length L1 in the channel length direction can be large.

In addition, as for the island-shaped oxide semiconductor layer 406 and the second insulating layer 416 as illustrated in FIG. 26D, a part of the second insulating layer 416 may be removed by isotropic etching with a resist mask that is used when the island-shaped oxide semiconductor layer 406 is processed. In this case, at the time of etching the second insulating layer 416, an end portion of the island-shaped oxide semiconductor layer 406 is also etched, so that the size of the island-shaped oxide semiconductor layer 406 is reduced as compared with a designed size.

Figure 28A:
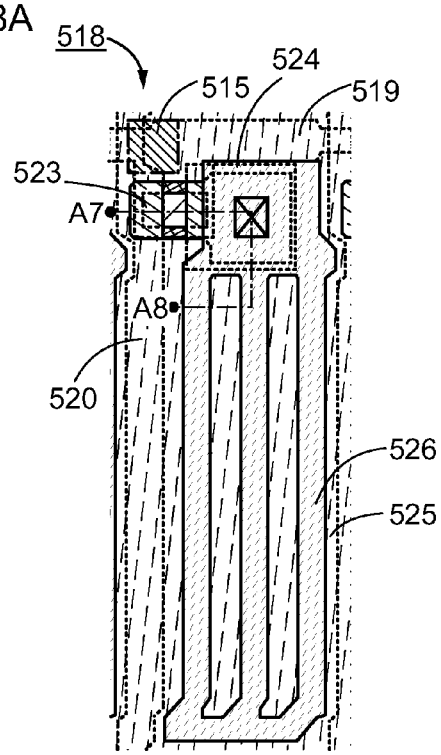
FIGS. 28A and 28B are a plan view and a cross-sectional view of a display device.
Figure 28B:
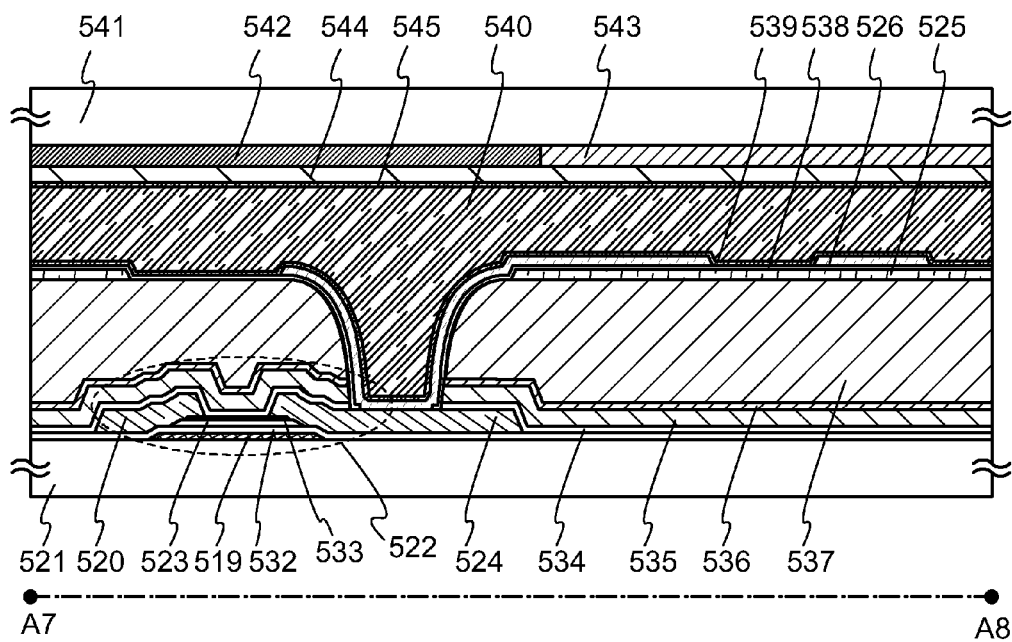

A structure of the pixel 518 including the transistor 522 formed by the method illustrated in FIGS. 26A to 26D and FIGS. 27A to 27C is illustrated in FIGS. 28A and 28B. FIG. 28A is a plan view of a structural example of the pixel and FIG. 28B is a cross-sectional view taken along the section line A7-A8 in FIG. 28A.

<Variation in Cross-Sectional Structure of Liquid Crystal Display Device>

Next, a variation of a transverse electric field mode liquid crystal display device in the cross-sectional view is described.

The cross-sectional views illustrated in FIGS. 29A and 29B are variations of the cross-sectional view illustrated in FIG. 28B. In FIGS. 29A and 29B, cross-sections of the connection portions as well as the cross-sections of the pixel portions are illustrated. The structure in the cross-sectional view in FIG. 29A is a structure obtained by formation of the semiconductor layer 523 followed by formation of the conductive layer 526.

In the structure illustrated in FIG. 29B, a conductive layer 576 for assisting the conductivity is stacked over the conductive layer 525 and the conductive layer 573 that overlaps with the black matrix 542. In addition, in FIGS. 29A and 29B, the conductive layer 571 in FIG. 29A and the conductive layer 572 in FIG. 29B that are directly connected to the conductive layer in the connection portion are different conductive layers.

In the cross-sectional view in FIG. 29A, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the conductive layer 525, the conductive layer 526, the alignment film 539, the liquid crystal layer 540, the substrate 541, the black matrix 542, the color filter 543, the overcoat 544, the alignment film 545, the conductive layer 571, and the conductive layer 573 are exemplified. In FIG. 29A, the transistor 522 is illustrated.

In the cross-sectional view in FIG. 29B, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the conductive layer 525, the conductive layer 526, the alignment film 539, the liquid crystal layer 540, the substrate 541, the black matrix 542, the color filter 543, the overcoat 544, the alignment film 545, the conductive layer 571, the conductive layer 573, and the conductive layer 576 are illustrated. In FIG. 29B, the transistor 522 is illustrated.

The conductive layer 576 can function as an electrode for assisting the conductivities of the conductive layer 525 and the conductive layer 573. As the conductive layer 576, a single layer or two or more layers of a film including a conductive material containing one or more kinds of aluminum, titanium, chromium, cobalt, nickel, copper, yttrium, zirconium, molybdenum, ruthenium, silver, tantalum, and tungsten are preferably formed.

Figure 30:
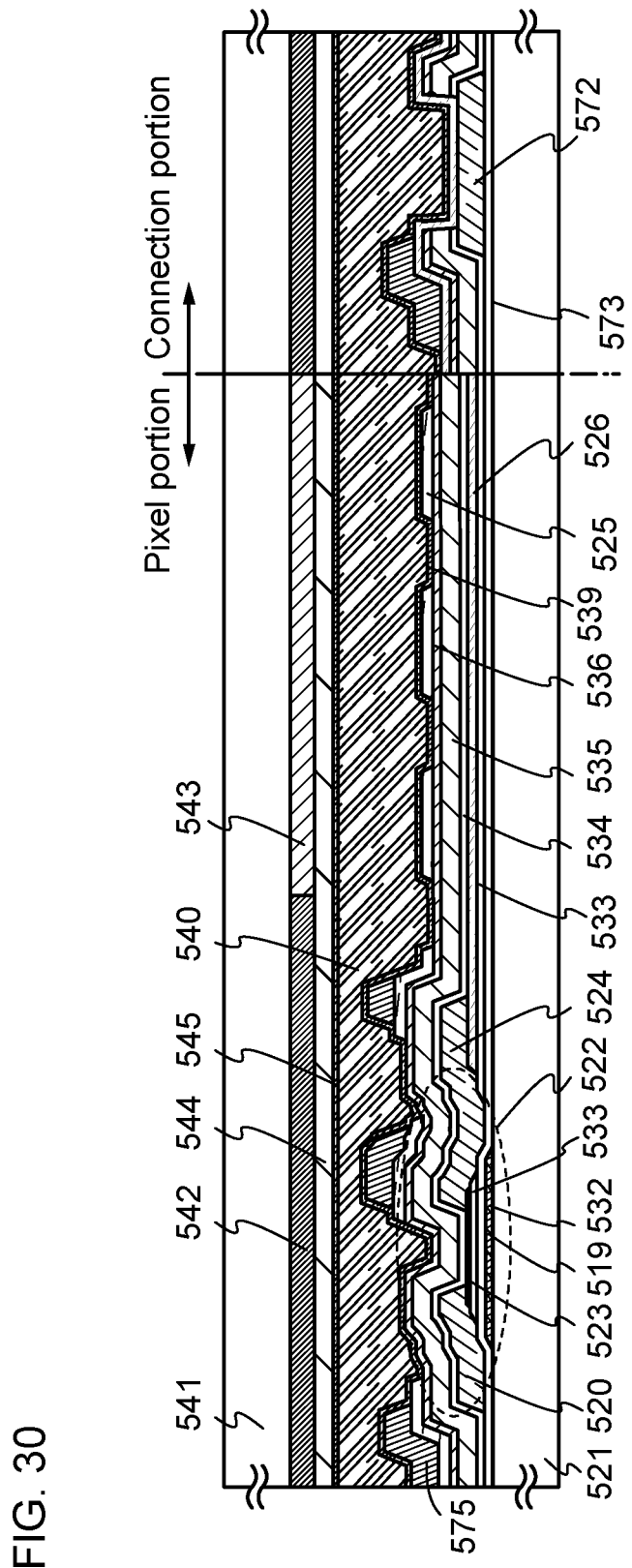
FIG. 30 is a cross-sectional view of a display device.

The structure in the cross-sectional view illustrated in FIG. 30 is a structure obtained by formation of the conductive layer 526 followed by formation of the semiconductor layer 523, which is different from the structures in FIGS. 29A and 29B. Therefore, the insulating layer 533 is left overlapping with the conductive layer 526 in the structure illustrated in FIG. 30.

In the cross-sectional view in FIG. 30, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the conductive layer 525, the conductive layer 526, the alignment film 539, the liquid crystal layer 540, the substrate 541, the black matrix 542, the color filter 543, the overcoat 544, the alignment film 545, the conductive layer 572, the conductive layer 573, and the conductive layer 576 are exemplified. In FIG. 30, the transistor 522 is illustrated.

Figure 31:
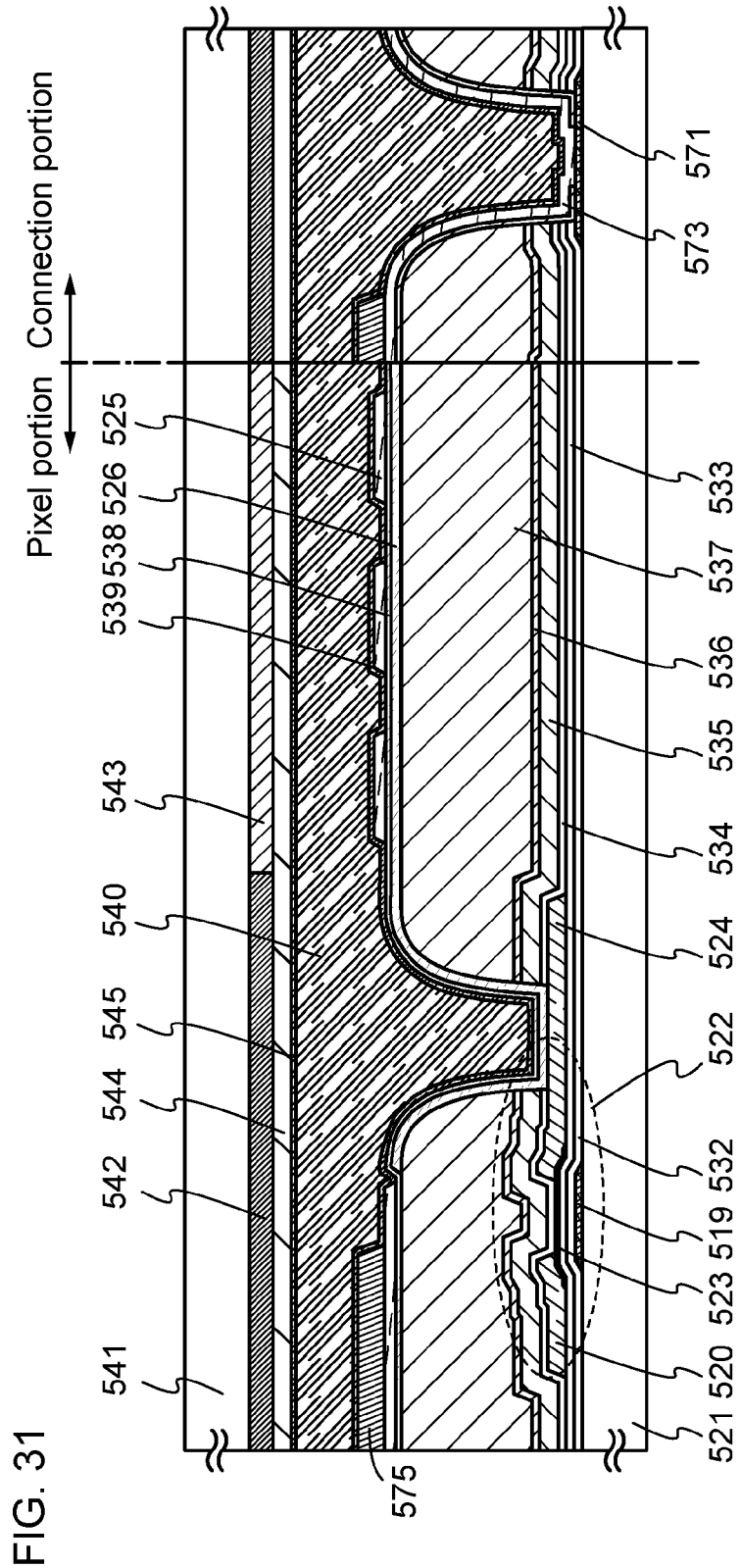
FIG. 31 is a cross-sectional view of a display device.

The cross-sectional view in FIG. 31 is a variation of the cross-section illustrated in FIG. 6A. In FIG. 31, a cross section of a connection portion as well as a cross section of a pixel portion is illustrated. In the cross-sectional structure illustrated in FIG. 31, the conductive layer 525 serving as a common electrode is formed after formation of the conductive layer 526 serving as a pixel electrode.

In the cross-sectional view in FIG. 31, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 571, the conductive layer 573, and the conductive layer 575 are exemplified. In FIG. 31, the transistor 522 is illustrated.

Figure 32:
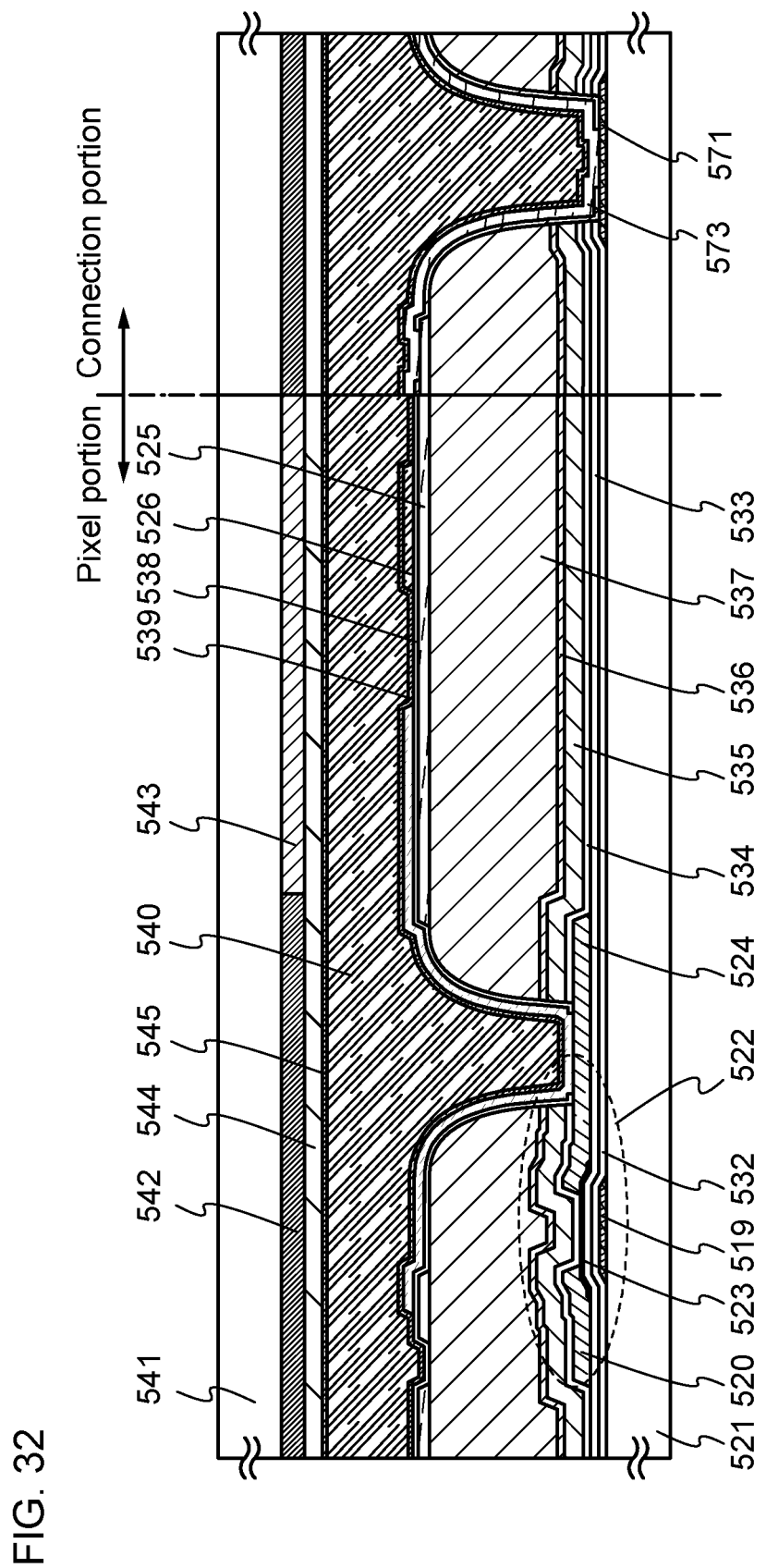
FIG. 32 is a cross-sectional view of a display device.

The cross-sectional view in FIG. 32 is a variation of the cross-section illustrated in FIG. 6A. In FIG. 32, a cross section of a connection portion as well as a cross section of a pixel portion is illustrated. In the cross-sectional structure illustrated in FIG. 32, the conductive layer 526 serving as a pixel electrode overlaps with the semiconductor layer 523 used in the transistor 522.

In the cross-sectional view in FIG. 32, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 571, and the conductive layer 573 are exemplified. In FIG. 32, the transistor 522 is illustrated.

Figure 33:
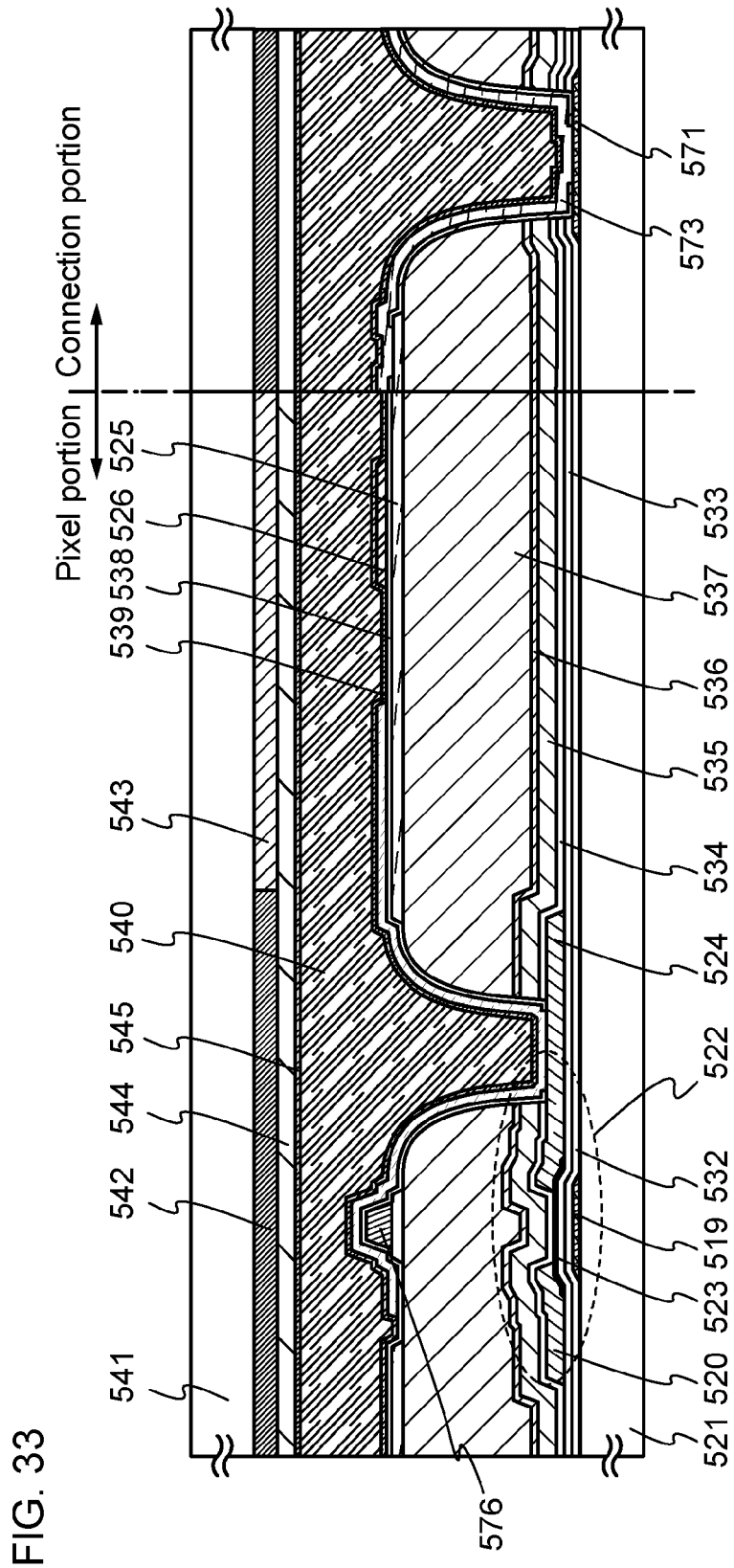
FIG. 33 is a cross-sectional view of a display device.

The cross-sectional view in FIG. 33 is a variation of the cross-section illustrated in FIG. 6A. In FIG. 33, a cross section of a connection portion as well as a cross section of a pixel portion is illustrated. In the cross-sectional structure illustrated in FIG. 33, the conductive layer 576 serving as a back gate electrode of the transistor is formed to overlap with the conductive layer 526 and is placed above the transistor 522.

In the cross-sectional view in FIG. 33, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 571, the conductive layer 573, and the conductive layer 576 are exemplified. In FIG. 33, the transistor 522 is illustrated.

The conductive layer 576 is a wiring serving as a back gate electrode of the transistor. The conductive layer 576 can be formed in a manner similar to that of the conductive layer 575.

Figure 34:
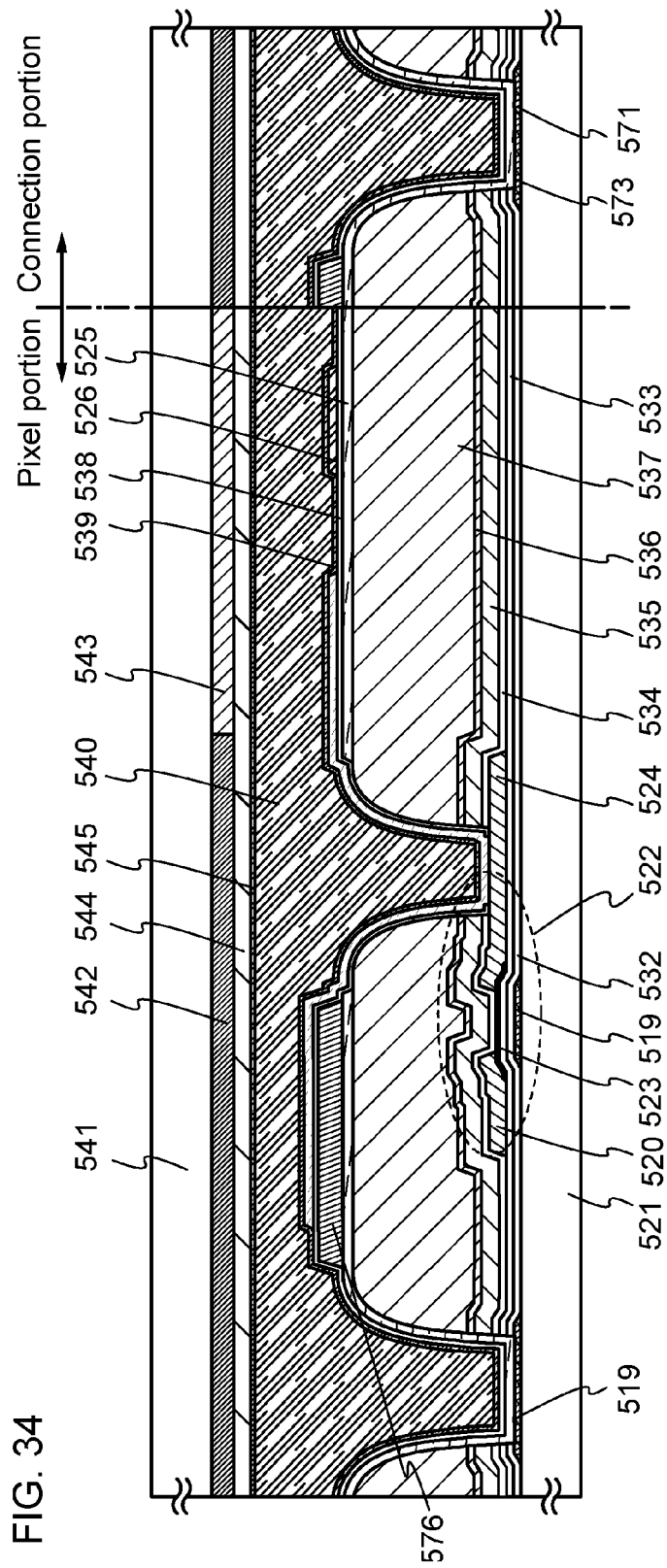
FIG. 34 is a cross-sectional view of a display device.

The cross-sectional view in FIG. 34 is a variation of the cross-section illustrated in FIG. 33. In FIG. 34, a cross section of a connection portion as well as a cross section of a pixel portion is illustrated. In the cross-sectional structure illustrated in FIG. 34, the conductive layer 576 serving as a back gate electrode of the transistor is formed to overlap with the conductive layer 526 directly connected to the conductive layer 519 and is placed above the transistor 522.

In the cross-sectional view in FIG. 34, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 571, the conductive layer 573, and the conductive layer 576 are exemplified. In FIG. 34, the transistor 522 is illustrated.

Figure 35:
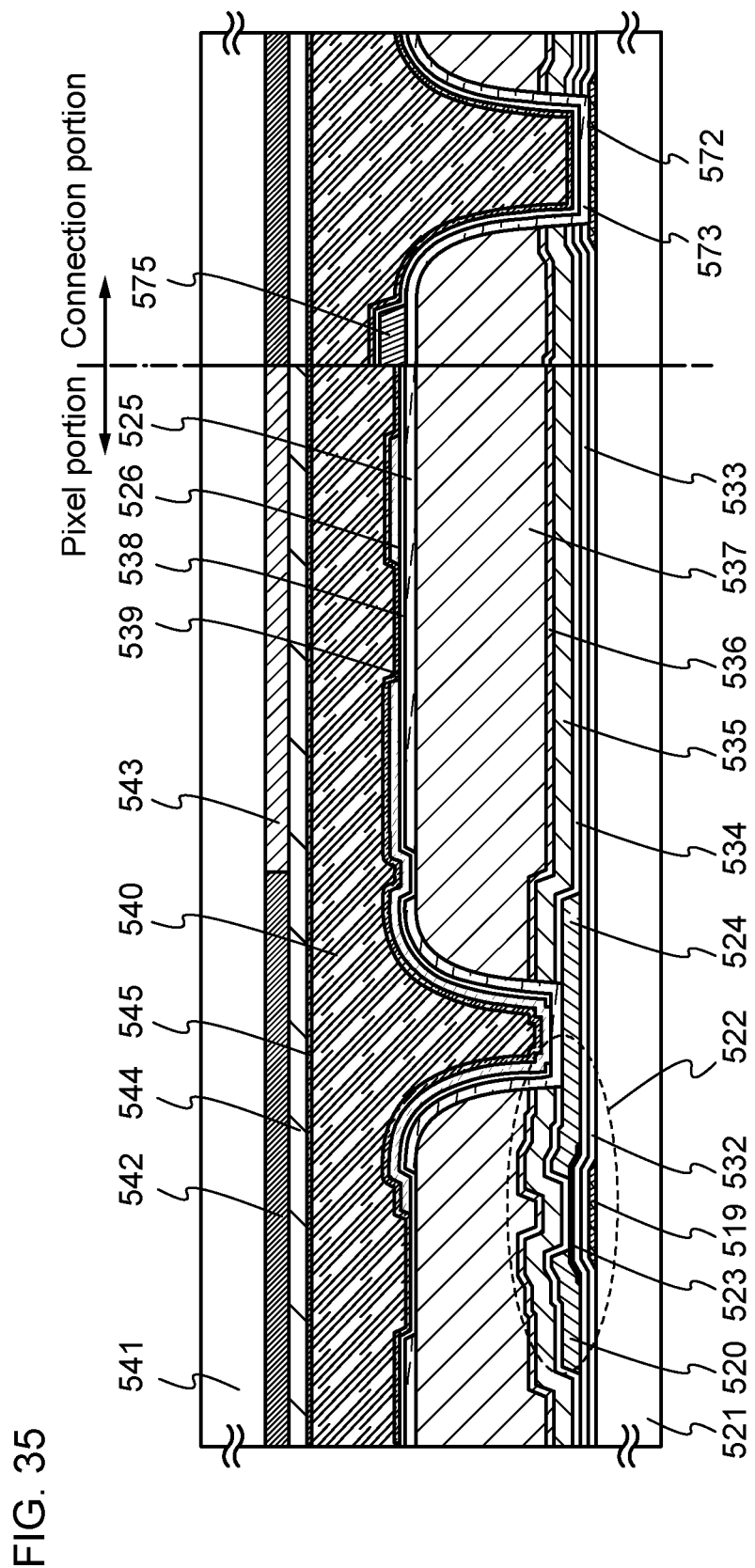
FIG. 35 is a cross-sectional view of a display device.

The cross-sectional view in FIG. 35 is a variation of the cross-section illustrated in FIG. 6A. In FIG. 35, a cross section of a connection portion as well as a cross section of a pixel portion is illustrated. In the cross-sectional structure illustrated in FIG. 35, the conductive layer 525 is formed to overlap with a connection point between the conductive layer 526 serving as a pixel electrode and the transistor 522.

In the cross-sectional view in FIG. 35, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 571, the conductive layer 573, and the conductive layer 575 are exemplified. In FIG. 35, the transistor 522 is illustrated.

Figure 36:
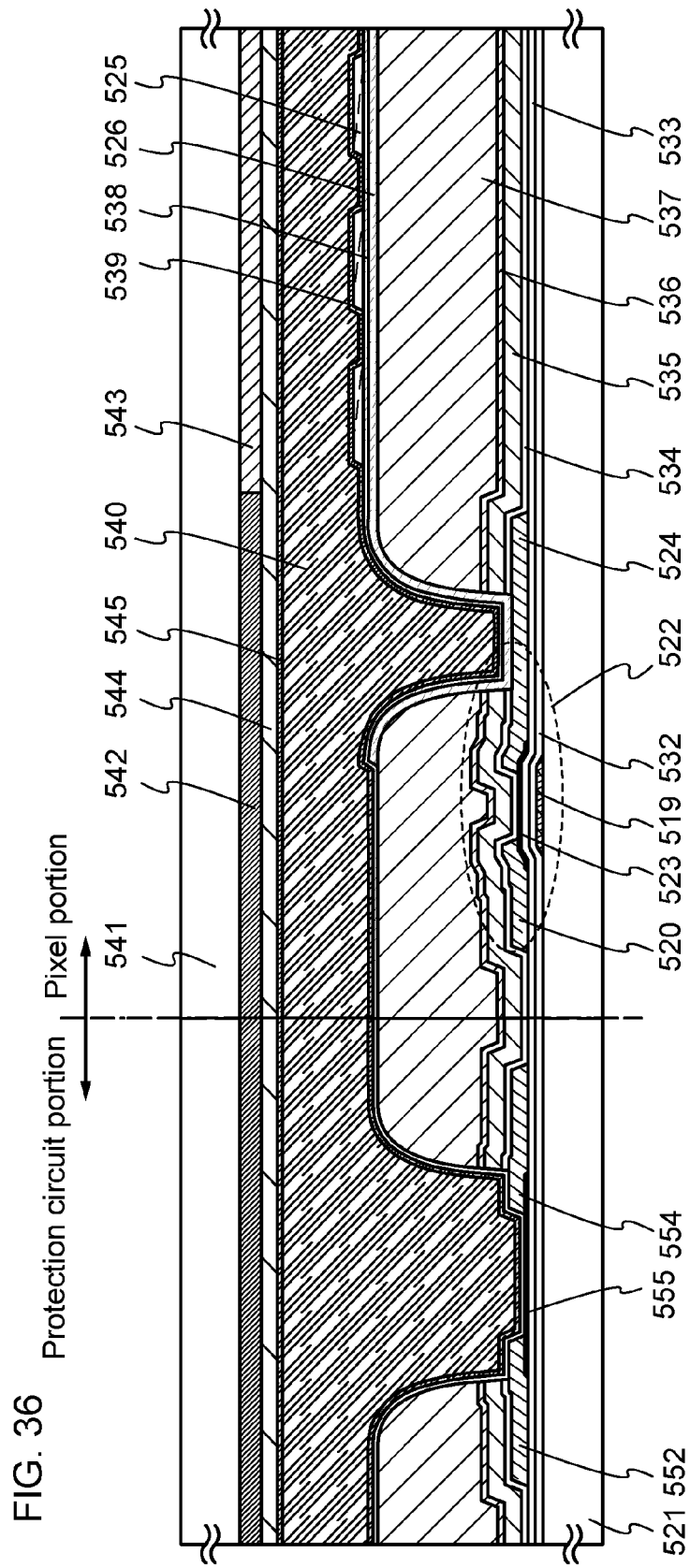
FIG. 36 is a cross-sectional view of a display device.

The cross-sectional view in FIG. 36 is a variation of the cross-section illustrated in FIG. 31. In FIG. 36, a cross section of the protect circuit portion illustrated in FIG. 8 as well as a cross section of a pixel portion is illustrated. In the cross-sectional structure illustrated in FIG. 36, the insulating layer 538 is formed in a direct contact with the semiconductor layer 555 in the protection circuit portion.

In the cross-sectional view in FIG. 36, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 552, the conductive layer 554, and the semiconductor layer 555 are exemplified. In FIG. 36, the transistor 522 is illustrated.

Figure 37:
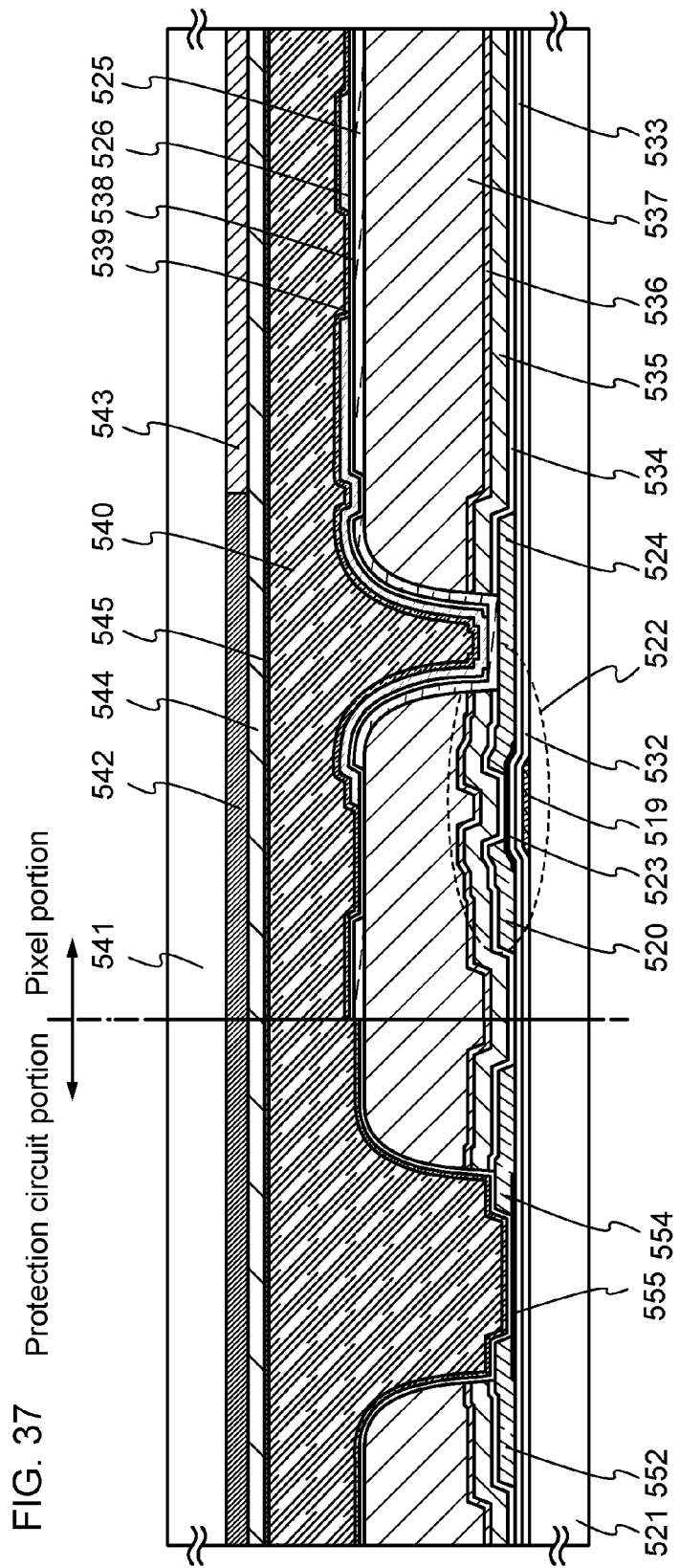
FIG. 37 is a cross-sectional view of a display device.

The cross-sectional view in FIG. 37 is a variation of the cross-section illustrated in FIG. 35. In FIG. 37, a cross section of the protect circuit portion illustrated in FIG. 8 as well as a cross section of a pixel portion is illustrated. In the cross-sectional structure illustrated in FIG. 37, the insulating layer 538 is formed in a direct contact with the semiconductor layer 555 in the protection circuit portion.

In the cross-sectional view in FIG. 37, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 552, the conductive layer 554, and the semiconductor layer 555 are exemplified. In FIG. 37, the transistor 522 is illustrated.

Figure 38:
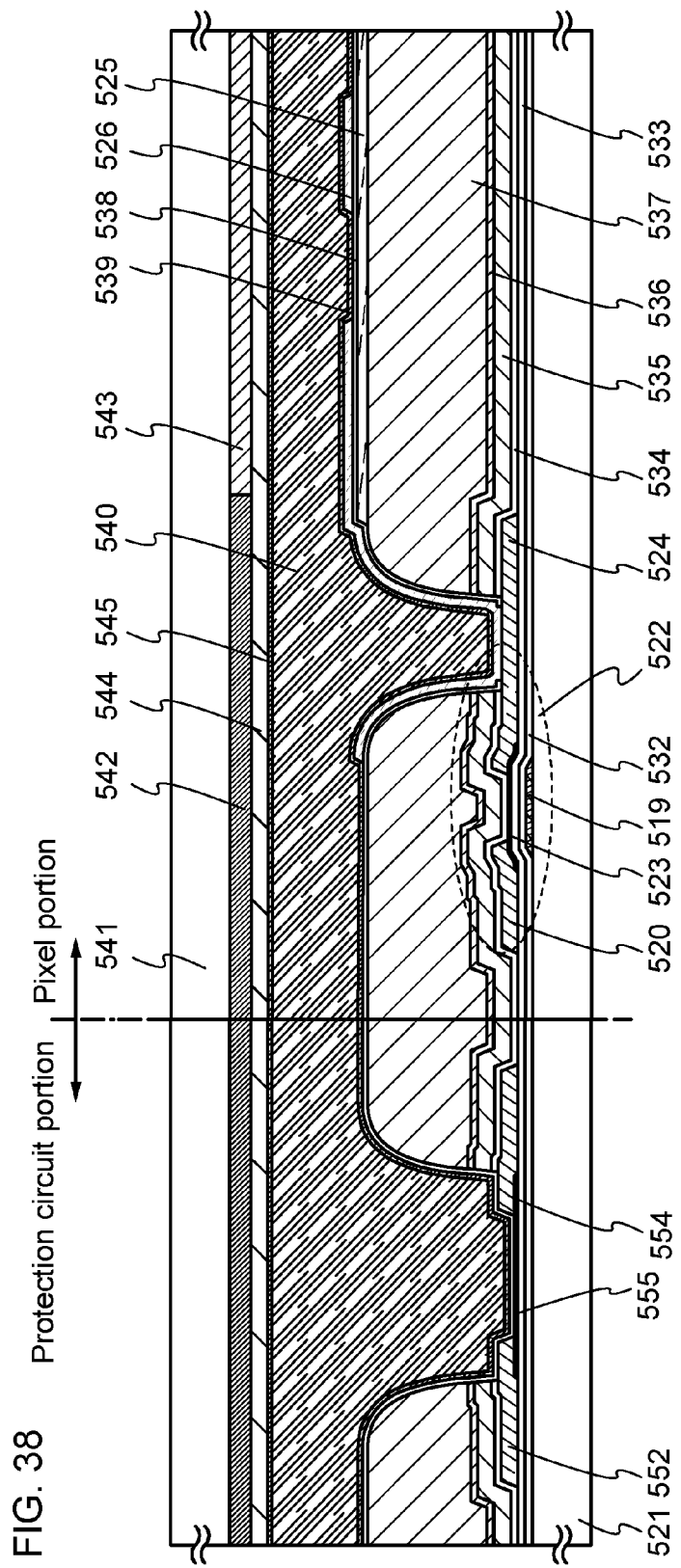
FIG. 38 is a cross-sectional view of a display device.

The cross-sectional view in FIG. 38 is a variation of the cross-section illustrated in FIG. 6A. In FIG. 38, a cross section of the protect circuit portion illustrated in FIG. 8 as well as a cross section of a pixel portion is illustrated. In the cross-sectional structure illustrated in FIG. 38, the insulating layer 538 is formed in a direct contact with the semiconductor layer 555 in the protection circuit portion.

In the cross-sectional view in FIG. 38, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, the conductive layer 552, the conductive layer 554, and the semiconductor layer 555 are exemplified. In FIG. 38, the transistor 522 is illustrated.

This embodiment can be combined with another embodiment in this specification as appropriate.

Embodiment 4

In this embodiment, the transverse electric field mode display panel described in Embodiment 1 is provided with a touch sensor (contact detector) so that the display device can function as a touch panel.

In this embodiment, a touch panel is described with reference to FIG. 39, FIG. 40, FIGS. 41A and 41B, FIGS. 42A and 42B, FIG. 43, and FIG. 44.

Figure 39:
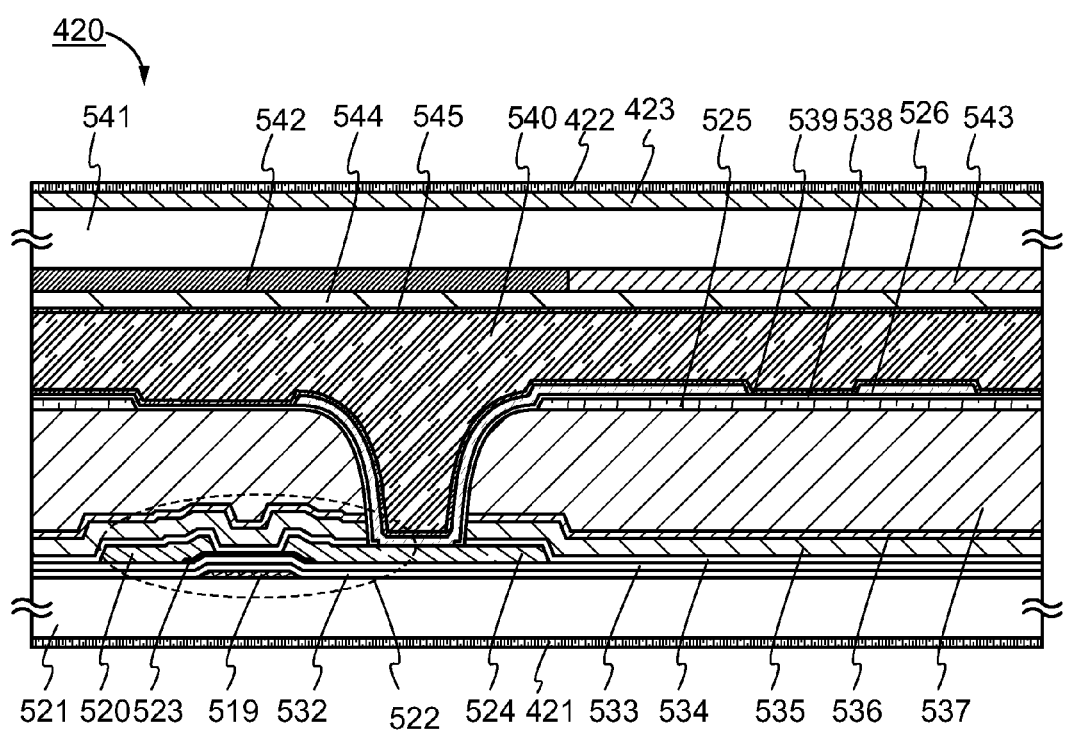
FIG. 39 is a cross-sectional view of a display device.
Figure 40:
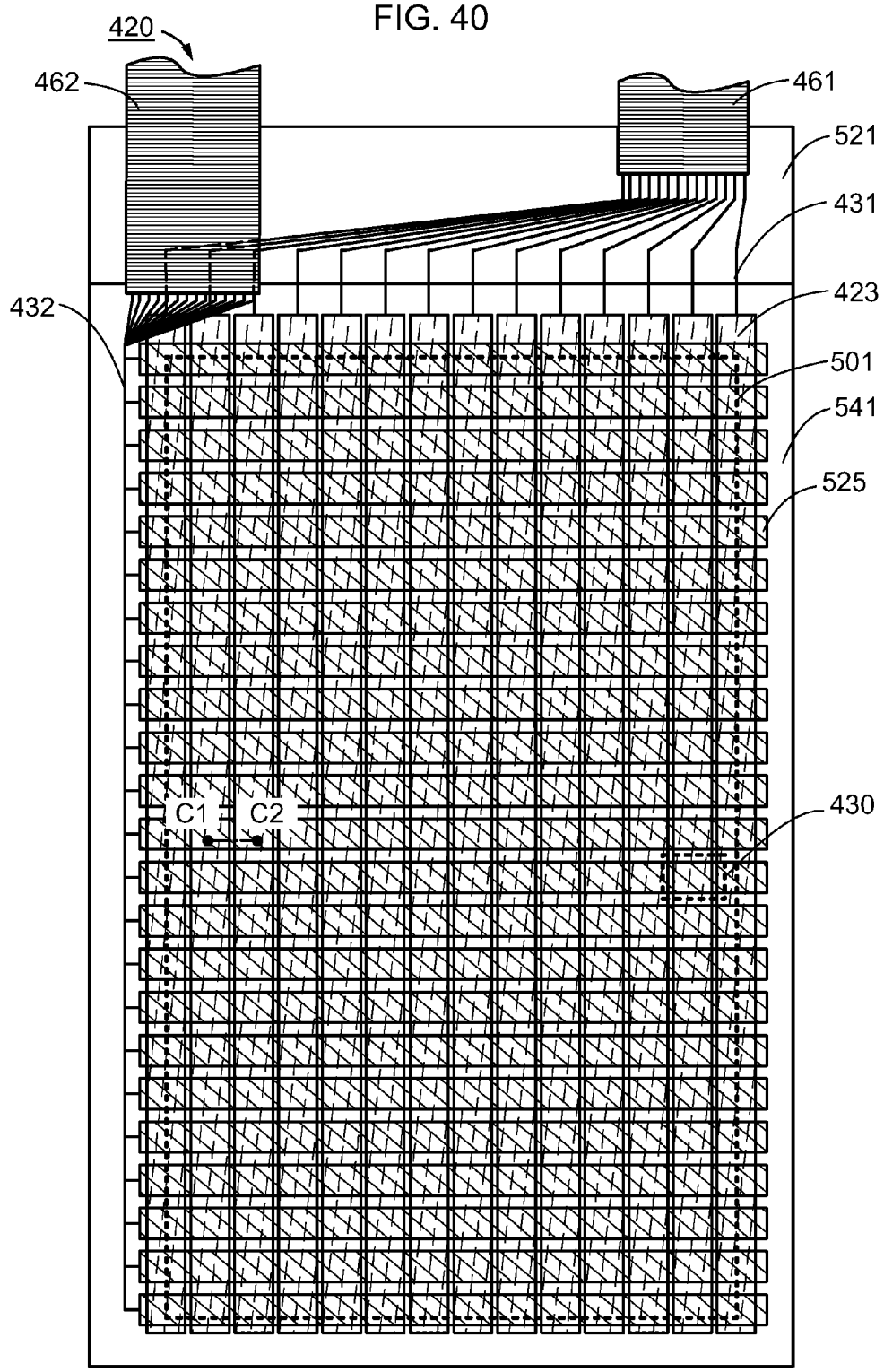
FIG. 40 is a plan view of a display device.
Figure 41A:
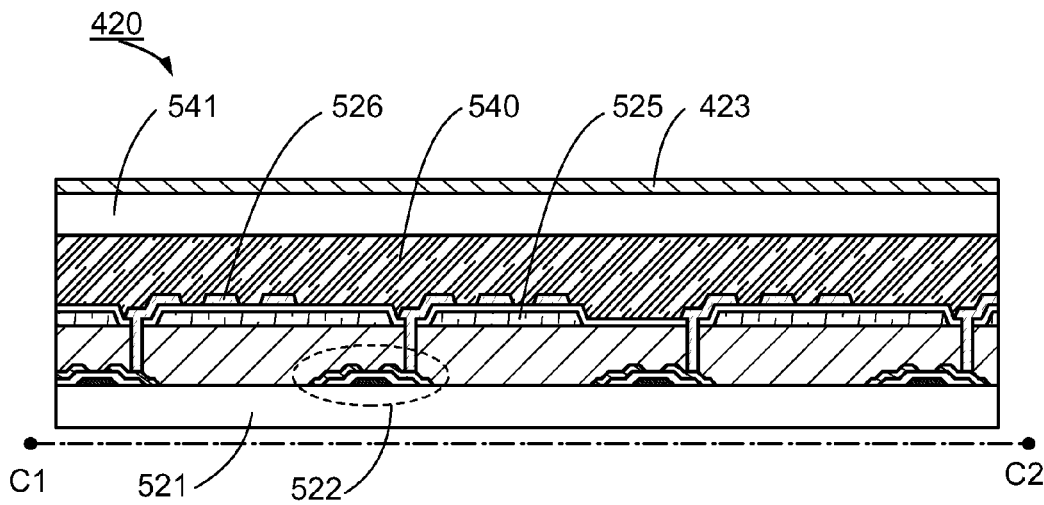
FIGS. 41A and 41B are a cross-sectional view and a plan view of a display device.
Figure 41B:
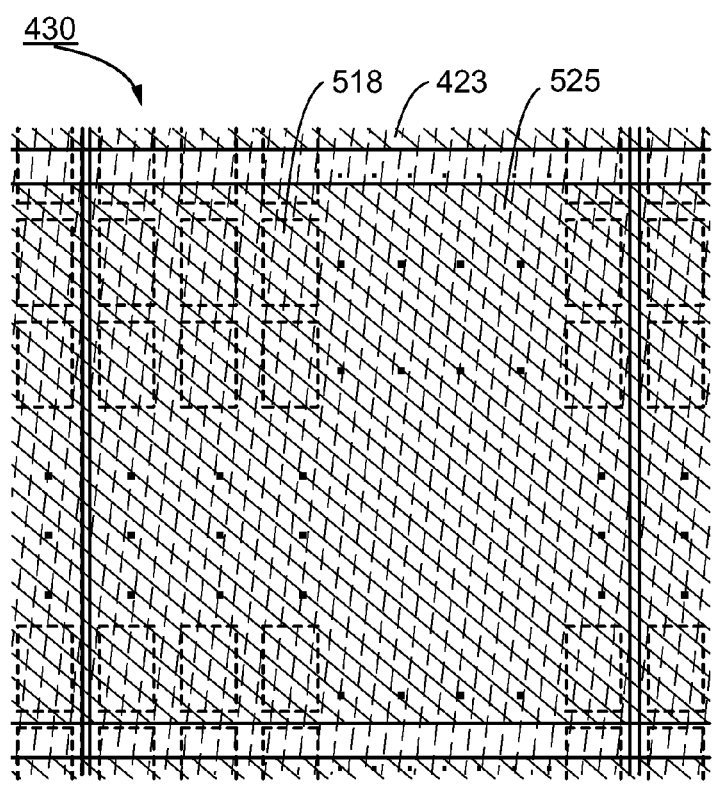

FIG. 39 is a cross-sectional view of a touch panel where the liquid crystal display device 500 serves as the touch panel. In addition, FIG. 40 is a plan view illustrating a structure of a conductive layer that serves as an electrode with which an electrostatic capacitor of a touch sensor is formed. In addition, FIG. 41A is a cross-sectional view taken along the section line C1-C2 in FIG. 40, and FIG. 41B is a plan view of a region 430 illustrated in FIG. 40.

In the cross-sectional view illustrating a structural example of the touch panel 420 where the liquid crystal display device 500 in FIG. 39 functions as a touch panel, the substrate 521, the conductive layer 519, the insulating layer 532, the insulating layer 533, the semiconductor layer 523, the conductive layer 520, the conductive layer 524, the insulating layer 534, the insulating layer 535, the insulating layer 536, the insulating layer 537, the conductive layer 525, the conductive layer 526, the insulating layer 538, the alignment film 539, the liquid crystal layer 540, the substrate 541, the black matrix 542, the color filter 543, the overcoat 544, the alignment film 545, a member having a polarizing function (hereinafter referred to as a polarizing plate 421), a member having a polarizing function (hereinafter referred to as a polarizing plate 422), and a layer having a conductive property (hereinafter referred to as a conductive layer 423) are exemplified. In FIG. 39, the transistor 522 is illustrated.

The touch panel 420 includes a capacitive sensor as a touch sensor. A polarizing plate 421 is attached to the outer side of the substrate 521, and a polarizing plate 422 is attached to the outer side of the substrate 541.

There is no particular limitation on the polarizing plate 421 as long as they can extract linearly polarized light from natural light or circularly polarized light. For example, a polarizing plate which has optical anisotropy by disposing dichroic substances in one direction can be used. Such a polarizing plate can be formed in such a manner that an iodine-based compound or the like is adsorbed to a film such as a polyvinyl alcohol film and the film or the like is stretched in one direction. Note that as the dichroic substance, a dye-based compound or the like as well as an iodine-based compound can be used. The same can be applied to the polarizing plate 422

The conductive layer 423 is a layer serving as an anti-electrostatic conductor and one electrode of electrodes included in the electrostatic capacitor of the touch sensor. The conductive layer 423 can be formed in manner similar to that of the conductive layer 525.

In the plan view of the structural example of the conductive layer 525 serving as a common electrode and the other electrode of the electrodes included in the electrostatic capacitor of the touch sensor and the conductive layer 423 in FIG. 40, the substrate 521, the substrate 541, an FPC 461, an FPC 462, a wiring 431, a wiring 432, the conductive layer 525, and the conductive layer 423 are exemplified. In FIG. 40, a region corresponding to the pixel portion 501 is shown by a dotted line.

In the plan view of FIG. 40, the conductive layers 525 and the conductive layers 423 have stripe patterns, and the conductive layer 525 and the conductive layer 423 are orthogonal to each other. The conductive layer 525 is connected to the FPC 461 attached to the substrate 521 by the wiring 431, and the conductive layer 423 is connected to the FPC 462 attached to the substrate 541 by the wiring 432.

In the cross-sectional view of FIG. 41A taken along the section line C1-C2 in FIG. 40, the substrate 521, the transistor 522, the conductive layer 525, the conductive layer 526, the liquid crystal layer 540, the substrate 541, and the conductive layer 423 are exemplified.

The conductive layer 526 serving as a pixel electrode is provided in each pixel and is connected to the transistor 522.

In the plan view in FIG. 41B illustrating the region 430 in FIG. 40, the pixel 518, the conductive layer 525, and the conductive layer 423 are exemplified.

At a region where the conductive layer 525 and the conductive layer 423 intersect with each other, plural pixels 518 are provided.

The electrostatic capacitor of the touch sensor is formed at the region where the conductive layer 525 and the conductive layer 423 intersect with each other. In the capacitor where the conductive layer 525 and the conductive layer 423 serve as the pair of electrodes, the conductive layer 525 is an electrode that supplies a potential to the capacitor, while the conductive layer 423 is an electrode that extracts current flowing through the capacitor.

Operations of the touch panel 420 can be broadly classified into two operations: a display operation of inputting a video signal to the pixel and a sensing operation of detecting contact. In the display operation, the potential of the conductive layer 525 is fixed at a low level. During a sensing period, pulse signals are sequentially applied to the conductive layers 525 and thus, the potentials of the conductive layers 525 are set at a high level. At this time, when a finger touches the touch panel 420, capacitance due to the finger is applied to the capacitor of the touch sensor; thus, current flowing through the capacitor is changed, so that the potential of the conductive layer 423 is changed. Pulse signals of the conductive layers 525 are sequentially scanned and a change in the potential of the conductive layer 423 is detected, so that a position which is touched by the finger is detected.

As described above, when the touch panel is formed using the liquid crystal display device 500, the anti-electrostatic conductor originally provided in the FFS-mode liquid crystal display device 500 and the common electrode of the pixel can be used as electrodes included in the electrostatic capacitor of the touch panel 420; thus, a touch panel that is thin and lightweight and has high display quality can be provided.

Embodiment 5

In this embodiment, a variation and an application example of the display device serving as a touch panel described in Embodiment 4 are described.

<Variation of External Touch Panel>

Structures of an external touch panel include a structure in which a touch panel substrate where an electrostatic capacitor is formed is provided on the substrate 541 side of the liquid crystal panel 500, and a structure of a surface capacitive touch sensor formed with use of an antistatic conductive film attached outside the substrate 541 of the liquid crystal panel 500. A structural example of a touch sensor applied to an external touch sensor is described below with reference to FIGS. 42A and 42B and FIG. 43.

Figure 42A:
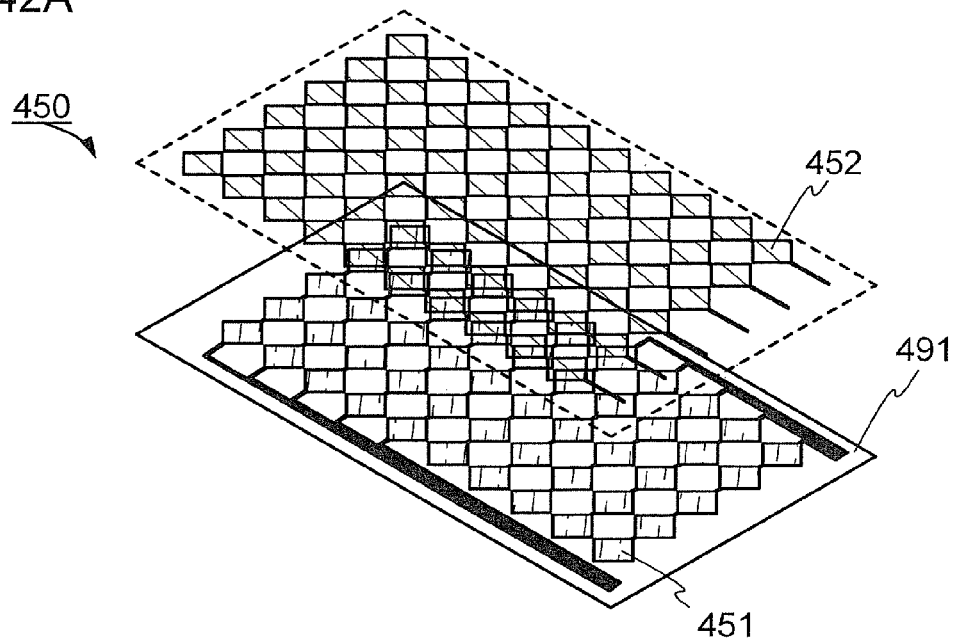
FIGS. 42A and 42B are views illustrating a touch sensor.
Figure 42B:
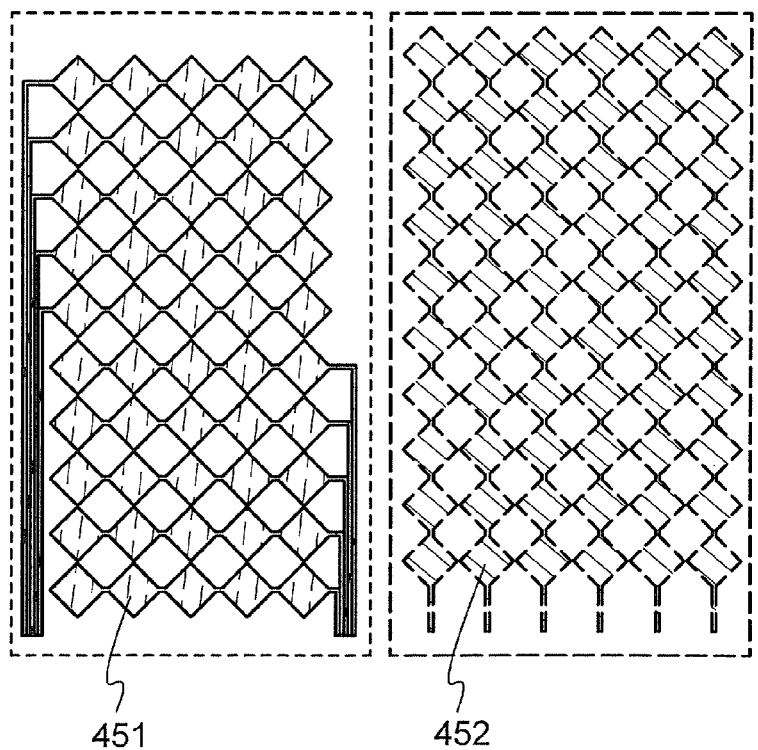
Figure 43:
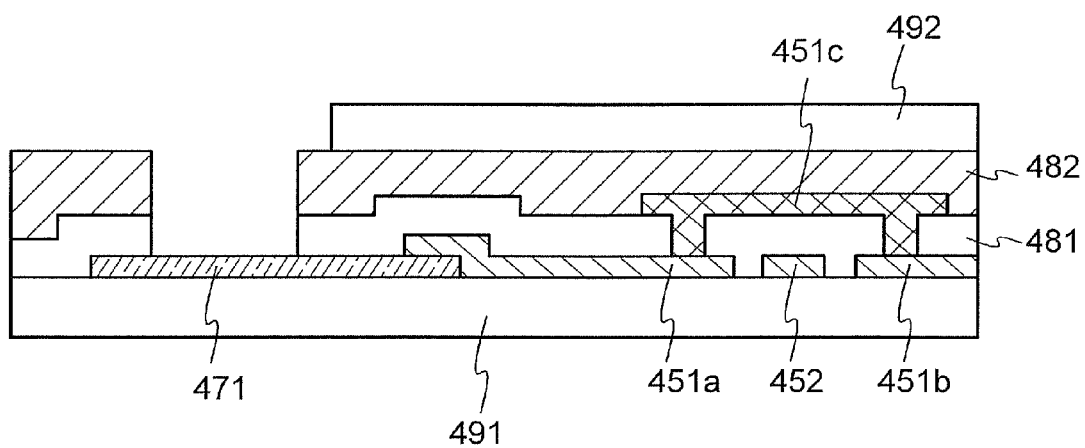
FIG. 43 is a cross-sectional view illustrating a touch sensor.

FIG. 42A is an exploded perspective view of a structural example of a touch sensor. FIG. 42B is a plan view of a structural example of an electrode of the touch sensor. FIG. 43 is a cross-sectional view of a structural example of the touch sensor 450.

As illustrated in FIG. 42A and FIG. 42B, the touch sensor 450 corresponds to a plan view where the plurality of electrodes 451 and the plurality of electrode 452 are illustrated. The touch sensor 450 illustrated in FIG. 42A and FIG. 42B includes, over the substrate 491, the plurality of electrodes 451 arranged in an X-axis direction and the plurality of electrodes 452 arranged in a Y-axis direction which intersects with the X-axis direction.

The electrode 451 and the electrode 452 each have a structure in which a plurality of quadrangular conductive films are connected. In the plurality of electrodes 451 and the plurality of electrodes 452, the plurality of quadrangular conductive films on the electrode 451 side do not overlap with the plurality of quadrangular conductive films on the electrode 452 side. At the intersection portion of the electrode 451 and the electrode 452, an insulating film is provided between the electrode 451 and the electrode 452 to prevent the electrodes 451 and 452 from being in contact with each other.

Figure 44:
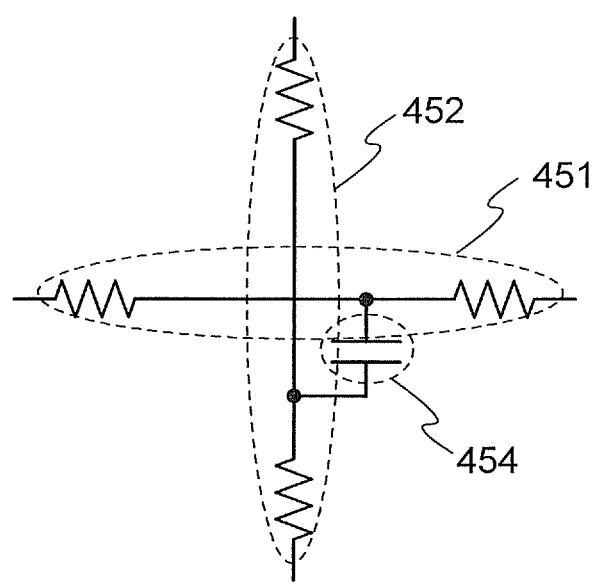
FIG. 44 is a circuit diagram illustrating a touch sensor.

FIG. 43 is a cross-sectional view illustrating an example of a connection structure of the electrode 451 and the electrode 452, where the electrode 451 and the electrode 452 intersect with each other. FIG. 44 is a circuit diagram of a portion where the electrode 451 intersects with the electrode 452. As illustrated in FIG. 44, a capacitor 454 is formed in the portion where the electrode 451 and the electrode 452 intersect with each other.

As illustrated in FIG. 43, the electrode 451 includes the conductive film 451*a* and the conductive film 451*b* in the first layer and the conductive film 451*c* in the second layer over an insulating film 481. The conductive film 451*a* and the conductive film 451*b* are connected by the conductive film 451*c*.

The electrode 452 is formed using the conductive film in the first layer. An insulating film 482 is formed so as to cover the electrodes 451, 452, and 471. As the insulating films 481 and 482, silicon oxynitride films may be formed, for example. A base film formed using an insulating film may be provided between the substrate 491, and the electrode 451 and the electrode 471. As the base film, for example, a silicon oxynitride film can be formed.

The electrode 451 and the electrode 452 are formed using conductive materials that transmit visible light, such as indium tin oxide containing silicon oxide, indium tin oxide, zinc oxide, indium zinc oxide, or zinc oxide to which gallium is added.

The conductive film 451*a* is connected to the electrode 471. A terminal for connection to an FPC is formed using the electrode 471. Like the electrode 451, the electrode 452 is connected to the electrode 471. The electrode 471 can be formed of a tungsten film, for example.

The insulating film 482 is formed so as to cover the electrodes 451, 452, and 471. An opening portion is formed in the insulating films 481 and 482 over the electrode 471 to electrically connect the electrode 471 and the FPC. A substrate 492 is attached to the insulating film 482 using an adhesive, an adhesive film, or the like. The substrate 491 side is bonded to the substrate 541 of the liquid crystal display device 500 with an adhesive or an adhesive film, so that a touch panel is completed.

<Application Example of External Touch Panel>

Next, a display module that can be formed using a display device of one embodiment of the present invention will be described with reference to FIG. 46.

Figure 46:
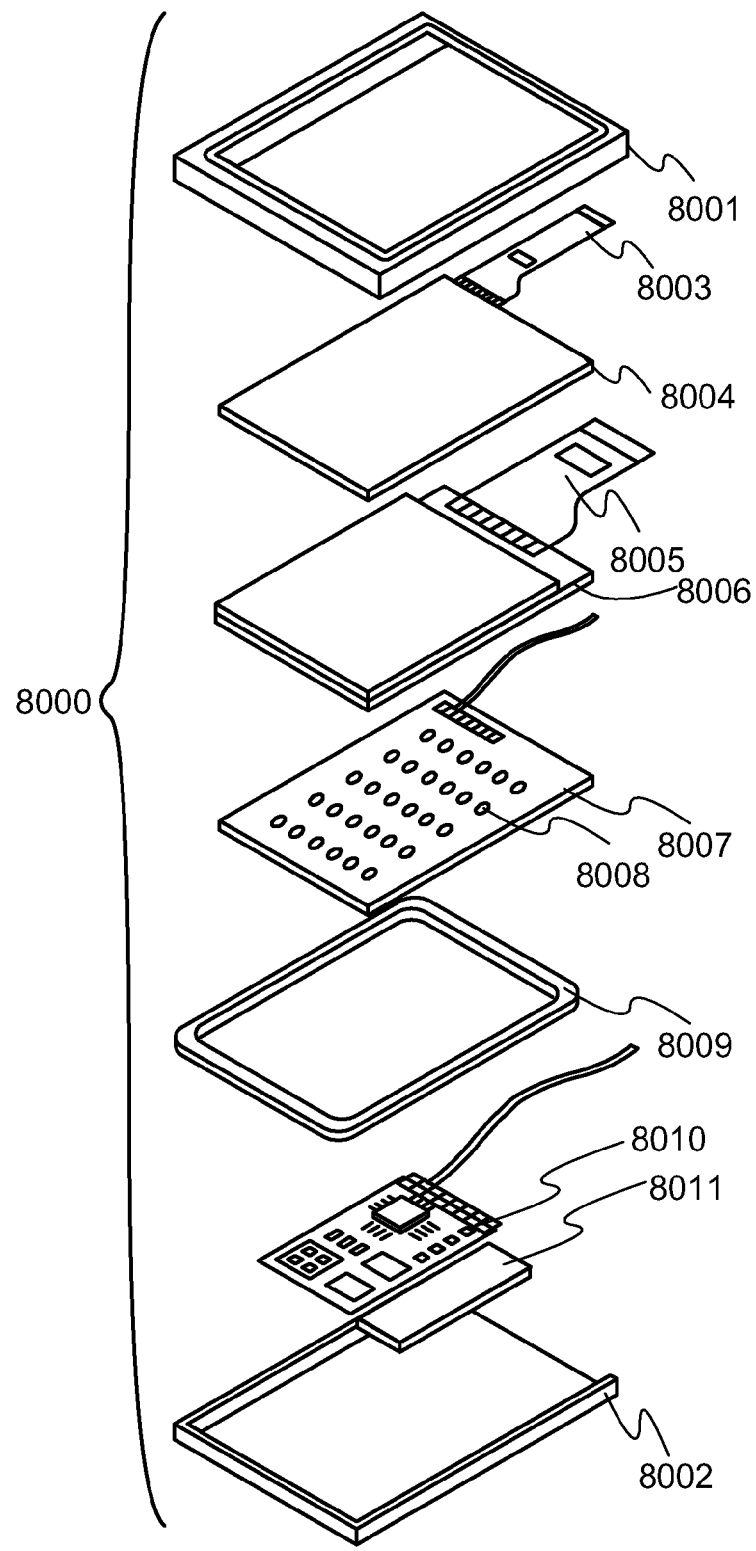
FIG. 46 illustrates a display module using a display device in accordance with one embodiment of the present invention.

In a display module 8000 in FIG. 46, a touch panel 8004 connected to an FPC 8003, a display panel cell 8006 connected to an FPC 8005, a backlight unit 8007, a frame 8009, a printed board 8010, and a battery 8011 are provided between an upper cover 8001 and a lower cover 8002.

The shapes and sizes of the upper cover 8001 and the lower cover 8002 can be changed as appropriate in accordance with the sizes of the touch panel 8004 and the display panel cell 8006.

The touch panel 8004 can be a resistive touch panel cell or a capacitive touch panel cell and can be used overlapping with the display panel cell 8006. A counter substrate (sealing substrate) of the display panel cell 8006 can have a touch panel function. A photosensor may be provided in each pixel of the display panel cell 8006 so that the touch panel 8004 can function as an optical touch panel.

The backlight unit 8007 includes a light source 8008. The light source 8008 may be provided at an end portion of the backlight unit 8007 and a light diffusing plate may be used.

The frame 8009 protects the display panel cell 8006 and also functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

Note that the structures and the like described in this embodiment can be combined as appropriate with any of the structures and the like described in the other embodiments.

Embodiment 6

In this embodiment, a structure that can be used for the pixel circuit 108 in the display device illustrated in FIG. 1A is described with reference to FIGS. 45A and 45B. The display device of one embodiment of the present invention can functions as various types of display devices when the display element in the pixel circuit 108 is changed.

In this specification and the like, a display element, a display device, which is a device including a display element, a light-emitting element, and a light-emitting device, which is a device including a light-emitting element, can employ various modes or can include various elements. Some display elements, display devices, light-emitting elements, or light-emitting devices each include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Examples of a display device including an EL element include an EL display and the like. Examples of a display device including an electron emitter include a field emission display (FED), an SED-type flat panel display (SED: surface-conduction electron-emitter display), and the like. Examples of a display device including a liquid crystal element include liquid crystal displays (e.g., a transmissive liquid crystal display, a transflective liquid crystal display, a reflective liquid crystal display, a direct-view liquid crystal display, a projection liquid crystal display), and the like. Examples of a display device including electronic ink or an electrophoretic element include electronic paper, and the like.

An example of an EL element is an element including an anode, a cathode, and an EL layer interposed between the anode and the cathode. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, a layer including a high-molecular material and a low-molecular material, and the like. Note that various types of EL elements other than the above can alternatively be used.

An example of a liquid crystal element is an element that controls transmission and non-transmission of light by optical modulation action of liquid crystal. The element can include a pair of electrodes and a liquid crystal layer. The optical modulation action of liquid crystal is controlled by an electric field applied to the liquid crystal (including a lateral electric field, a vertical electric field, and a diagonal electric field). Specifically, any of the following can be used for a liquid crystal element, for example: nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, polymer dispersed liquid crystal (PDLC), ferroelectric liquid crystal, anti-ferroelectric liquid crystal, main-chain liquid crystal, side-chain high-molecular liquid crystal, plasma addressed liquid crystal (PALC), banana-shaped liquid crystal, and the like. Moreover, the following methods can be used for driving the liquid crystals, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and a blue phase mode. Note that the present invention is not limited to the above elements and methods, and various liquid crystal elements and driving methods can be used as a liquid crystal element and a driving method thereof.

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specifically, examples of a display method of electronic paper include, but are not limited to, microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light-scattering (transparent-opaque change), a cholesteric liquid crystal and a photoconductive layer, cholesteric liquid crystal, bistable nematic liquid crystal, ferroelectric liquid crystal, a liquid crystal dispersed type with a dichroic dye, a movable film, coloring and decoloring properties of a leuco dye, photochromism, electrochromism, electrodeposition, and flexible organic EL. Note that various electronic paper and display methods other than the above can alternatively be used. Here, with the use of microcapsule electrophoresis, aggregation and precipitation of phoresis particles can be prevented. Electronic liquid powder has advantages such as high-speed response, high reflectivity, a wide viewing angle, low power consumption, and memory properties.

Figure 45A:
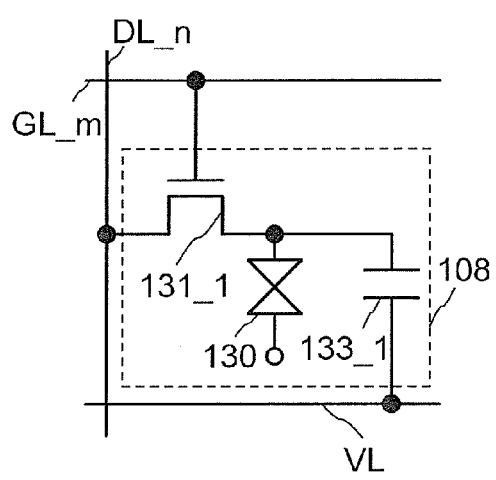
FIGS. 45A and 45B are each a circuit diagram illustrating a pixel circuit that can be used in a display device.

The pixel circuit 108 in the display device illustrated in FIG. 1A can have the structure illustrated in FIG. 45A.

The pixel circuit 108 illustrated in FIG. 45A includes a liquid crystal element 130, a transistor 131_1, and a capacitor 133_1.

Figure 45B:
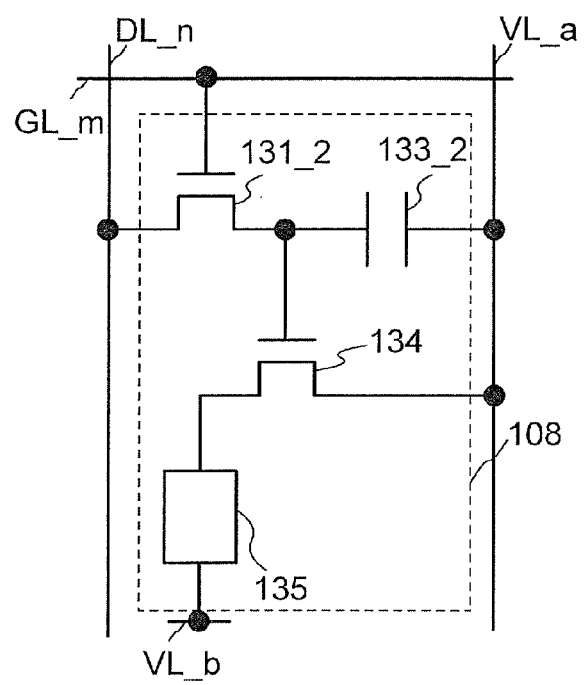

The pixel circuit 108 illustrated in FIG. 45B includes a transistor 1312, a capacitor 1332, a transistor 134, and a light-emitting element 135.

This embodiment can be combined with another embodiment in this specification as appropriate.

Embodiment 7

In this embodiment, examples of electronic devices will be described.

FIGS. 47A to 47H and FIGS. 48A to 48D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 47A:
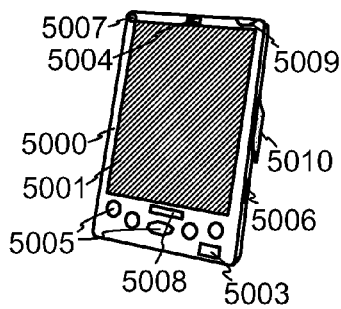
FIGS. 47A to 47H each illustrate an electronic device using a display device in accordance with one embodiment of the present invention.
Figure 47B:
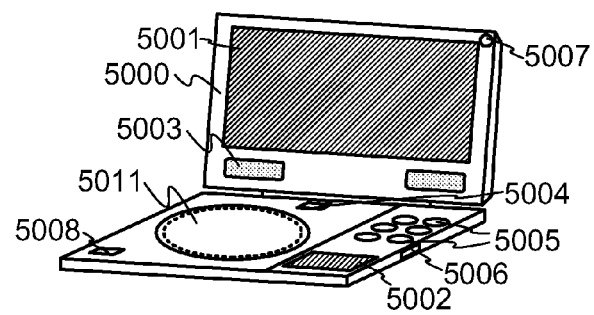
Figure 47C:
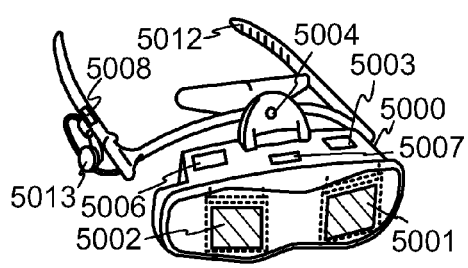
Figure 47D:
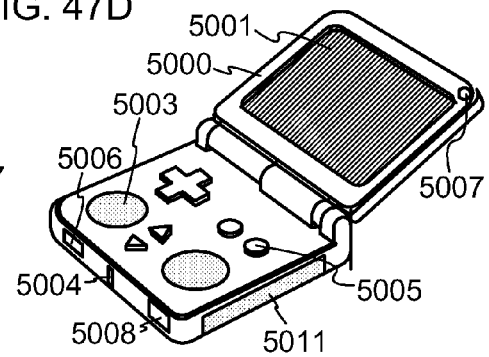
Figure 47E:
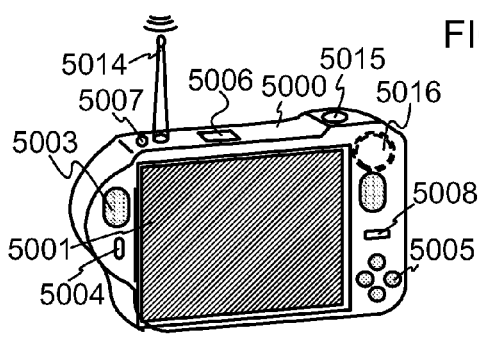
Figure 47F:
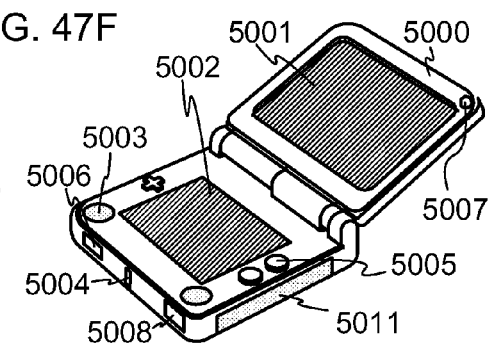
Figure 47G:
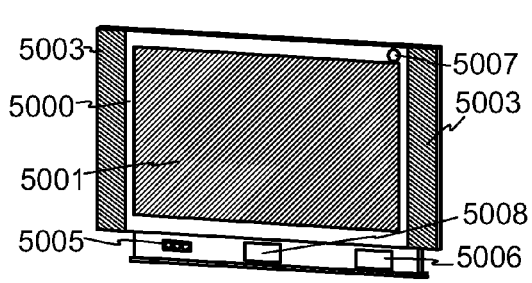
Figure 47H:
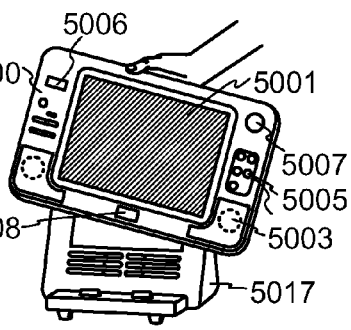
Figure 48A:
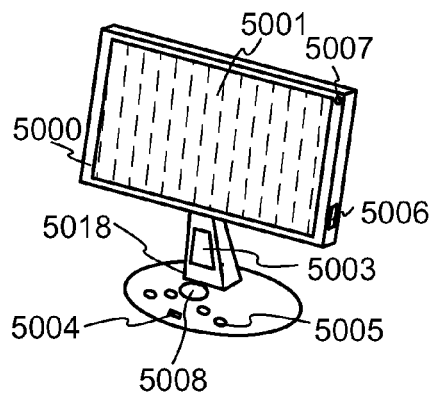
FIGS. 48A to 48H each illustrate an electronic device using a display device in accordance with one embodiment of the present invention.
Figure 48B:
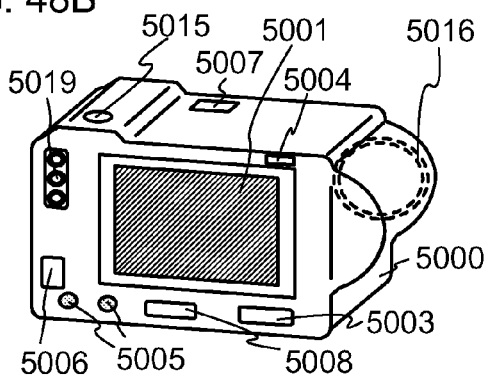
Figure 48C:
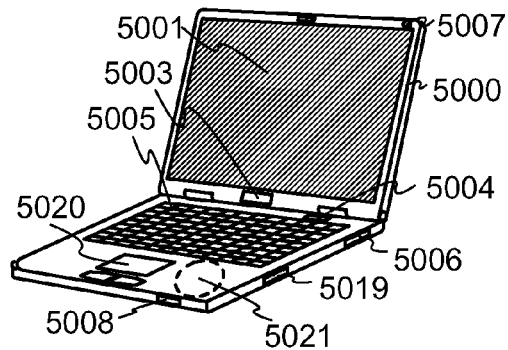
Figure 48D:
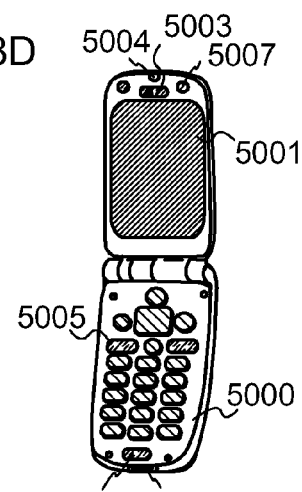

FIG. 47A illustrates a mobile computer which can include a switch 5009, an infrared port 5010, and the like in addition to the above components. FIG. 47B illustrates a portable image reproducing device (e.g., a DVD player) which is provided with a memory medium and can include a second display portion 5002, a memory medium reading portion 5011, and the like in addition to the above components. FIG. 47C illustrates a goggle-type display which can include the second display portion 5002, a supporting portion 5012, an earphone 5013, and the like in addition to the above components. FIG. 47D illustrates a portable game machine which can include the memory medium reading portion 5011 and the like in addition to the above components. FIG. 47E illustrates a digital camera which has a television reception function and can include an antenna 5014, a shutter button 5015, an image receiving portion 5016, and the like in addition to the above components. FIG. 47F illustrates a portable game machine which can include the second display portion 5002, the memory medium reading portion 5011, and the like in addition to the above components. FIG. 47G illustrates a television receiver which can include a tuner, an image processing portion, and the like in addition to the above components. FIG. 47H illustrates a portable television receiver which can include a charger 5017 capable of transmitting and receiving signals, and the like in addition to the above components. FIG. 48A illustrates a display which can include a support base 5018 and the like in addition to the above components. FIG. 48B illustrates a camera which can include an external connection port 5019, a shutter button 5015, an image reception portion 5016, and the like in addition to the above components. FIG. 48C illustrates a computer which can include a pointing device 5020, the external connection port 5019, a reader/writer 5021, and the like in addition to the above components. FIG. 48D illustrates a mobile phone which can include a transmitter, a receiver, a tuner of one-segment partial reception service for mobile phones and mobile terminals, and the like in addition to the above components.

The electronic devices illustrated in FIGS. 47A to 47H and FIGS. 48A to 48D can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 47A to 47H and FIGS. 48A to 48D are not limited thereto, and the electronic devices can have a variety of functions.

The electronic devices described in this embodiment each include the display portion for displaying some sort of data.

Next, applications of a display device will be described.

Figure 48E:
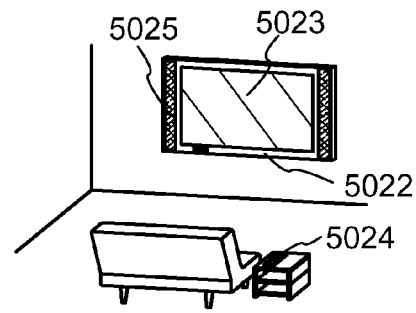

FIG. 48E illustrates an example in which a display device is incorporated in a building. FIG. 48E illustrates a housing 5022, a display portion 5023, a remote controller 5024, which is an operation portion, a speaker 5025, and the like. The display device is incorporated in the building as a wall-hanging type, so that the display device can be provided without requiring a wide space.

Figure 48F:
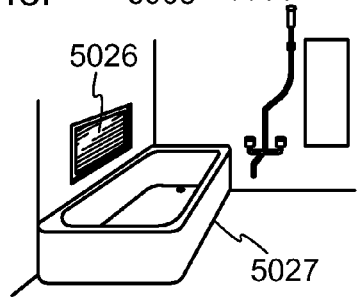

FIG. 48F illustrates another example in which a display device is incorporated in a building. The display module 5026 is incorporated in a prefabricated bath 5027 so that a bather can watch the display module 5026.

Note that although the wall and the prefabricated bath are taken as examples of the building in this embodiment, one embodiment of the present invention is not limited thereto and a display device can be provided in any of a variety of buildings.

Next, an example in which a display device is incorporated in a moving object will be described.

Figure 48G:
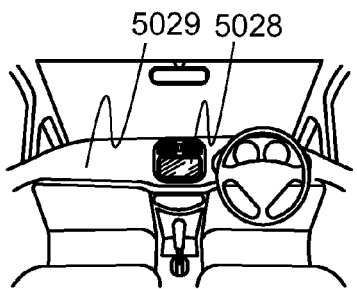

FIG. 48G illustrates an example in which a display device is provided in a vehicle. A display module 5028 is provided in a body 5029 of a vehicle and can display data on the operation of the body or data input from inside or outside of the body on demand. Note that a navigation function may be provided.

Figure 48H:
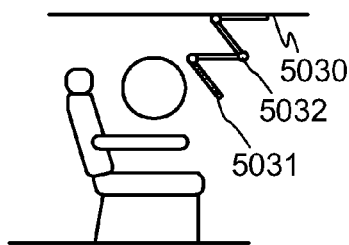

FIG. 48H illustrates an example in which a display device is incorporated in a passenger airplane. FIG. 48H illustrates a usage pattern when a display module 5031 is provided for a ceiling 5030 above a seat of the passenger airplane. The display module 5031 is attached to the ceiling 5030 with a hinge portion 5032, and a passenger can watch the display module 5031 by stretching the hinge portion 5032. The display module 5031 has a function of displaying data when operated by a passenger.

Note that although the body of the vehicle and the body of the airplane are taken as examples of the moving object, one embodiment of the present invention is not limited thereto. A display device can be provided for a variety of moving objects such as a two-wheel vehicle, a four-wheel vehicle (including an automobile and a bus), a train (including a monorail train and a railway train), and a ship.

Embodiment 8

Although the variety of films such as the conductive film and the semiconductor film, which are described in the above embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the conductive film and the semiconductor film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: Ga $(C_2H_5)_3$) can be used instead of trimethylgallium and diethylzinc (chemical formula: Zn $(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Note that in this specification and the like, part of a diagram or a text described in one embodiment can be taken out to constitute one embodiment of the invention. Thus, in the case where a diagram or a text related to a certain part is described, a content taken out from the diagram or the text of the certain part is also disclosed as one embodiment of the invention and can constitute one embodiment of the invention. Therefore, for example, part of a diagram or a text including one or more of active elements (e.g., transistors and diodes), wirings, passive elements (e.g., capacitors and resistors), conductive layers, insulating layers, semiconductor layers, organic materials, inorganic materials, components, devices, operating methods, manufacturing methods, and the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is described in a diagram or a text relating to one embodiment in this specification and the like, it will be readily appreciated by those skilled in the art that a broader concept of the specific example can be derived. Therefore, in the case where at least one specific example is described in the diagram or the text relating to one embodiment, a broader concept of the specific example is disclosed as one embodiment of the invention and can constitute one embodiment of the invention.

Note that, in this specification and the like, a content illustrated in at least a diagram (which may be part of the diagram) is disclosed as one embodiment of the invention and can constitute one embodiment of the invention. Therefore, when a certain content is illustrated in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

This application is based on Japanese Patent Application serial No. 2012-260210 filed with Japan Patent Office on Nov. 28, 2012, and Japanese Patent Application serial No. 2013-157232 filed with Japan Patent Office on Jul. 30, 2013, the entire contents of which are hereby incorporated by reference.

What is claimed is:

1. A display device comprising:
   a protection circuit including a first conductive layer, a second conductive layer, and a semiconductor layer,
   wherein the first conductive layer and the second conductive layer are spaced apart from each other,
   wherein the semiconductor layer includes an oxide semiconductor layer,
   wherein the first conductive layer and the second conductive layer are electrically connected to the semiconductor layer in opening portions in an insulating layer which is in contact with the semiconductor layer, and
   wherein the protection circuit does not include a transistor.

2. An electronic device comprising the display device according to claim 1.

3. The electronic device according to claim 2, wherein the electronic device is one selected from the group consisting of a mobile computer, a portable image reproducing device, a goggle-type display, a portable game machine, a digital camera, a television receiver, a computer, and a mobile phone.

4. The display device according to claim 1, wherein the semiconductor layer is wider than the first conductive layer and the second conductive layer.

5. A display device comprising:
   a protection circuit including a first conductive layer, a second conductive layer, and a semiconductor layer,
   wherein the first conductive layer and the second conductive layer are spaced apart from each other,
   wherein the semiconductor layer includes an oxide semiconductor layer,
   wherein the first conductive layer and the second conductive layer are electrically connected to the semiconductor layer in opening portions in an insulating layer which is in contact with the semiconductor layer,
   wherein the insulating layer includes a stacked structure of an inorganic material and an organic material, and
   wherein the protection circuit does not include a transistor.

6. An electronic device comprising the display device according to claim 5.

7. The electronic device according to claim 6, wherein the electronic device is one selected from the group consisting of a mobile computer, a portable image reproducing device, a goggle-type display, a portable game machine, a digital camera, a television receiver, a computer, and a mobile phone.

8. The display device according to claim 5, wherein the semiconductor layer is wider than the first conductive layer and the second conductive layer.

9. A display device comprising:
   a protection circuit including a first conductive layer, a second conductive layer, a third conductive layer, and a semiconductor layer,
   wherein the first conductive layer and the second conductive layer are spaced apart from each other,
   wherein the semiconductor layer includes an oxide semiconductor layer,
   wherein the first conductive layer and the second conductive layer are electrically connected to the semiconductor layer in opening portions in an insulating layer which is in contact with the semiconductor layer,
   wherein the insulating layer includes a stacked structure of an inorganic material and an organic material,
   wherein the third conductive layer is provided below the insulating layer and is electrically connected to one of the first conductive layer and the second conductive layer,
   wherein the third conductive layer serves as a scan line, and
   wherein the protection circuit does not include a transistor.

10. An electronic device comprising the display device according to claim 9.

11. The electronic device according to claim 10, wherein the electronic device is one selected from the group consisting of a mobile computer, a portable image reproducing device, a goggle-type display, a portable game machine, a digital camera, a television receiver, a computer, and a mobile phone.

12. The display device according to claim 9, wherein the third conductive layer is perpendicular to the first conductive layer and the second conductive layer.

13. The display device according to claim 9, further comprising a fourth conductive layer serving as a wiring that enables overcurrent due to a surge voltage to be released,
   wherein the fourth conductive layer is electrically connected to the other of the first conductive layer and the second conductive layer.

14. The display device according to claim 9, wherein the semiconductor layer is wider than the first conductive layer and the second conductive layer.

* * * * *